(12) United States Patent
Kaneko et al.

(10) Patent No.: US 7,214,576 B1
(45) Date of Patent: May 8, 2007

(54) MANUFACTURING METHOD OF SEMICONDUCTOR DEVICE

(75) Inventors: Akio Kaneko, Kawasaki (JP); Atsushi Yagishita, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1 day.

(21) Appl. No.: 11/284,184

(22) Filed: Nov. 22, 2005

(30) Foreign Application Priority Data

Sep. 8, 2005 (JP) .............................. 2005-260821

(51) Int. Cl.
H01L 21/336 (2006.01)
H01L 21/00 (2006.01)
H01L 21/8242 (2006.01)
H01L 29/80 (2006.01)
H01L 23/48 (2006.01)

(52) U.S. Cl. .............. 438/197; 438/151; 438/241; 438/258; 438/283; 257/270; 257/750

(58) Field of Classification Search .............. 257/270, 257/750; 438/151, 197, 241, 258, 283
See application file for complete search history.

(56) References Cited

U.S. PATENT DOCUMENTS 5,554,888 A * 9/1996 Kato ........................... 257/750
5,804,848 A * 9/1998 Mukai ......................... 257/270
2005/0202618 A1 9/2005 Yagishita
2005/0202678 A1* 9/2005 Abrams et al. .............. 438/692

FOREIGN PATENT DOCUMENTS

JP 2002-009289 1/2002
JP 2005-294789 10/2005

* cited by examiner

*Primary Examiner*—Tarifur Chowdhury
*Assistant Examiner*—Andrés López-Esquerra
(74) *Attorney, Agent, or Firm*—Finnegan, Henderson, Farabow, Garrett & Dunner, L.L.P.

(57) ABSTRACT

A manufacturing method of a semiconductor device disclosed herein comprises: forming a first protrusion; forming a second protrusion which is higher than the first protrusion; forming a first sidewall on a side surface of the second protrusion; forming a first film so that a surface of the first film is located lower than the second protrusion; forming a mask on a side surface of the first sidewall on a side surface of the second protrusion which protrudes from the surface of the first film; and etching the first film with the mask so as to form a second sidewall on the side surface of the first sidewall on the side surface of the second protrusion but not to form the second sidewall on a side surface of the first protrusion, the second sidewall being formed of the mask and the first film.

16 Claims, 45 Drawing Sheets

MANUFACTURING METHOD OF SEMICONDUCTOR DEVICE

CROSS REFERENCE TO RELATED APPLICATION

This application claims benefit of priority under 35 U.S.C. §119 to Japanese Patent Application No. 2005-260821, filed on Sep. 8, 2005, the entire contents of which are incorporated by reference herein.

BACKGROUND OF THE INVENTION

1. Field of the Invention

The present invention relates to a manufacturing method of a semiconductor device, and particularly relates to a manufacturing method of a semiconductor device including a first protrusion and a second protrusion higher than the first protrusion.

2. Related Background Art

There exists a FinFET in which a gate electrode and source/drain regions are three-dimensionally formed to improve the degree of integration of field effect transistors (For example, see Japanese Patent Application Laid-open No. 2002-9289, Japanese Patent Application No. 2004-150519). A FinFET has two protrusions, the source/drain region of the Fin and the gate electrode. The gate electrode as a second protrusion is formed higher than the Fin as a first protrusion.

When a sidewall is formed on a side surface of the gate electrode in such a FinFET, a sidewall is also formed on a side surface of the Fin, which causes a problem that application of doping and silicidation to the source/drain regions on the Fin is difficult. Namely, doping and silicide formation can be performed only on an upper surface of the Fin.

However, by application of doping and silicidation in the aforementioned manner, it is very difficult to form the uniform source/drain regions in a depth direction of the Fin, and, in usual, the effective channel length between the source and the drain region differ depending on the depth of the Fin. A lower portion of the Fin has a high series resistance, and the resistance degrade the drive current of the FinFET.

Such problems may arise not only in the FinFET but also in semiconductor devices including plural protrusions with different heights.

SUMMARY OF THE INVENTION

In order to accomplish the aforementioned and other objects, according to one aspect of the present invention, a manufacturing method of a semiconductor device, comprises:

forming a first protrusion;

forming a second protrusion which is higher than the first protrusion;

forming a first sidewall on a side surface of the second protrusion;

forming a first film so that a surface of the first film is located lower than the second protrusion;

forming a mask on a side surface of the first sidewall on a side surface of the second protrusion which protrudes from the surface of the first film; and etching the first film with the mask so as to form a second sidewall on the side surface of the first sidewall on the side surface of the second protrusion but not to form the second sidewall on a side surface of the first protrusion, the second sidewall being formed of the mask and the first film.

DETAILED DESCRIPTION OF THE EMBODIMENTS

First Embodiment

A manufacturing process of a semiconductor device according to the first embodiment will be explained based on FIG. 1 to FIG. 38A to FIG. 38C. Among these figures, FIG. 1 to FIG. 6, FIG. 15, FIG. 18, FIG. 21, FIG. 24, FIG. 27, FIG. 30, FIG. 33, and FIG. 36 are bird's-eye views for explaining the manufacturing process of the semiconductor device according to this embodiment. FIG. 7, FIG. 9, FIG. 11, FIG. 13, FIG. 16, FIG. 19, FIG. 22, FIG. 25, FIG. 28, FIG. 31, FIG. 34, and FIG. 37 are sectional views corresponding to the line A–A' of the semiconductor device in FIG. 6. FIG. 8A, FIG. 10A, FIG. 12A, FIG. 14A, FIG. 17A, FIG. 20A, FIG. 23A, FIG. 26A, FIG. 29A, FIG. 32A, FIG. 35A, and FIG. 38A are sectional views corresponding to the line B–B' of the semiconductor device in FIG. 6. FIG. 8B, FIG. 10B, FIG. 12B, FIG. 14B, FIG. 17B, FIG. 20B, FIG. 23B, FIG. 26B, FIG. 29B, FIG. 32B, FIG. 35B, and FIG. 38B are sectional views corresponding to the line C–C' of the semiconductor device in FIG. 6. FIG. 8C, FIG. 10C, FIG. 12C, FIG. 14C, FIG. 17C, FIG. 20C, FIG. 23C, FIG. 26C, FIG. 29C, FIG. 32C, FIG. 35C, and FIG. 38C are sectional views corresponding to the line D–D' in FIG. 6.

In the following respective embodiments, a case where one or more n-channel MOS transistors are formed on an SOI substrate will be explained, but in actuality, one or more p-channel transistors also exist on the SOI substrate, and the p-channel transistors are also formed in the similar process.

Figure 1:
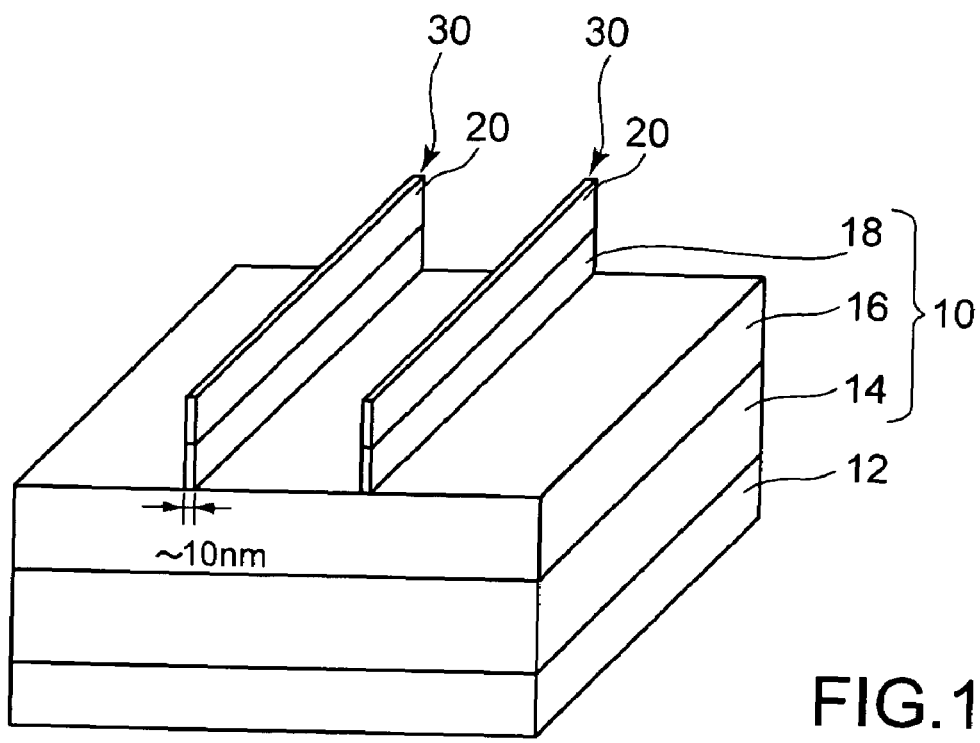
FIG. 1 is a bird's-eye view for explaining a manufacturing process of a semiconductor device according to a first embodiment.

First, as shown in FIG. 1, an SOI substrate 10, for example, with a thickness of 50 nm is prepared. In this embodiment, the SOI substrate 10 with an SiN layer 12 includes a silicon substrate 14, a silicon oxide film 16, and a silicon layer 18. An SiN hard mask 20, for example, with a thickness of 70 nm is formed on the SOI substrate 10. This SiN hard mask 20 is deposited at 10 Torr and 750° C. in an atmosphere of dichlorosilane $SiH_2Cl_2$ and ammonia $NH_3$.

Then, a resist with a Fin shape is formed on the SiN hard mask 20 by a lithography method, and the SiN hard mask 20 is formed to the Fin shape by RIE (Reactive Ion Etching). After the resist is removed, Fin-shaped first protrusions 30 are formed by etching the silicon layer 18 by RIE with the SiN hard mask 20 as a mask. The first protrusions 30, with the width of 10 nm in this embodiment, correspond to projected semiconductors where source/drain regions are formed later.

Figure 2:
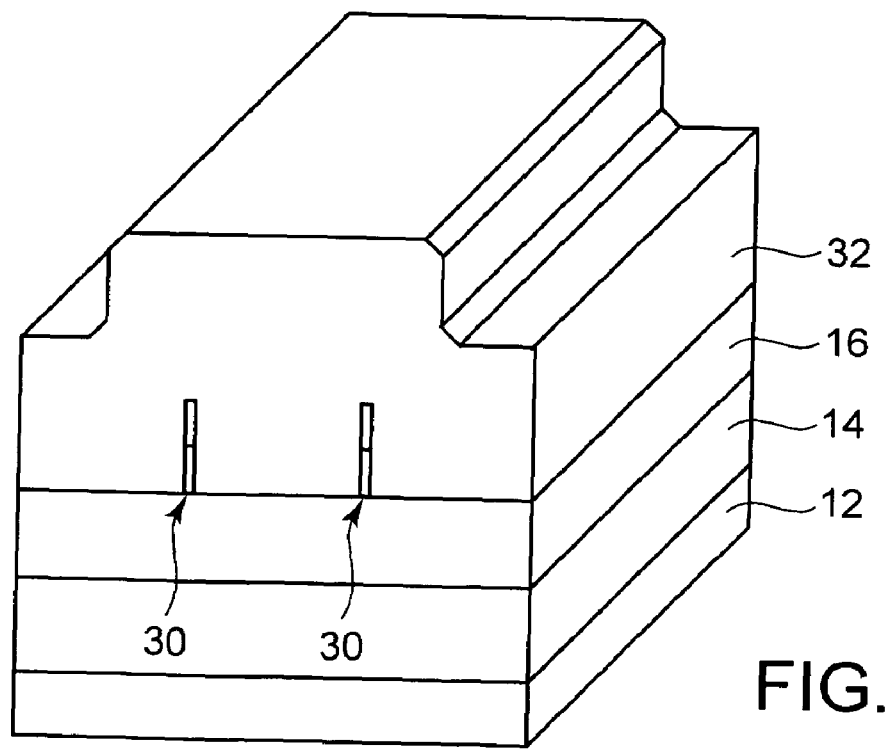
FIG. 2 is a bird's-eye view for explaining the manufacturing process of the semiconductor device according to the first embodiment.

Subsequently, as shown in FIG. 2, after formation of a gate dielectric, a polysilicon layer 32 is deposited, for example, with a thickness of approximately 300 nm under the condition of 1 Torr and 620° C. in a mixed gas of $SiH_4$, $N_2$, and $H_2$. At this time, since the polysilicon layer 32 for a gate electrode is formed on the Fin protrusions 30, the surface of the polysilicon layer 32 is much uneven.

Figure 3:
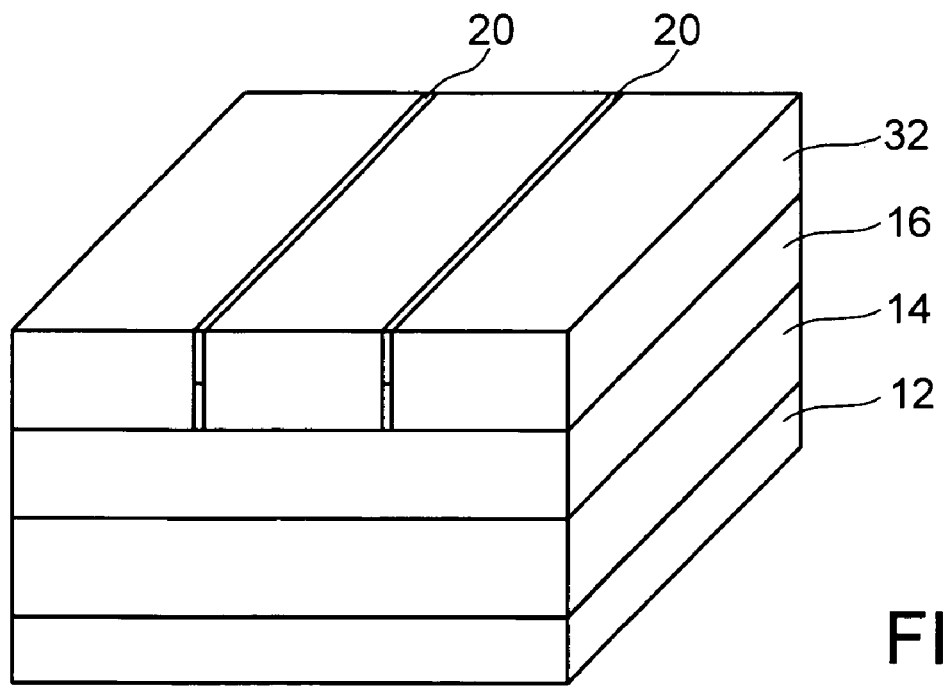
FIG. 3 is a bird's-eye view for explaining the manufacturing process of the semiconductor device according to the first embodiment.

Thereafter, as shown in FIG. 3, the polysilicon layer 32 is planalized by CMP (Chemical Mechanical Polishing) and etched back until the SiN hard mask 20 is exposed.

Figure 4:
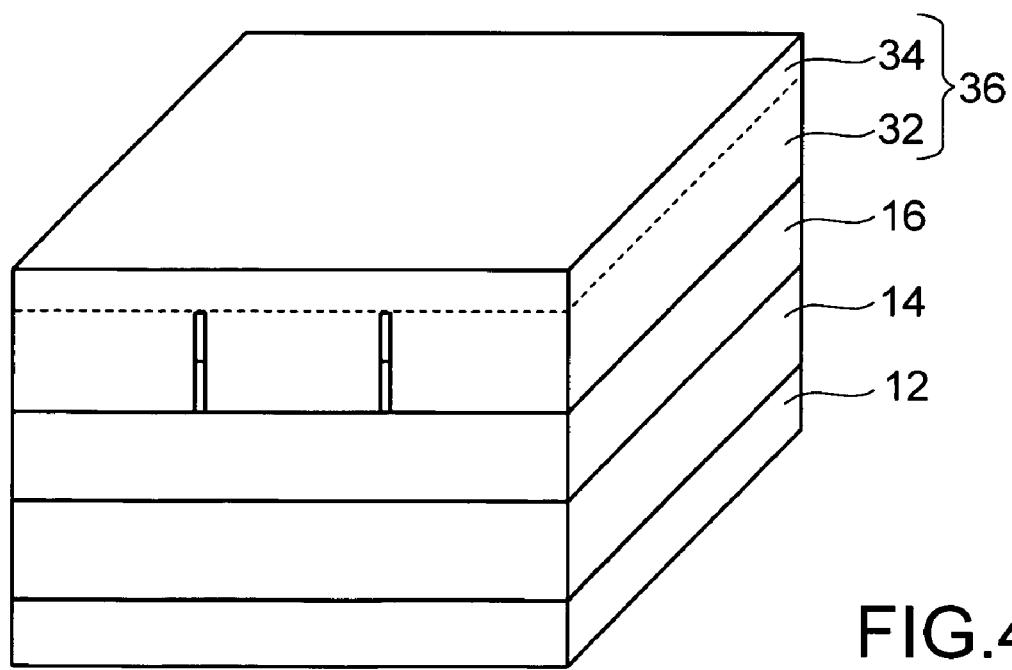
FIG. 4 is a bird's-eye view for explaining the manufacturing process of the semiconductor device according to the first embodiment.

Then, as shown in FIG. 4, a second-layer polysilicon layer 34 for the gate electrode is deposited, for example, with a thickness of 50 nm. These two polysilicon layers 32 and 34 together form a polysilicon layer 36 which is later formed to the gate electrode.

Figure 5:
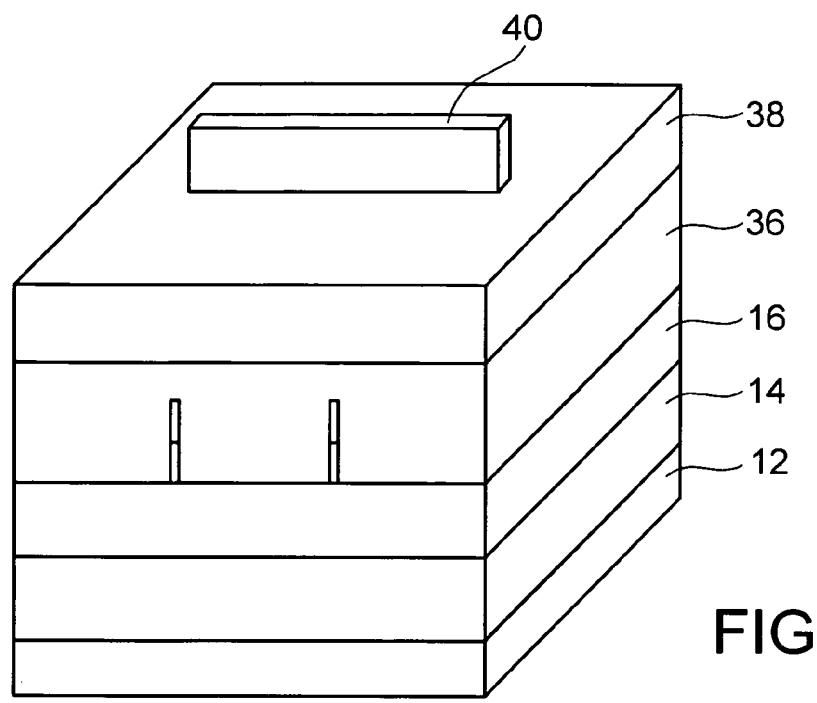
FIG. 5 is a bird's-eye view for explaining the manufacturing process of the semiconductor device according to the first embodiment.
Figure 6:
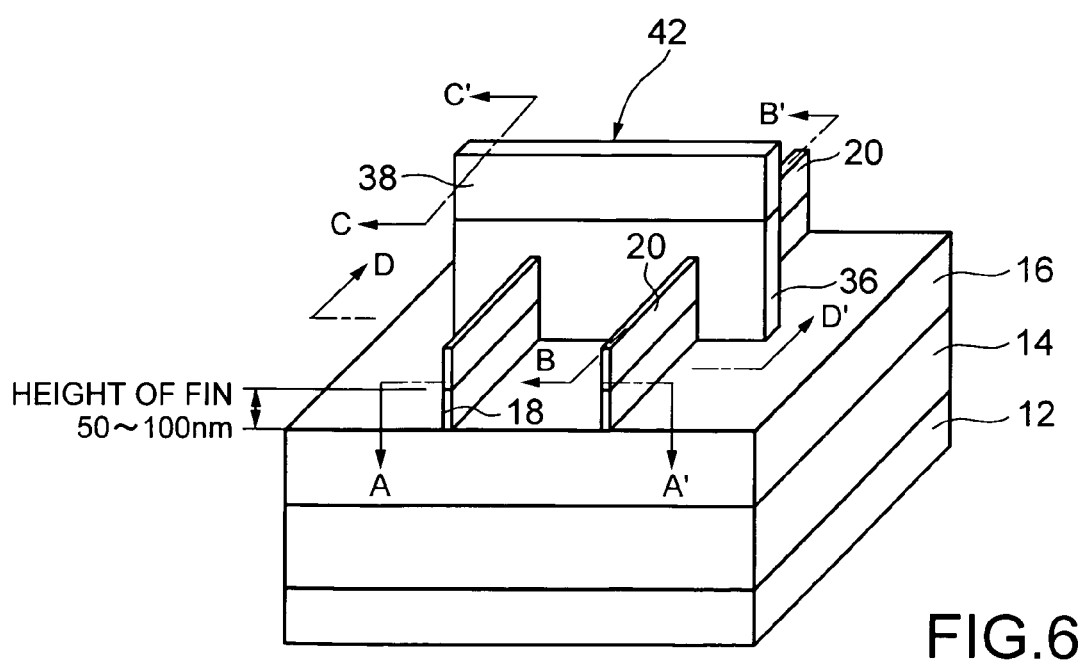
FIG. 6 is a bird's-eye view for explaining the manufacturing process of the semiconductor device according to the first embodiment.
Figure 7:
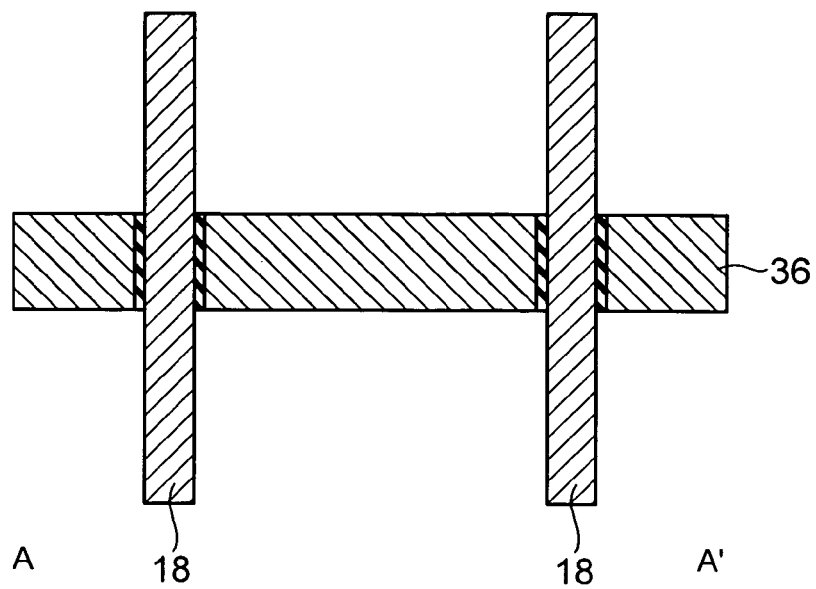
FIG. 7 is a cross sectional view corresponding to the line A–A' in FIG. 6.
Figures 8A, 8B, 8C:
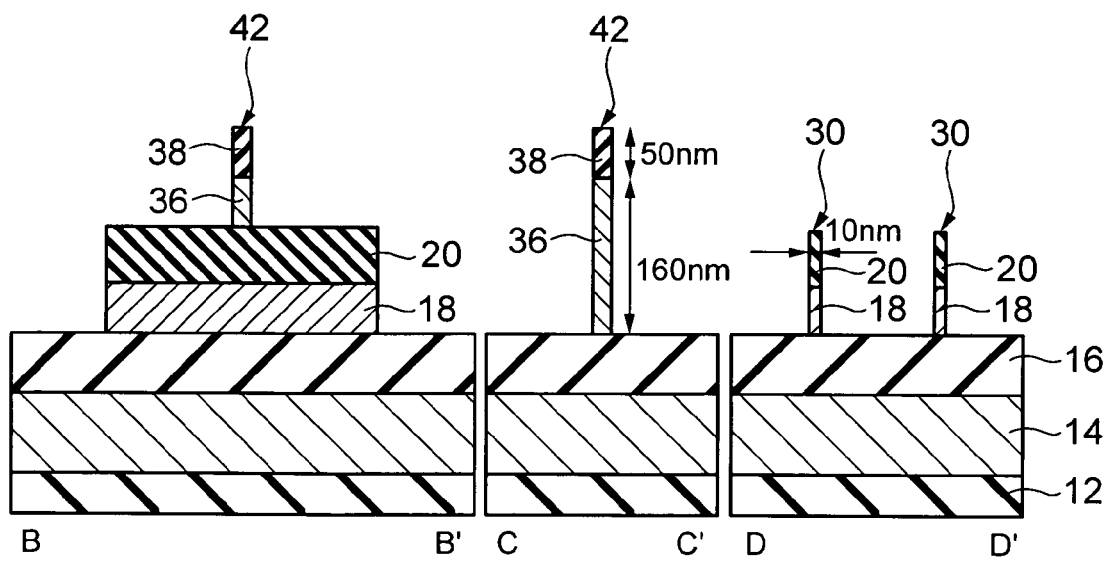
FIG. 8A, FIG. 8B, and FIG. 8C are cross sectional views respectively corresponding to the line B–B', the line C–C', and the line D–D' in FIG. 6.
Figure 9:
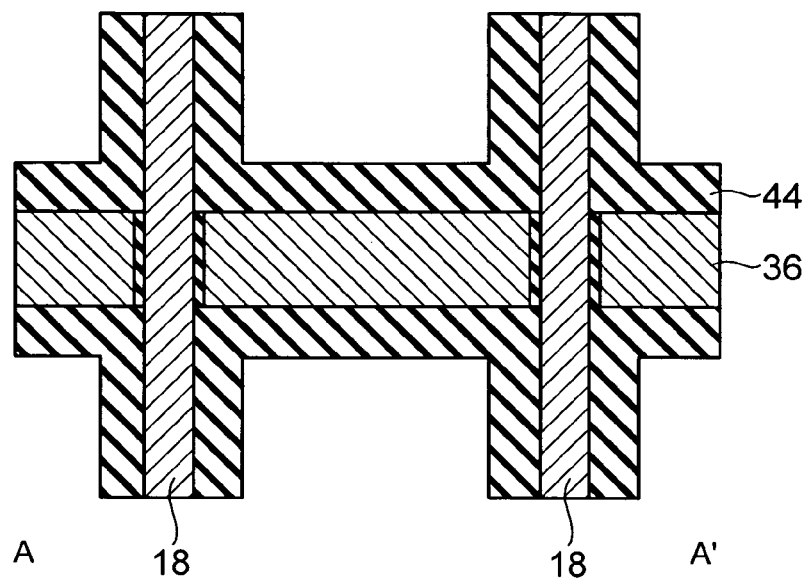
FIG. 9 is a cross sectional view corresponding to the line A–A' in FIG. 6.
Figures 10A, 10B, 10C:
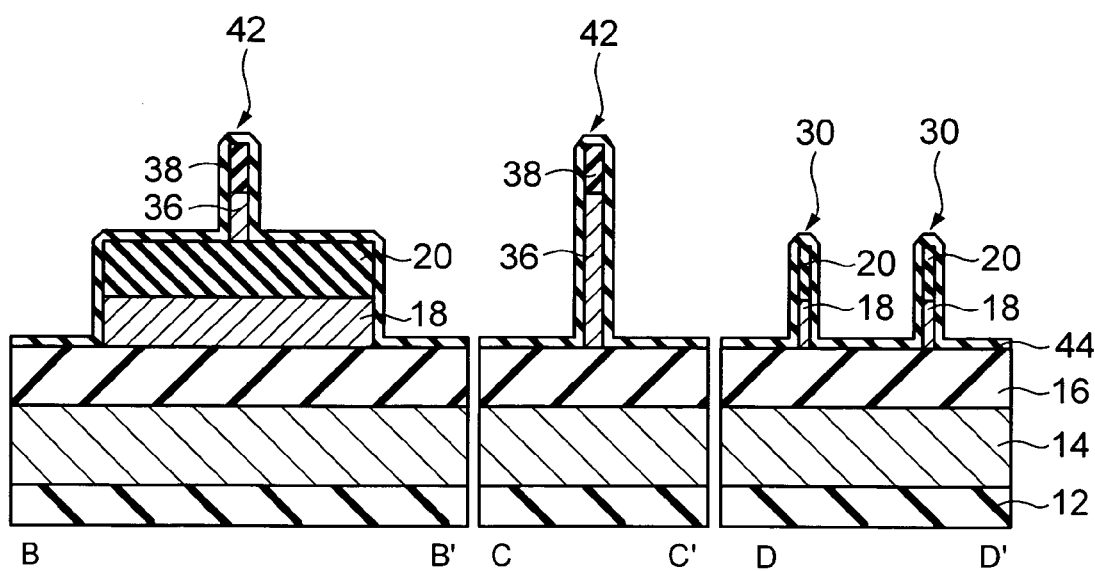
FIG. 10A, FIG. 10B, and FIG. 10C are cross sectional views respectively corresponding to the line B–B', the line C–C', and the line D–D' in FIG. 6.
Figure 11:
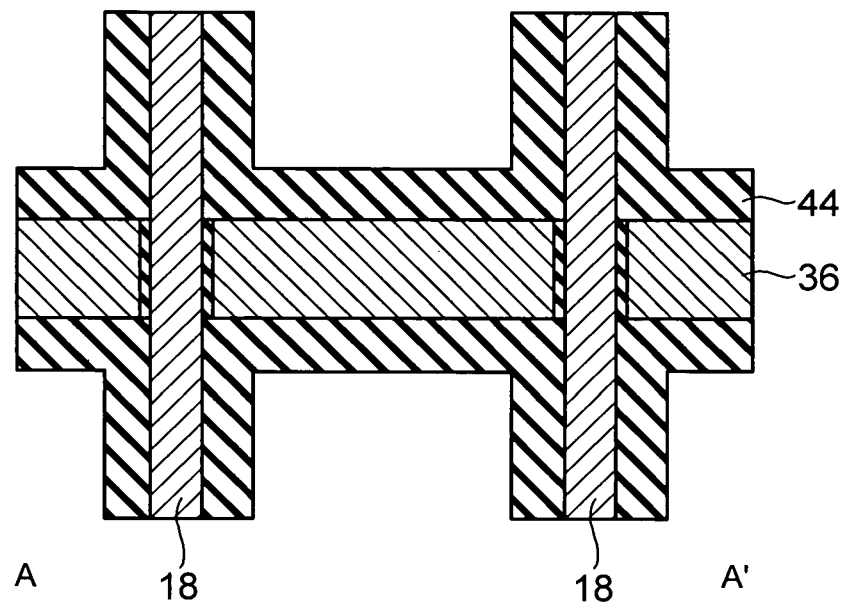
FIG. 11 is a cross sectional view corresponding to the line A–A' in FIG. 6.

Subsequently, as shown in FIG. 5, a SiN hard mask 38 is deposited, for example, with a thickness of 100 nm on the polysilicon layer 36. Thereafter, a resist mask 40 with a gate pattern is formed on the SiN hard mask 38.

Then, as shown in FIG. 6 to FIG. 8A to FIG. 8C, the SiN hard mask 38 is etched with the resist mask 40 as a mask, and the resist mask 40 is removed. Subsequently, by etching the polysilicon layer 36 as the gate electrode with the SiN hard masks 20 and 38 as masks, a second protrusion 42 is formed. In this embodiment, the polysilicon layer 36 is formed with a height of 160 nm, and the SiN hard mask 38 is formed with a height of 50 nm.

Thereafter, as shown in FIG. 9 and FIG. 10A to FIG. 10C, a SiN film 44 is formed. This SiN film 44 is deposited, for example, at 10 Torr and 700° C. in the atmosphere of dichlorosilane $SiH_2Cl_2$ and ammonia $NH_3$. Here, the etching rate of the SiN film 44 by a solution containing $H_3PO_4$ is higher than the SiN hard mask 20 deposited at a lower temperature. This SiN film 44 corresponds to a first sidewall film in this embodiment.

The thickness of the SiN film 44 is preferably 3 nm or more so as to remain sufficiently at the pretreatment of source/drain elevation, and preferably 60 nm or less to obtain the effective reduction of source/drain series resistance. More preferably, the thickness thereof is approximately 15 nm. Incidentally, for wider process margin of the deposition, the SiN film 44 may be formed, for example, with a thickness of 30 nm and then etching it to a thickness of 15 nm using a solution containing $H_3PO_4$.

Figures 12A, 12B, 12C:
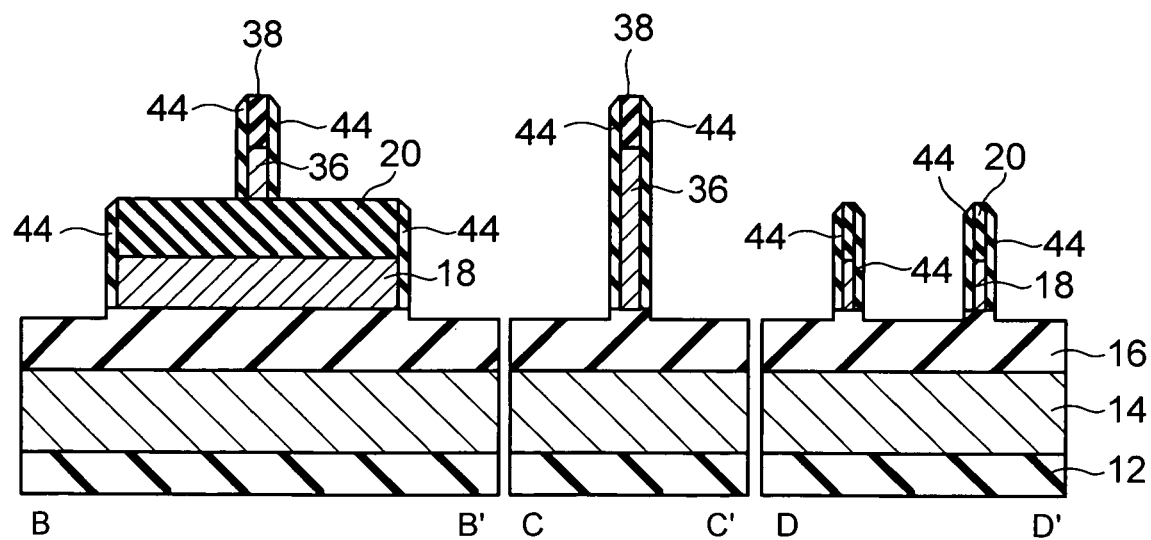
FIG. 12A, FIG. 12B, and FIG. 12C are cross sectional views respectively corresponding to the line B–B', the line C–C', and the line D–D' in FIG. 6.
Figure 13:
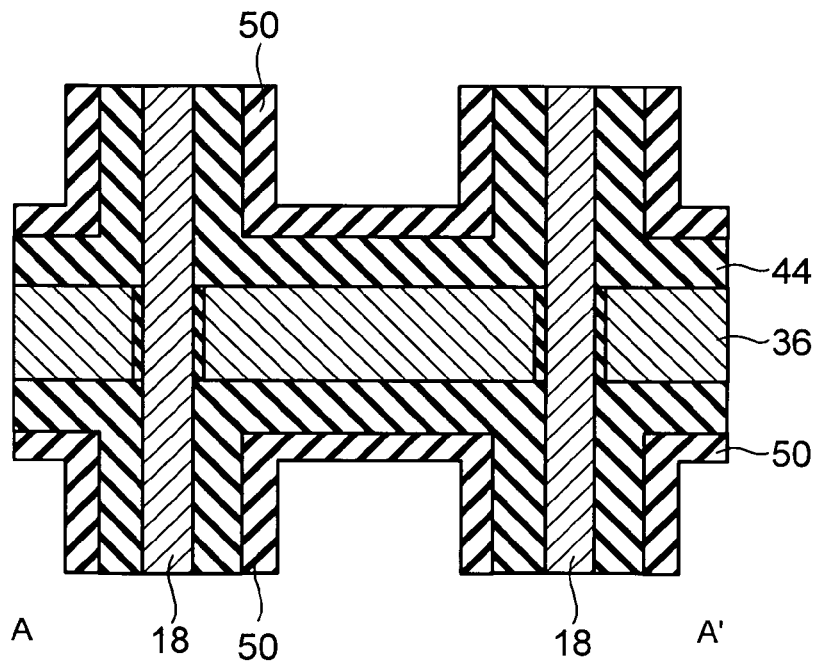
FIG. 13 is a cross sectional view corresponding to the line A–A' in FIG. 6.
Figures 14A, 14B, 14C:
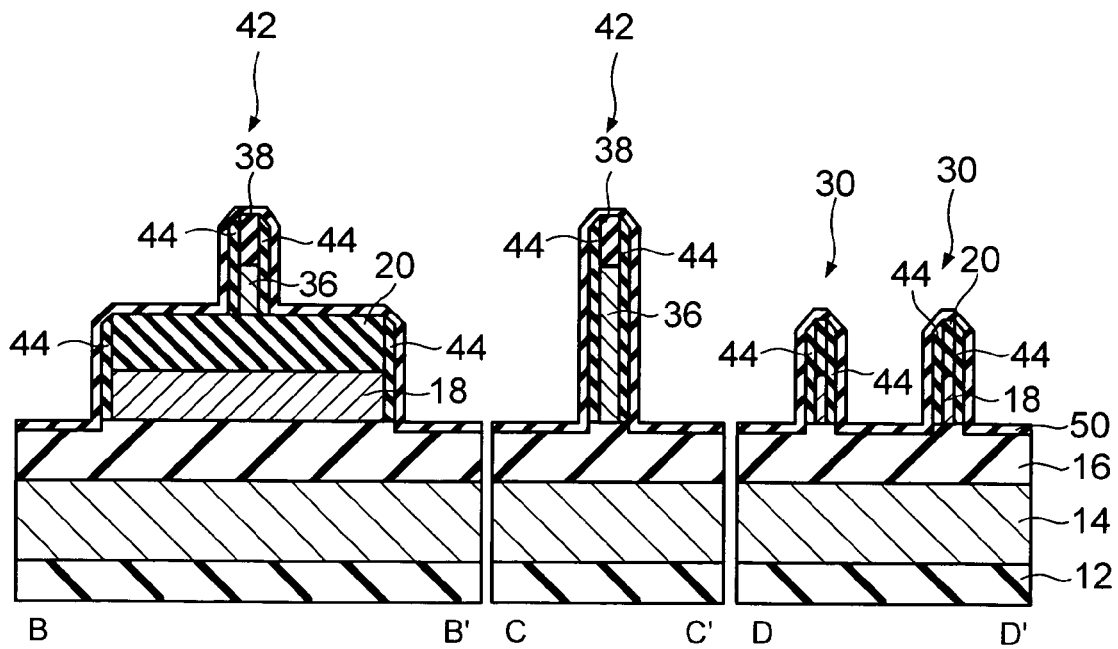
FIG. 14A, FIG. 14B, and FIG. 14C are cross sectional views respectively corresponding to the line B–B', the line C–C', and the line D–D' in FIG. 6.
Figure 15:
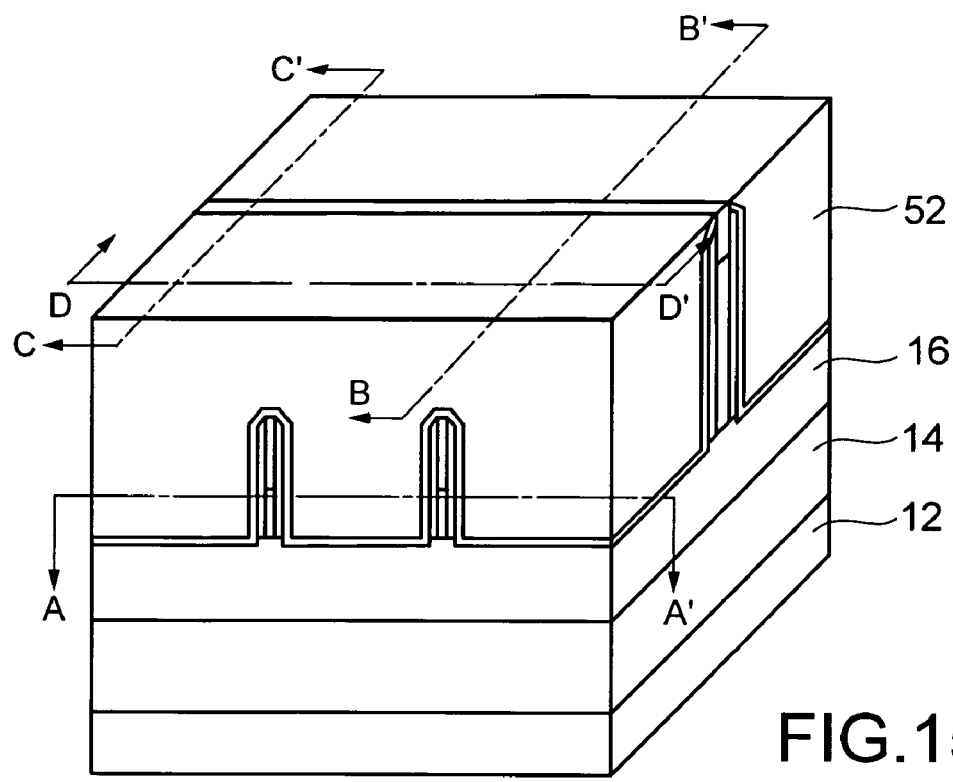
FIG. 15 is a bird's-eye view for explaining the manufacturing process of the semiconductor device according to the first embodiment.
Figure 16:
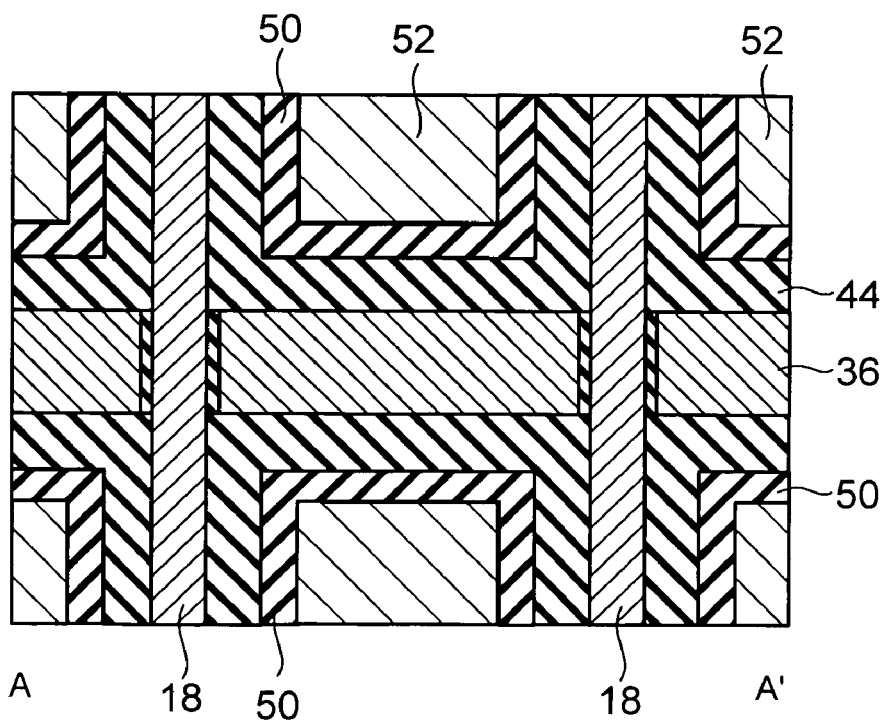
FIG. 16 is a cross sectional view corresponding to the line A–A' in FIG. 6.
Figures 17A, 17B, 17C:
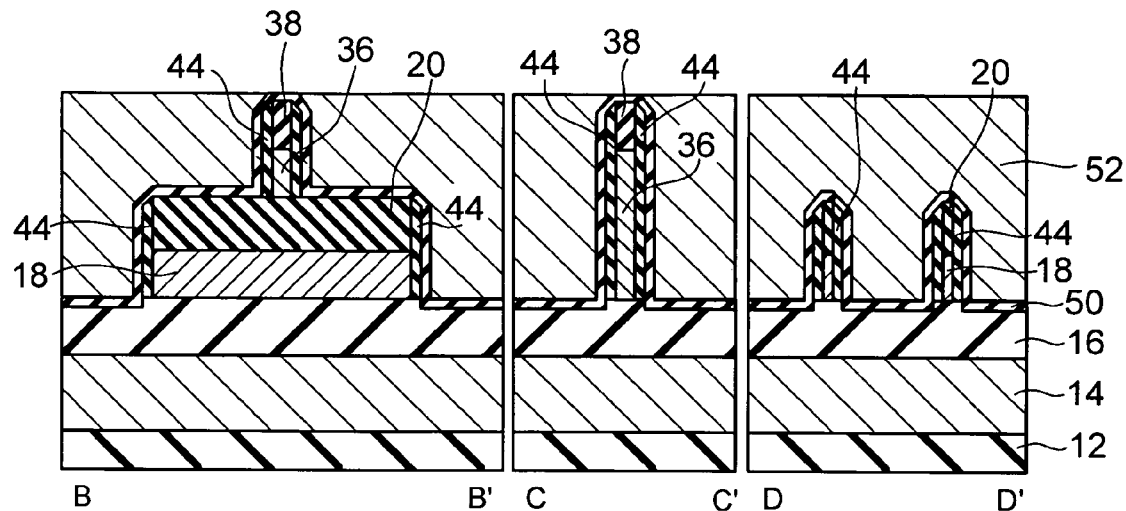
FIG. 17A, FIG. 17B, and FIG. 17C are cross sectional views respectively corresponding to the line B–B', the line C–C', and the line D–D' in FIG. 6.
Figure 18:
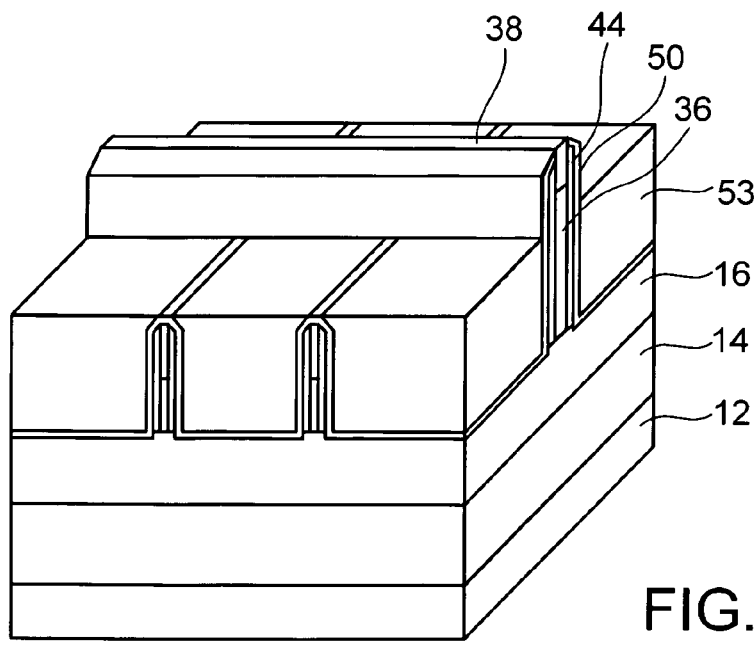
FIG. 18 is a bird's-eye view for explaining the manufacturing process of the semiconductor device according to the first embodiment.
Figure 19:
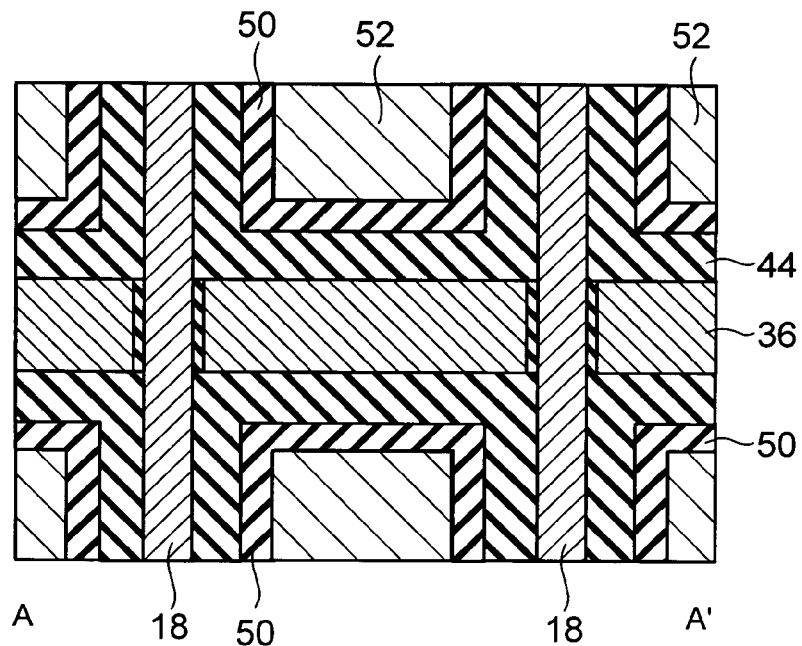
FIG. 19 is a cross sectional view corresponding to the line A–A' in FIG. 6.
Figures 20A, 20B, 20C:
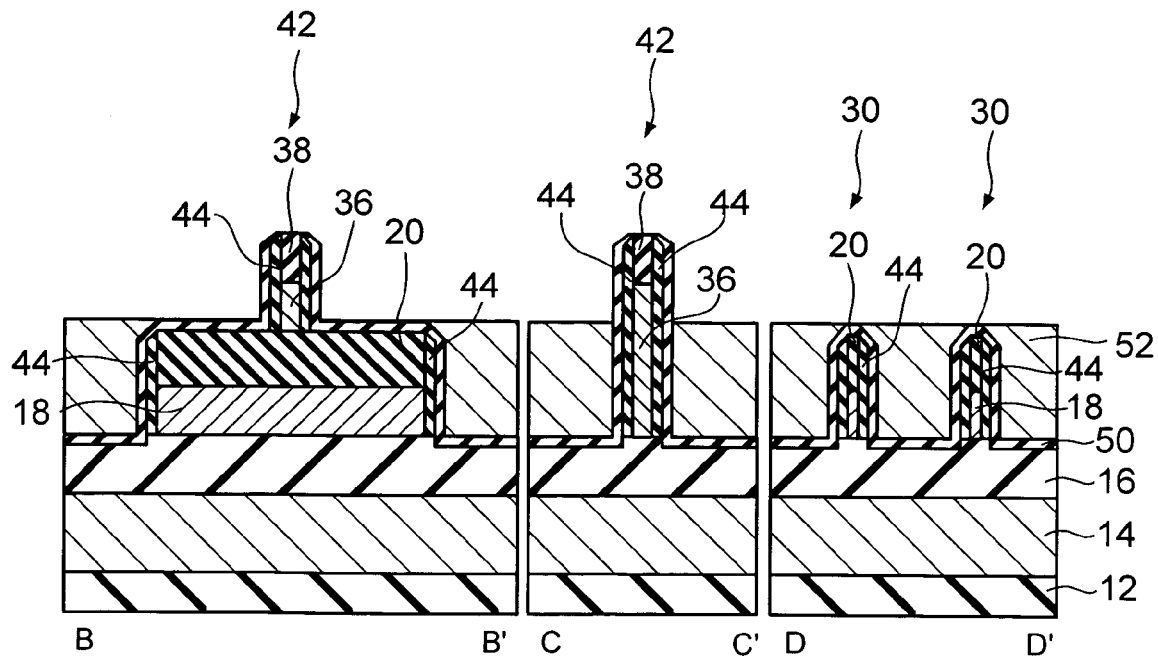
FIG. 20A, FIG. 20B, and FIG. 20C are cross sectional views respectively corresponding to the line B–B', the line C–C', and the line D–D' in FIG. 6.
Figure 21:
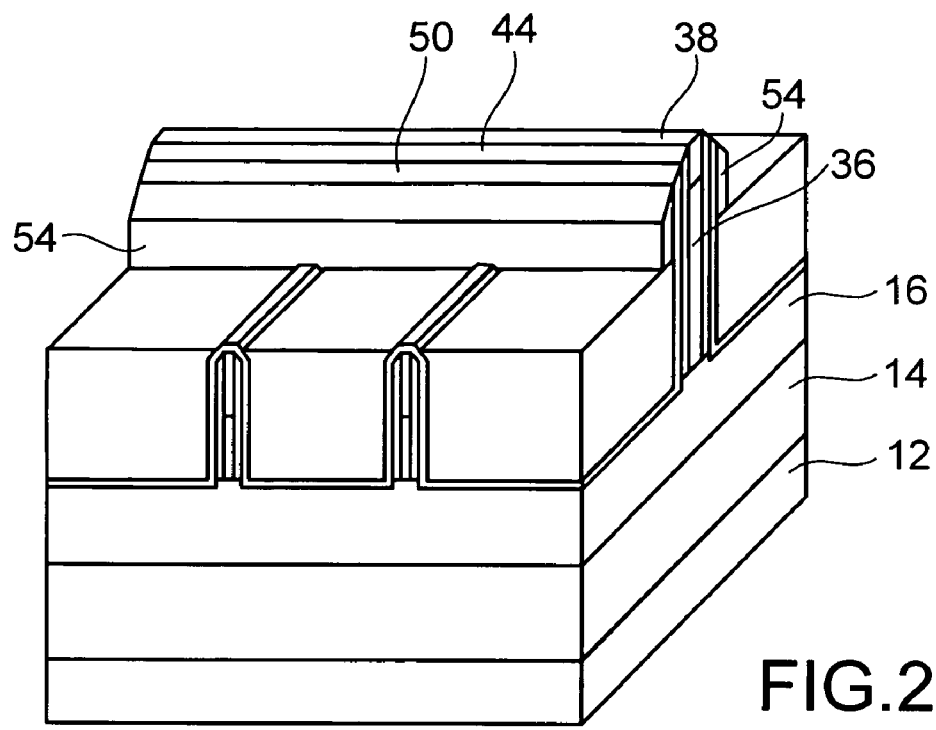
FIG. 21 is a bird's-eye view for explaining the manufacturing process of the semiconductor device according to the first embodiment.
Figure 22:
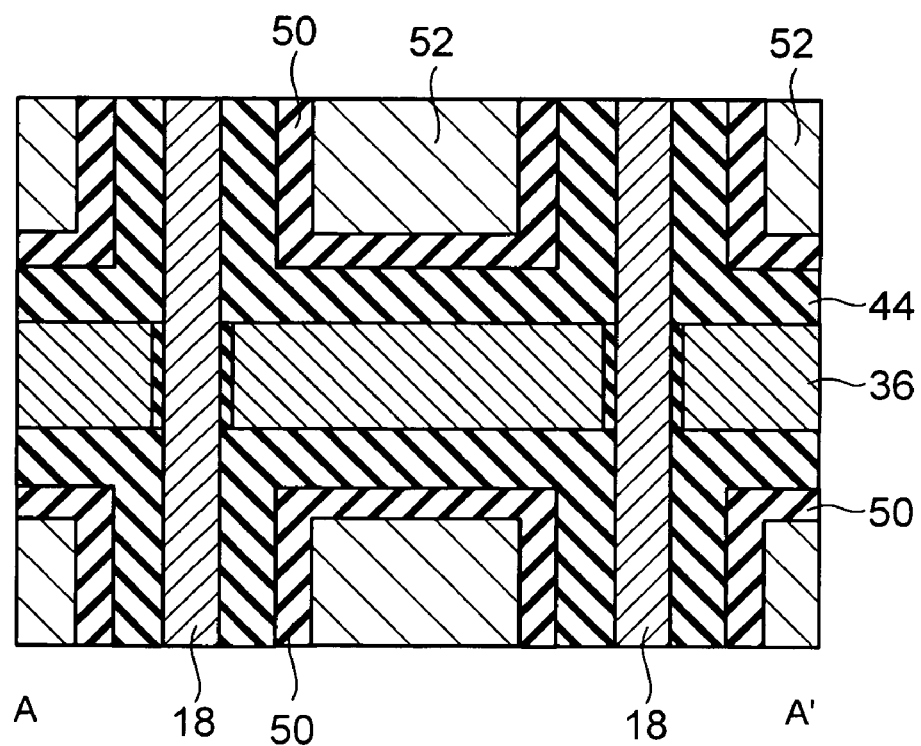
FIG. 22 is a cross sectional view corresponding to the line A–A' in FIG. 6.
Figures 23A, 23B, 23C:
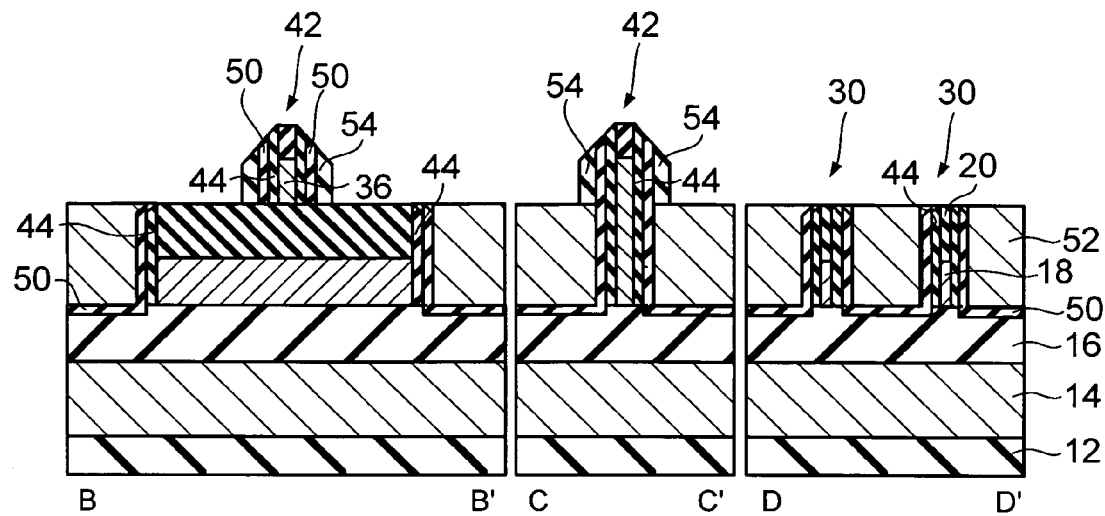
FIG. 23A, FIG. 23B, and FIG. 23C are cross sectional views respectively corresponding to the line B–B', the line C–C', and the line D–D' in FIG. 6.
Figure 24:
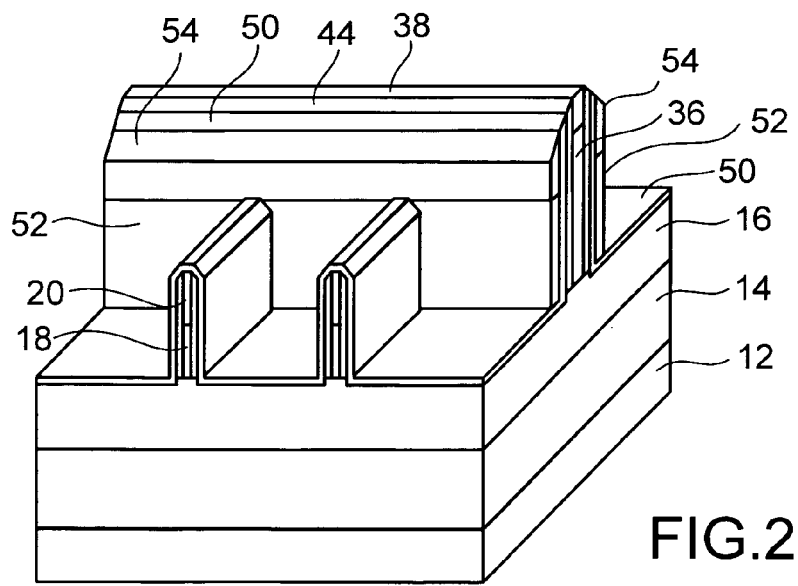
FIG. 24 is a bird's-eye view for explaining the manufacturing process of the semiconductor device according to the first embodiment.
Figure 25:
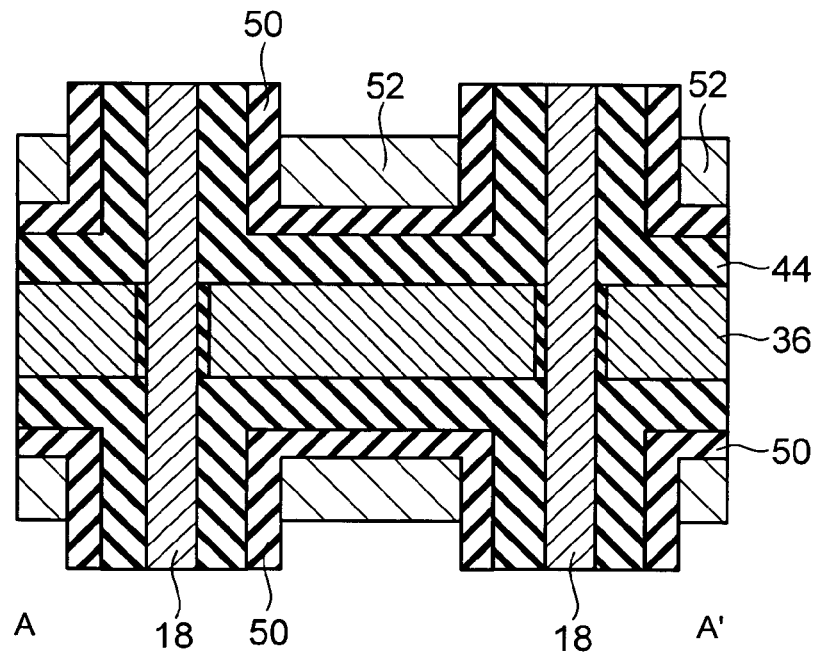
FIG. 25 is a cross sectional view corresponding to the line A–A' in FIG. 6.
Figures 26A, 26B, 26C:
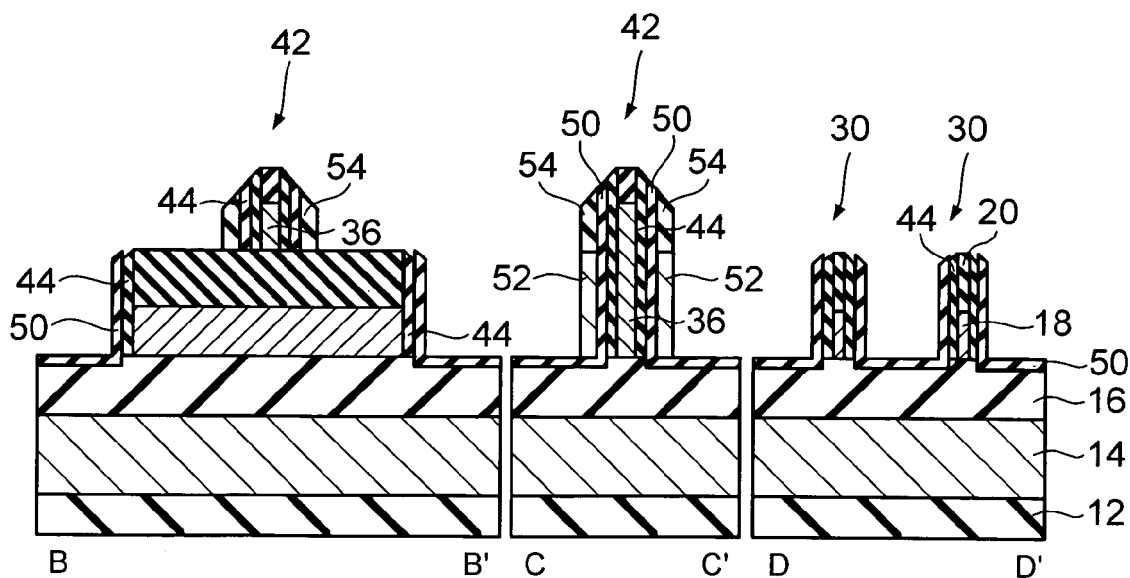
FIG. 26A, FIG. 26B, and FIG. 26C are cross sectional views respectively corresponding to the line B–B', the line C–C', and the line D–D' in FIG. 6.
Figure 27:
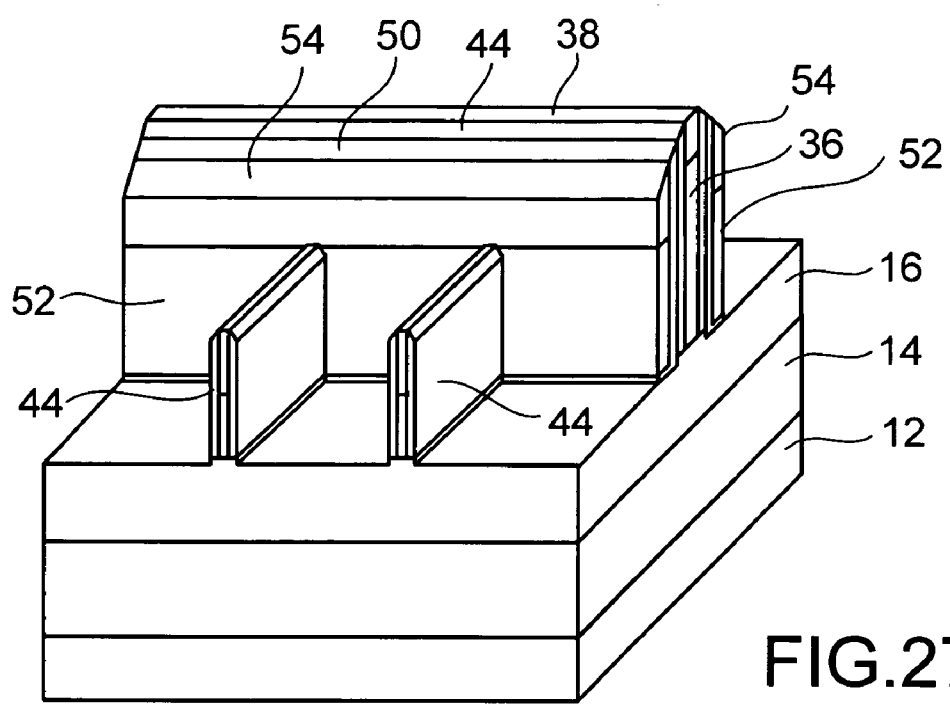
FIG. 27 is a bird's-eye view for explaining the manufacturing process of the semiconductor device according to the first embodiment.
Figure 28:
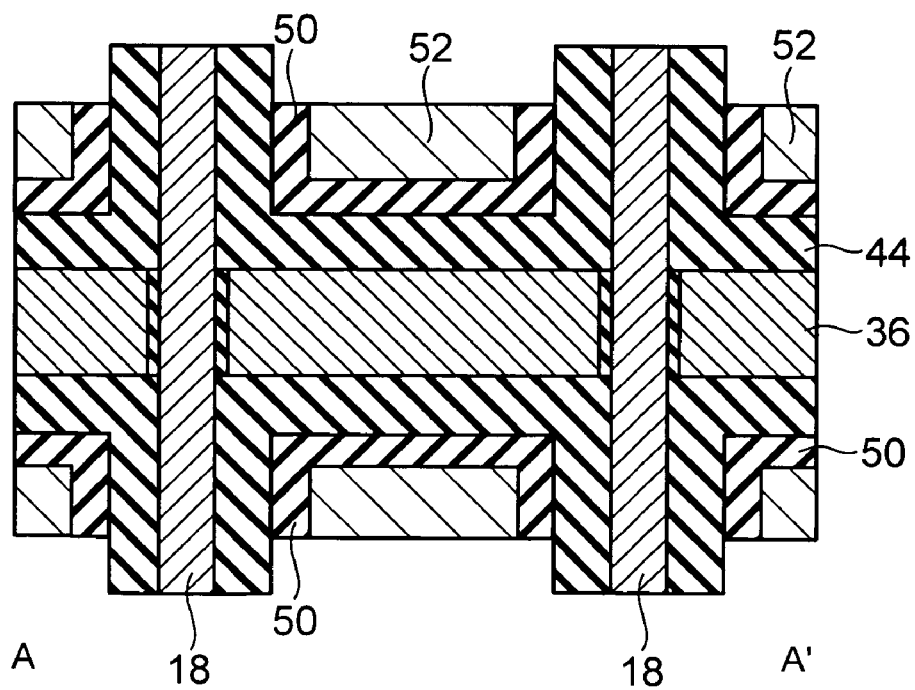
FIG. 28 is a cross sectional view corresponding to the line A–A' in FIG. 6.
Figures 29A, 29B, 29C:
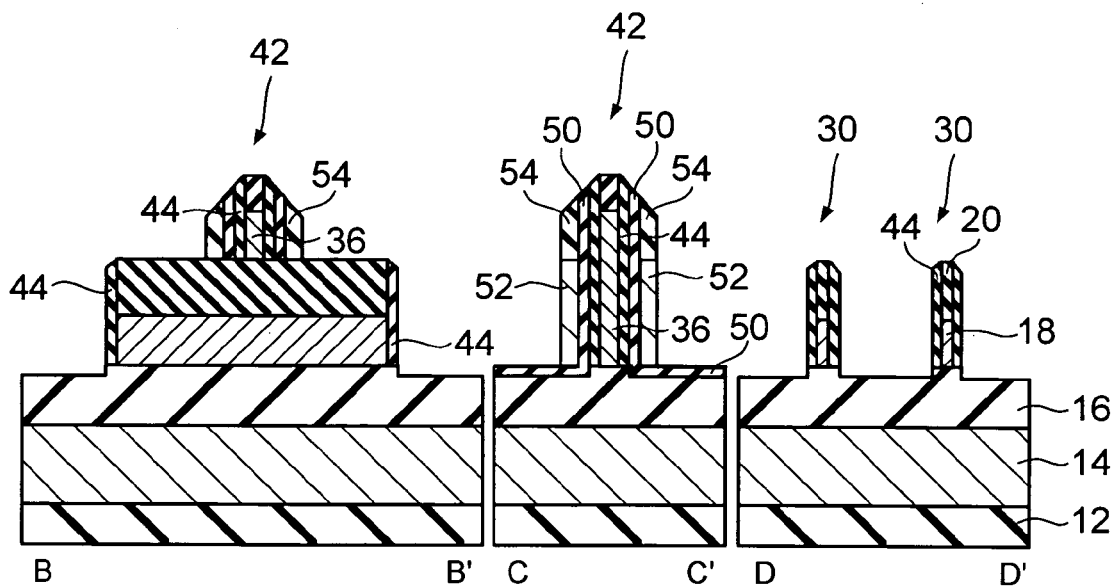
FIG. 29A, FIG. 29B, and FIG. 29C are cross sectional views respectively corresponding to the line B–B', the line C–C', and the line D–D' in FIG. 6.
Figure 30:
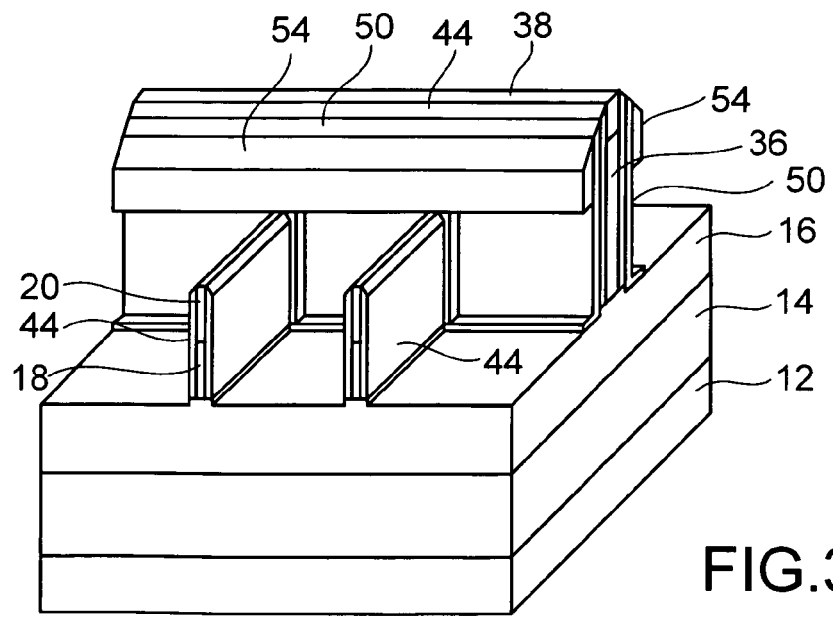
FIG. 30 is a bird's-eye view for explaining the manufacturing process of the semiconductor device according to the first embodiment.
Figure 31:
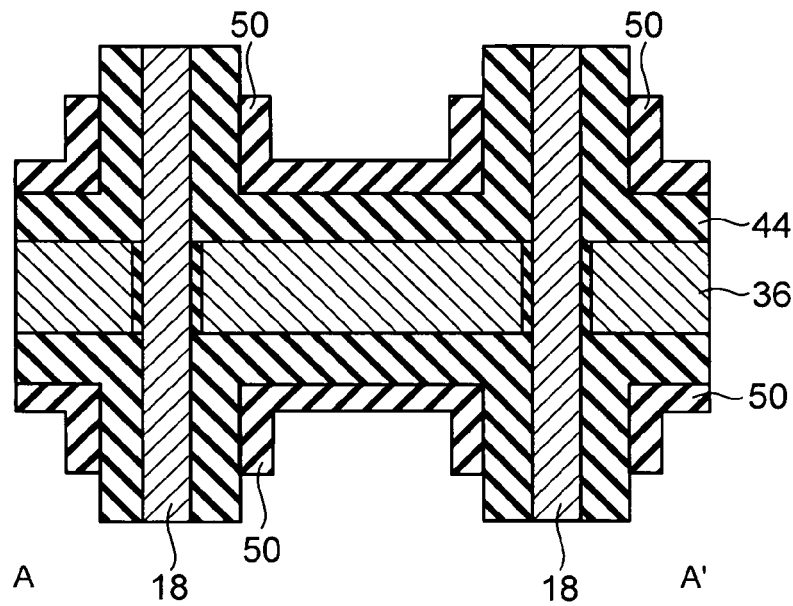
FIG. 31 is a cross sectional view corresponding to the line A–A' in FIG. 6.
Figures 32A, 32B, 32C:
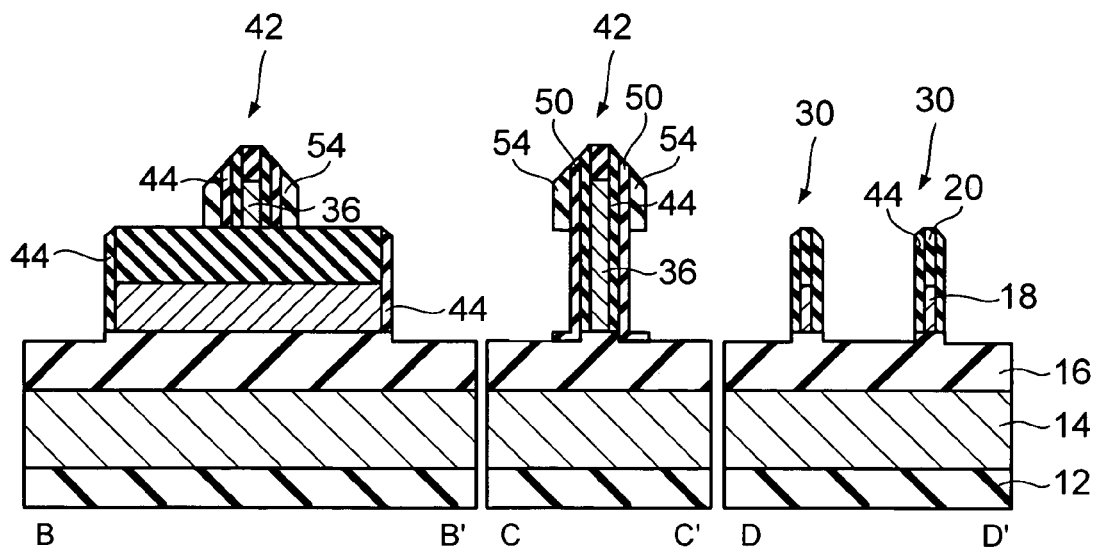
FIG. 32A, FIG. 32B, and FIG. 32C are cross sectional views respectively corresponding to the line B–B', the line C–C', and the line D–D' in FIG. 6.
Figure 33:
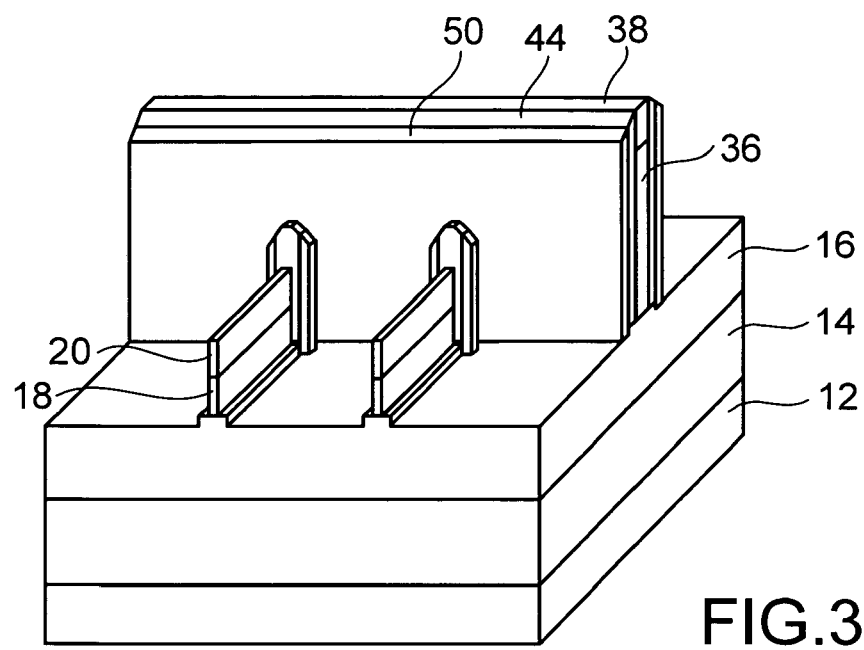
FIG. 33 is a bird's-eye view for explaining the manufacturing process of the semiconductor device according to the first embodiment.
Figure 34:
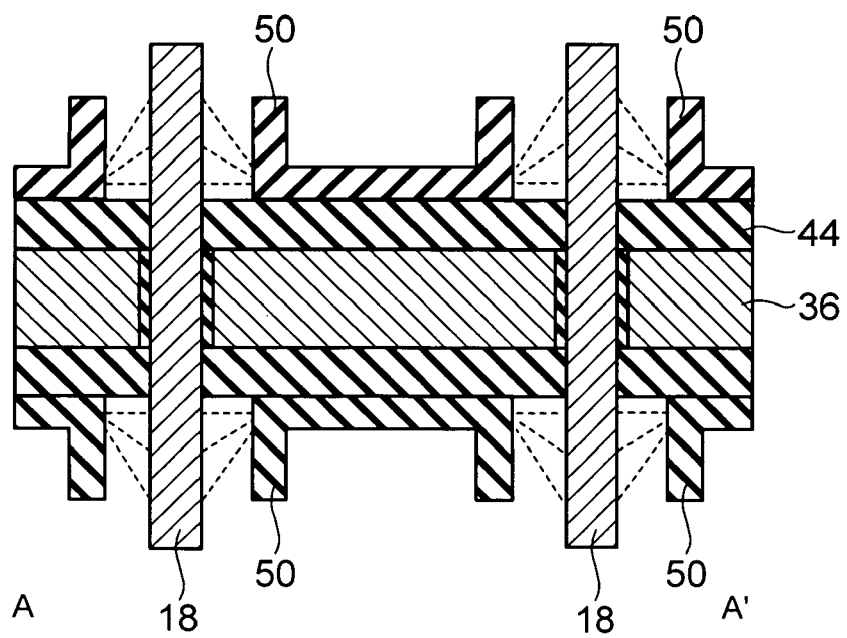
FIG. 34 is a cross sectional view corresponding to the line A–A' in FIG. 6.
Figures 35A, 35B, 35C:
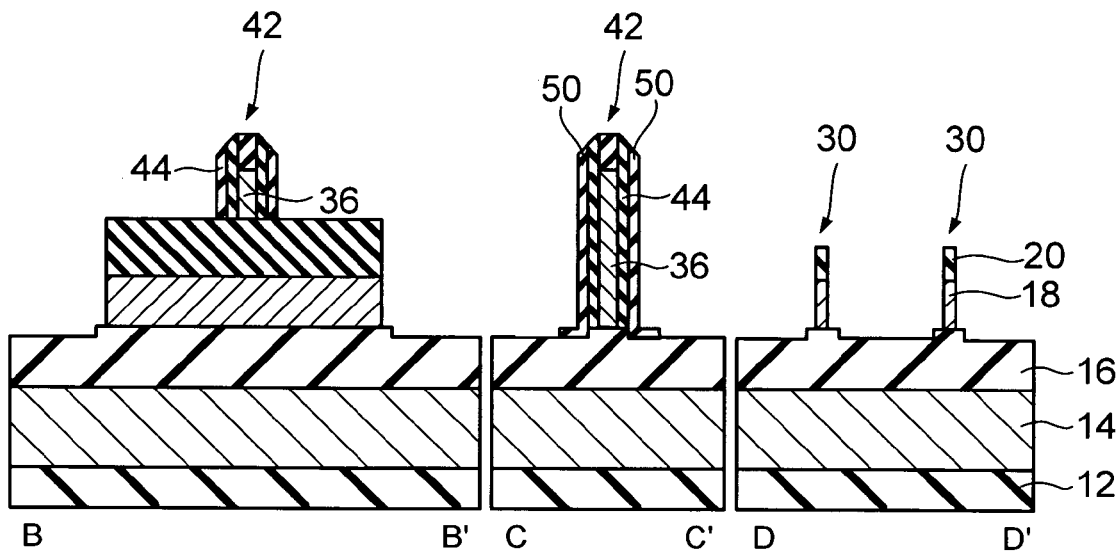
FIG. 35A, FIG. 35B, and FIG. 35C are cross sectional views respectively corresponding to the line B–B', the line C–C', and the line D–D' in FIG. 6.

Thereafter, as shown in FIG. 11 and FIG. 12A to FIG. 12C, the SiN film 44 is formed as a sidewall by etched back. Namely, as shown in FIG. 12A to FIG. 12C, the sidewall SiN film 44 is formed on side surface of the protrusion 30 which is consist of the silicon layer 18 corresponding to the Fin and the SiN hard mask 20. The first sidewall of the SiN film 44 is formed on side surface of the protrusion 42 which is consist of the polysilicon layer 36 is corresponding to the gate electrode and the SiN hard mask 38.

This process is performed in order to prevent the SiN film 44 at corners of the bottom of the Fin from remaining, when the SiN film 44 is removed by TEOS film as mentioned below. Therefore, the process of etching back the SiN film 44 is not always a necessary process, so that it can be omitted.

Moreover, it is preferable that after the SiN film 44 is etched back, the silicon oxide film 16 is etched, for example, by approximately 5 nm. This digging down can be performed, for example, by RIE or dilute hydrofluoric acid (DHF). Etching deeply reads to effectively avoid the SiN film 44 from remaining at corner. However, etching too deeply causes to lifting the Fin off or increase of the leakage current to the silicon substrate 14 increases because the thickness of the silicon oxide film 16 is reduced. Etching by 50 nm or less is preferable in this embodiment.

Then, as shown in FIG. 13 and FIG. 14A to FIG. 14C, a silicon oxide film 50 is formed, for example, with a thickness of 5 nm. This silicon oxide film 50 can be deposited by using TEOS $(Si(OC_2H_5)_4)$ at 1 Torr and 600° C. The thickness of this silicon oxide film 50 is preferably 30 nm or less to form the SiN film 44 in accuracy, and preferably 2 nm or more to remain during the SiN etching mentioned below. This silicon oxide film 50 corresponds to an additional film formed all over the base layer in this embodiment.

Subsequently, as shown in FIG. 15, FIG. 16, and FIG. 17A to FIG. 17C, a polysilicon layer 52 is formed, for example, with a thickness of 350 nm. This polysilicon layer 52, similarly to the aforementioned polysilicon layer 32, can be deposited, for example, under the condition of 1 Torr and 620° C. in the mixed gas of $SiH_4$, $N_2$, and $H_2$. Thereafter, the polysilicon layer 52 is planarized by CMP and etched back until the top of the SiN hard mask 38 on the gate electrode is exposed.

Then, as shown in FIG. 18, FIG. 19, and FIG. 20A to FIG. 20C, the polysilicon layer 52 is etched back until just before the top of the SiN hard mask 20 on the Fin is exposed. In this etch back, the polysilicon layer 52 may be left on the SiN hard mask 20 within the thickness of about 30 nm. Or, the polysilicon layer 52 may be etched approximately 20 nm lower than the top of the SiN hard mask 20. This polysilicon layer 52 corresponds to a first film in this embodiment.

Subsequently, as shown in FIG. 21, FIG. 22, and FIG. 23A to FIG. 23C, a SiN film 54 is formed overall, for example, with a thickness of 15 nm. This SiN film 54 is formed in the same manner as above, for example, at 10 Torr and 750° C. in the atmosphere of dichlorosilane $SiH_2Cl_2$ and ammonia $NH_3$. This SiN film 54 corresponds to a second film in this embodiment. Thereafter, by etching back the SiN film 54, the SiN film 54 is left as a mask portion on a side surface of the silicon oxide film 50 on a side surface of the gate electrode.

Then, as shown in FIG. 24, FIG. 25, and FIG. 26A to FIG. 26C, the polysilicon layer 52 is etched by RIE using the SiN film 54 as a mask. The region of the polysilicon layer 52 located under the SiN film 54 is left on the side surface of the silicon oxide film 50 on the side surface of the gate electrode. A second sidewall is formed by the SiN film 54 and the polysilicon layer 52.

Subsequently, as shown in FIG. 27, FIG. 28, and FIG. 29A to FIG. 29C, the silicon oxide film 50 is removed by wet etching (for example, dilute hydrofluoric acid (DHF)). In this wet etching, due to the SiN film 54 and the silicon layer 52 the silicon oxide film 50 on the side surface of the gate electrode is not removed.

Thereafter, as shown in FIG. 30, FIG. 31, and FIG. 32A to FIG. 32C, the polysilicon layer 52 is removed by CDE.

Then, as shown in FIG. 33, FIG. 34, and FIG. 35A to FIG. 35C, the SiN film 44 on a side surface of the Fin is removed by the solution containing $H_3PO_4$.

In this embodiment, by forming the SiN film 44 at a lower temperature than the SiN film 20, 38, the rate of etching of the SiN film 44 by the solution containing $H_3PO_4$ is higher than those of the SiN film 20, 38. This can avoid the SiN film 44 from being left at corner of the silicon layer 18 and the SiN film 44, and make the SiN film 44 at the corner relatively flat. Moreover, by forming the depth of the silicon oxide film 50 more deeply in a Fin direction, the SiN film 44 at the corner can be made more effectively flat. This is for the following reason. As shown by dotted lines in FIG. 34, at an early stage, the SiN film 44 has a shape of trailing from the silicon oxide film 50 side to the silicon layer 18 side, but when the SiN film 44 is etched by the solution containing $H_3PO_4$, an etching agent has more difficulty in getting in as it goes deeper, whereby the SiN film 44 on the silicon oxide film 50 side is etched slower than the SiN film 44 on the silicon layer 18 side. Hence, it is thought theoretically that if the depth of the silicon oxide film 50 becomes deeper, the SiN film 44 etched by the solution containing $H_3PO_4$ becomes gradually flatter.

Subsequently, as shown in FIG. 36, FIG. 37, and FIG. 38A to FIG. 38C, the silicon oxide film 50 is removed by peeling it off with the dilute hydrofluoric acid (DHF).

Figure 39:
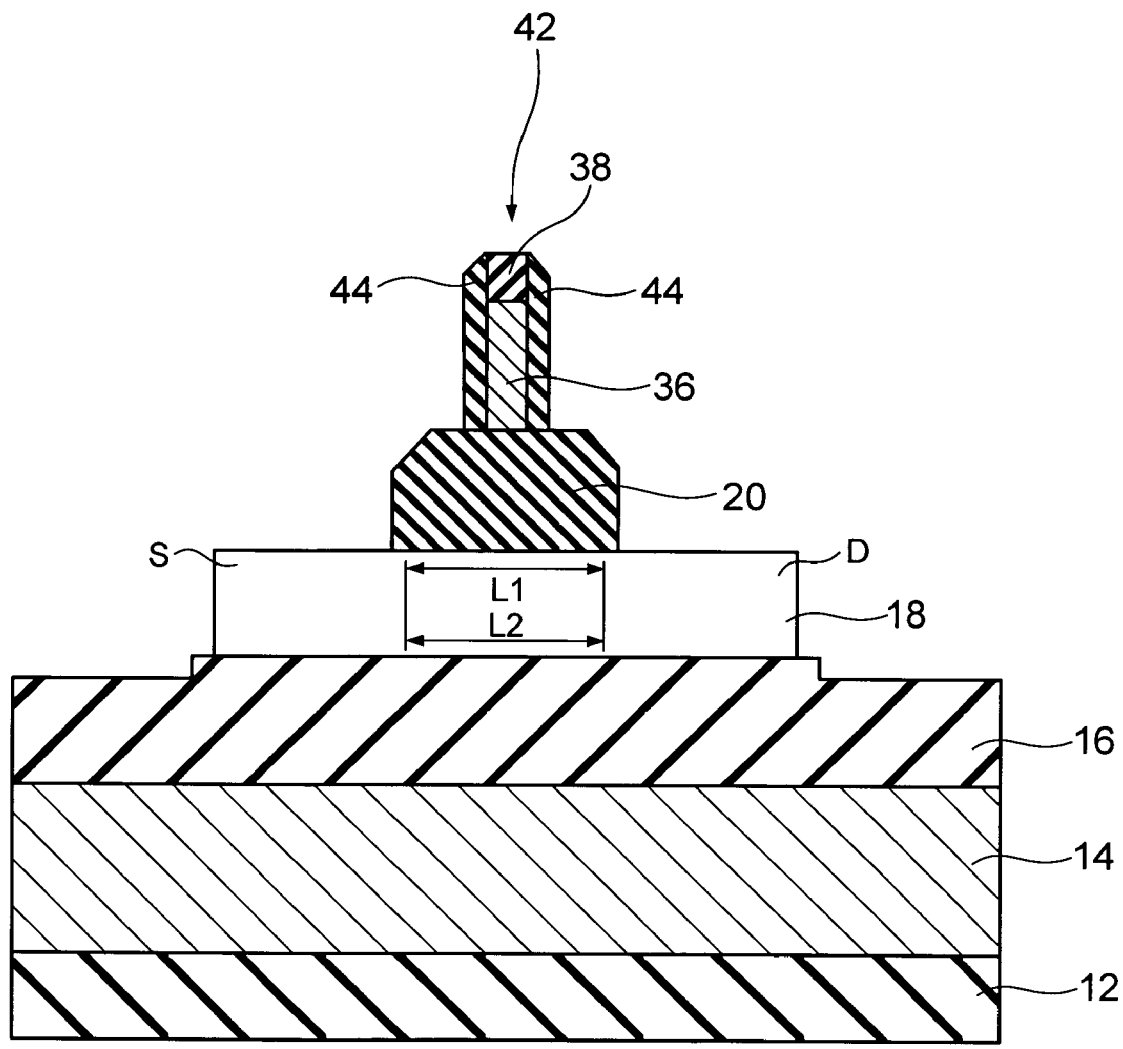
FIG. 39 is a sectional view corresponding to the line B–B' in FIG. 6 in the semiconductor device according to the first embodiment.
Figure 40:
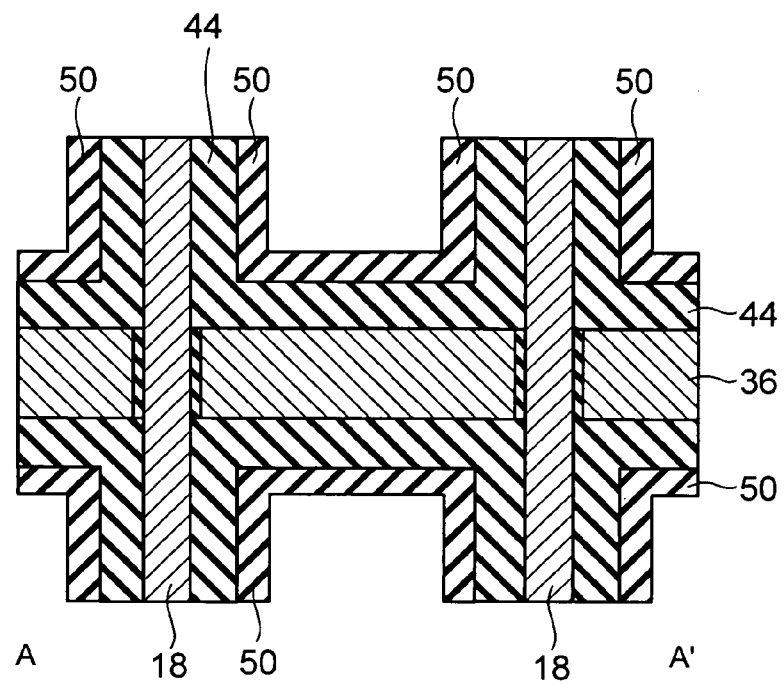
FIG. 40 is a cross sectional view corresponding to the line A–A' in FIG. 6.
Figures 41A, 41B, 41C:
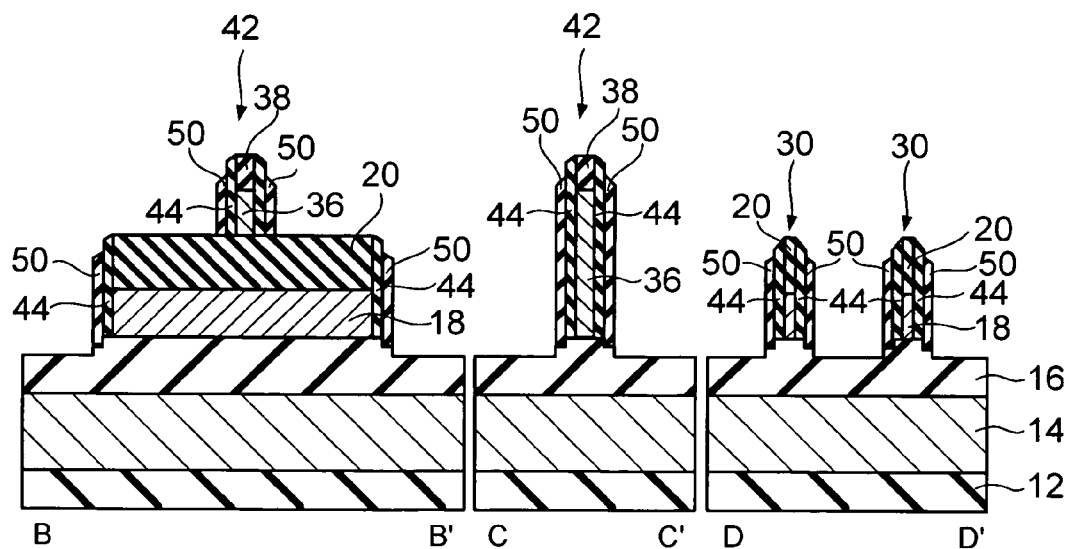
FIG. 41A, FIG. 41B, and FIG. 41C are cross sectional views respectively corresponding to the line B–B', the line C–C', and the line D–D' in FIG. 6.
Figure 42:
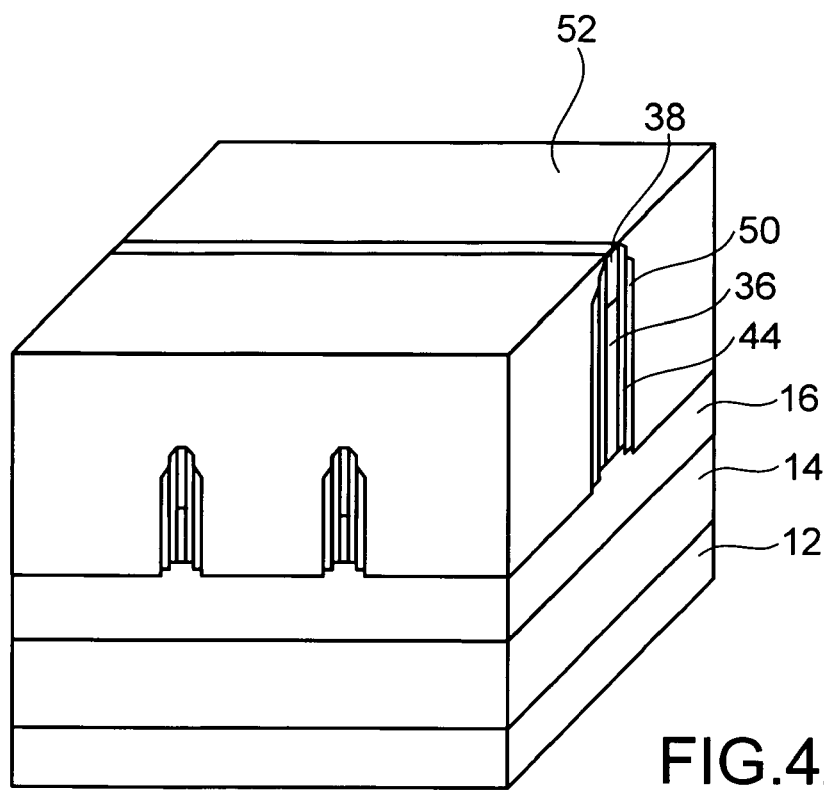
FIG. 42 is a bird's-eye view for explaining a manufacturing process of a semiconductor device according to a second embodiment.
Figure 43:
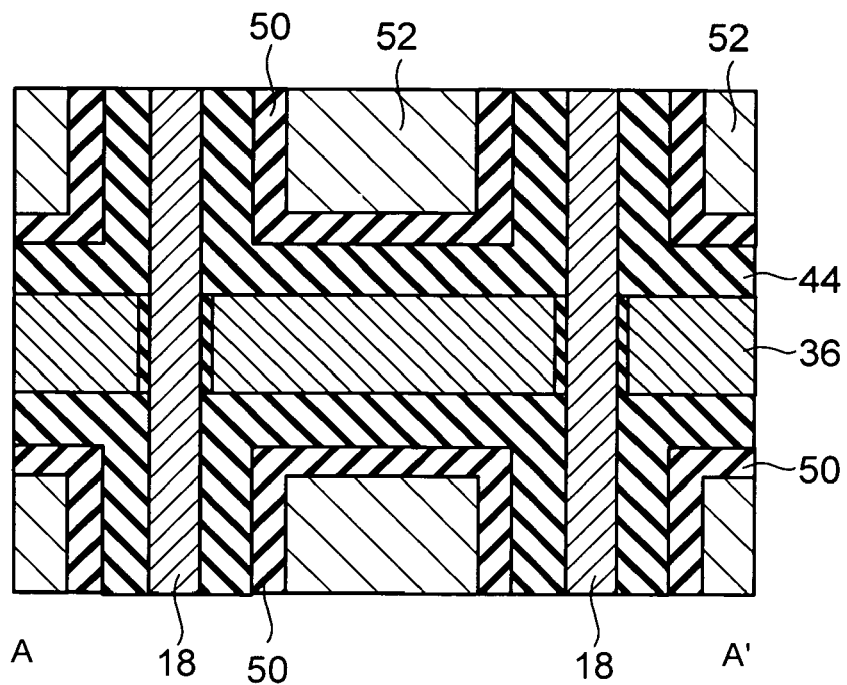
FIG. 43 is a cross sectional view corresponding to the line A–A' in FIG. 6.
Figures 44A, 44B, 44C:
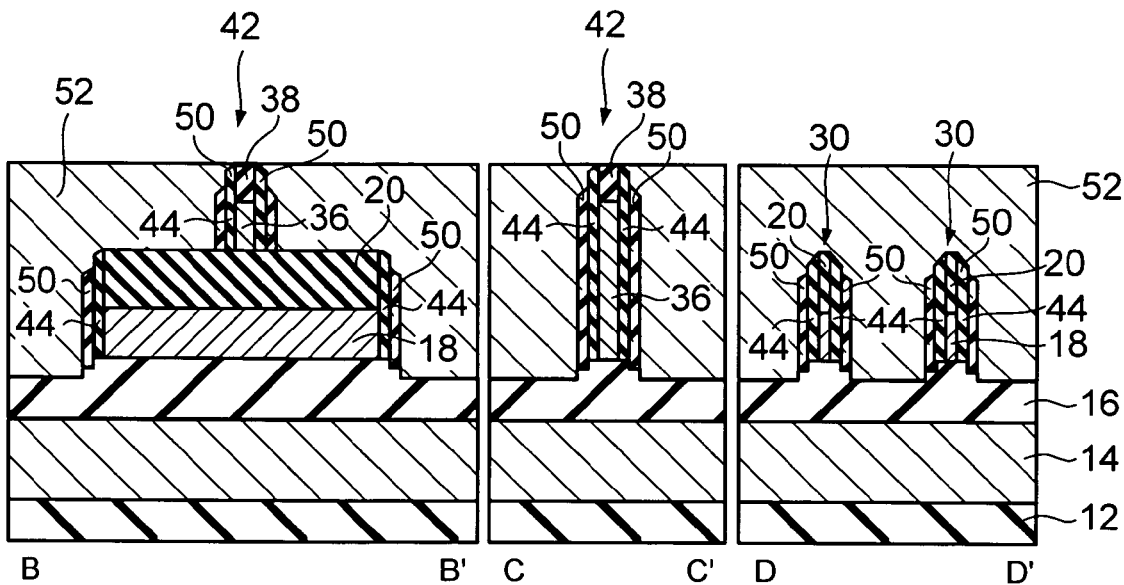
FIG. 44A, FIG. 44B, and FIG. 44C are cross sectional views respectively corresponding to the line B–B', the line C–C', and the line D–D' in FIG. 6.
Figure 45:
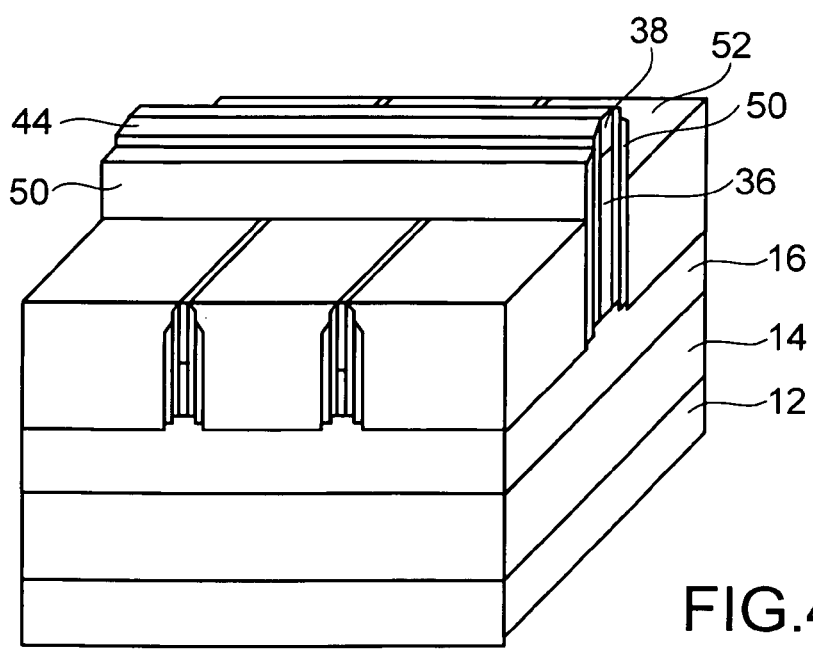
FIG. 45 is a bird's-eye view for explaining the manufacturing process of the semiconductor device according to the second embodiment.
Figure 46:
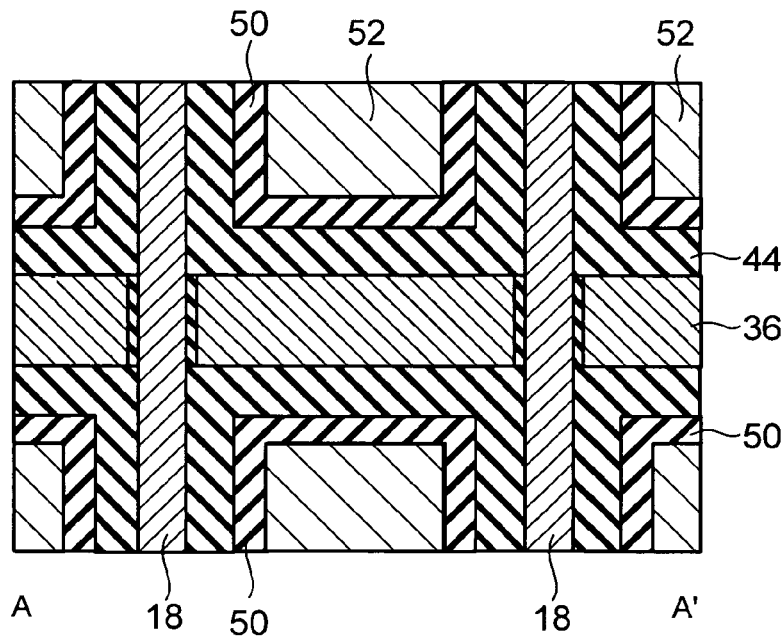
FIG. 46 is a cross sectional view corresponding to the line A–A' in FIG. 6.
Figures 47A, 47B, 47C:
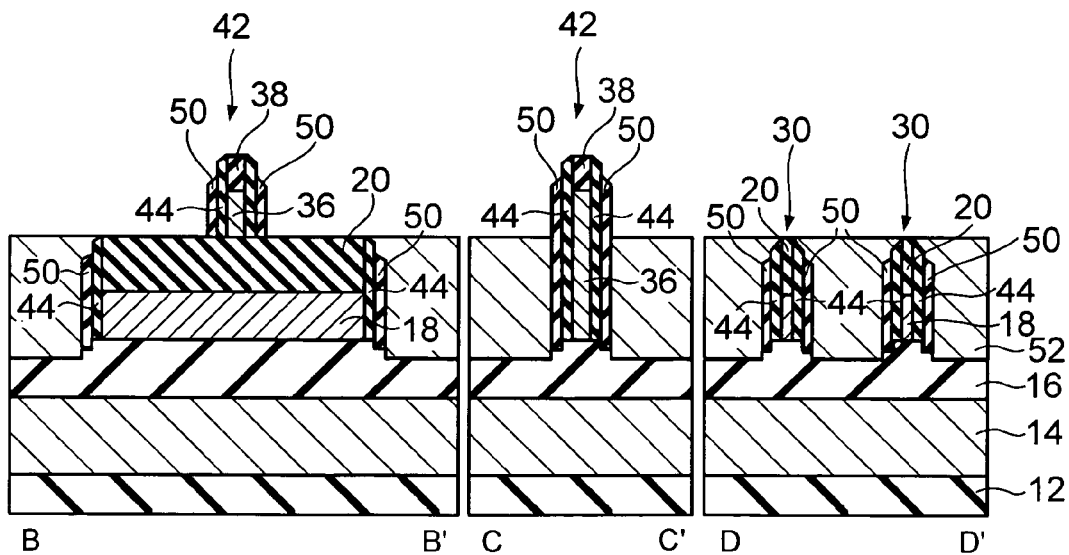
FIG. 47A, FIG. 47B, and FIG. 47C are cross sectional views respectively corresponding to the line B–B', the line C–C', and the line D–D' in FIG. 6.
Figure 48:
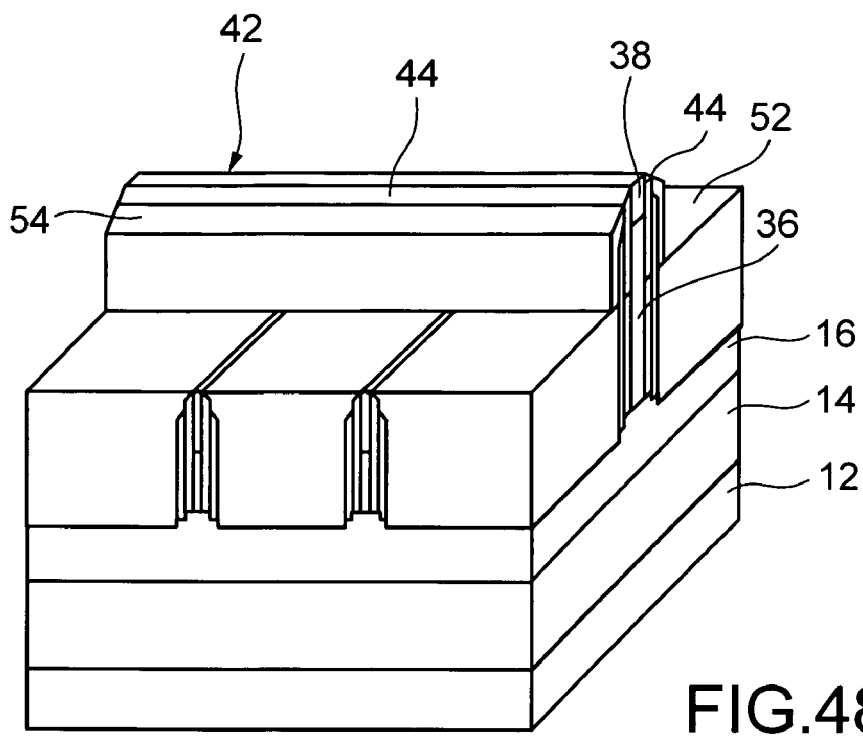
FIG. 48 is a bird's-eye view for explaining the manufacturing process of the semiconductor device according to the second embodiment.
Figure 49:
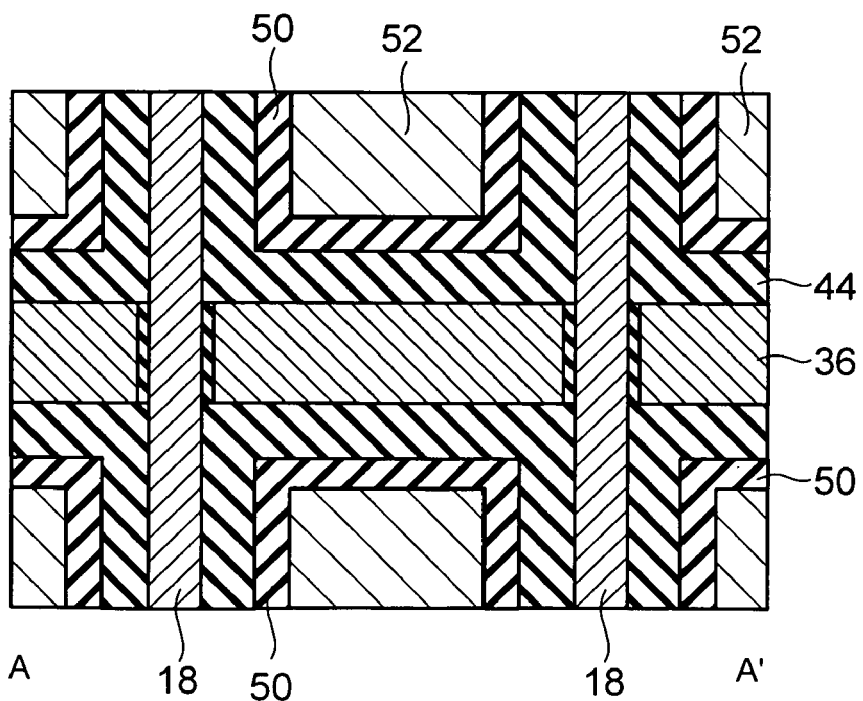
FIG. 49 is a cross sectional view corresponding to the line A–A' in FIG. 6.
Figures 50A, 50B, 50C:
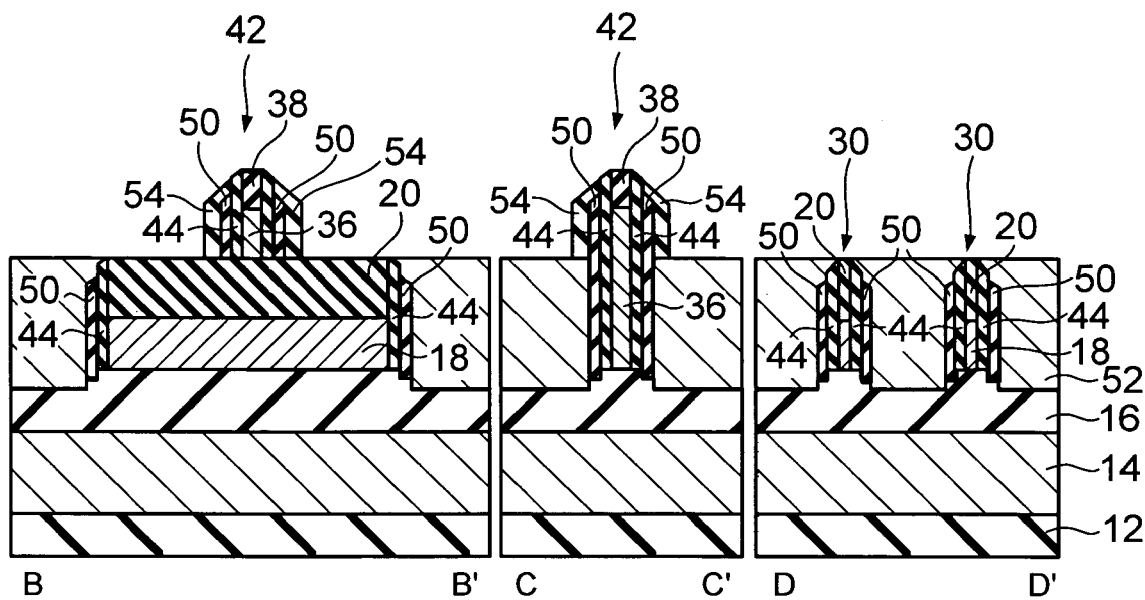
FIG. 50A, FIG. 50B, and FIG. 50C are cross sectional views respectively corresponding to the line B–B', the line C–C', and the line D–D' in FIG. 6.
Figure 51:
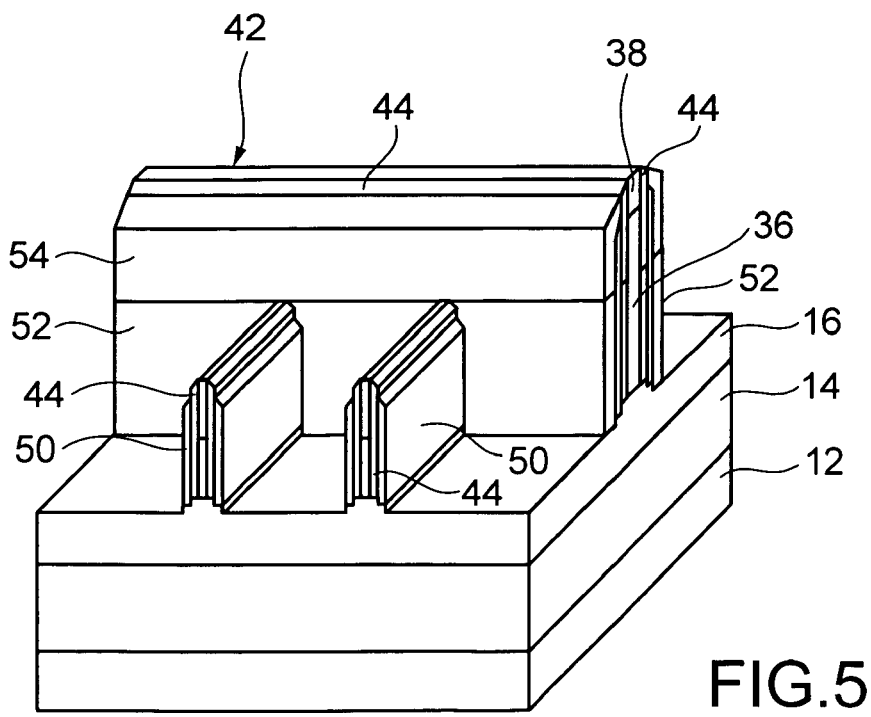
FIG. 51 is a bird's-eye view for explaining the manufacturing process of the semiconductor device according to the second embodiment.
Figure 52:
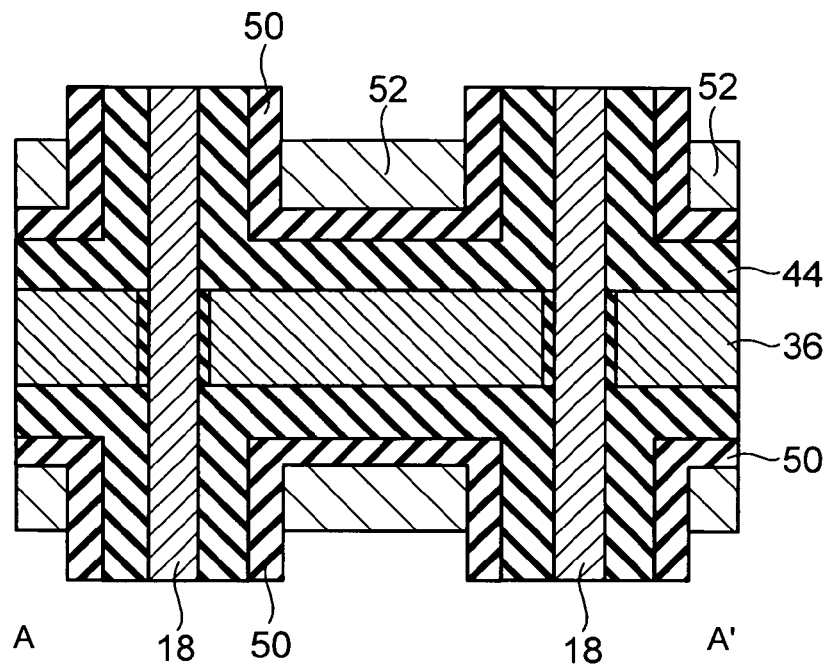
FIG. 52 is a cross sectional view corresponding to the line A–A' in FIG. 6.
Figures 53A, 53B, 53C:
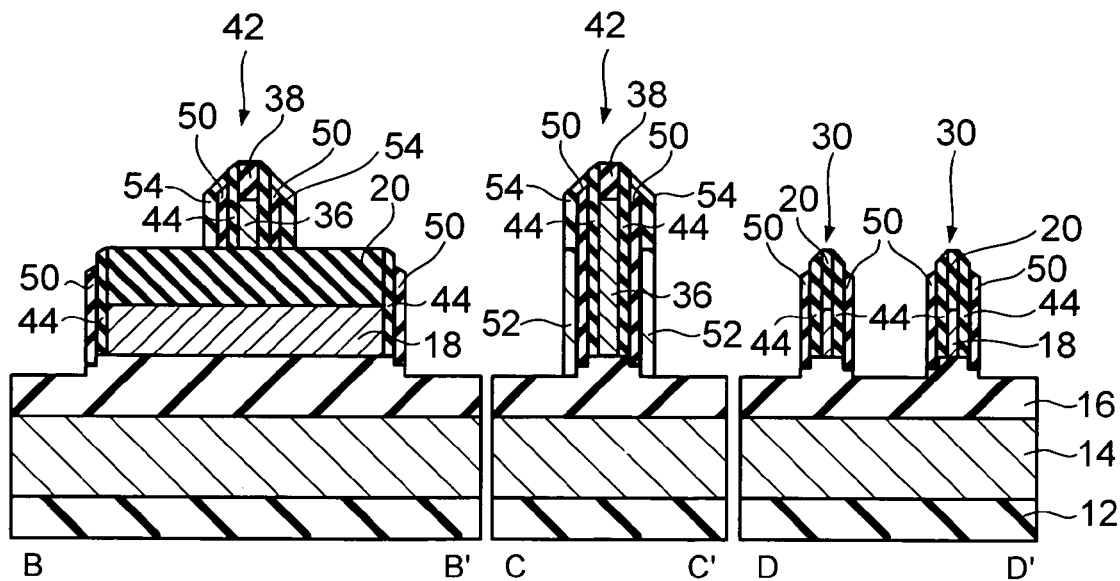
FIG. 53A, FIG. 53B, and FIG. 53C are cross sectional views respectively corresponding to the line B–B', the line C–C', and the line D–D' in FIG. 6.
Figure 54:
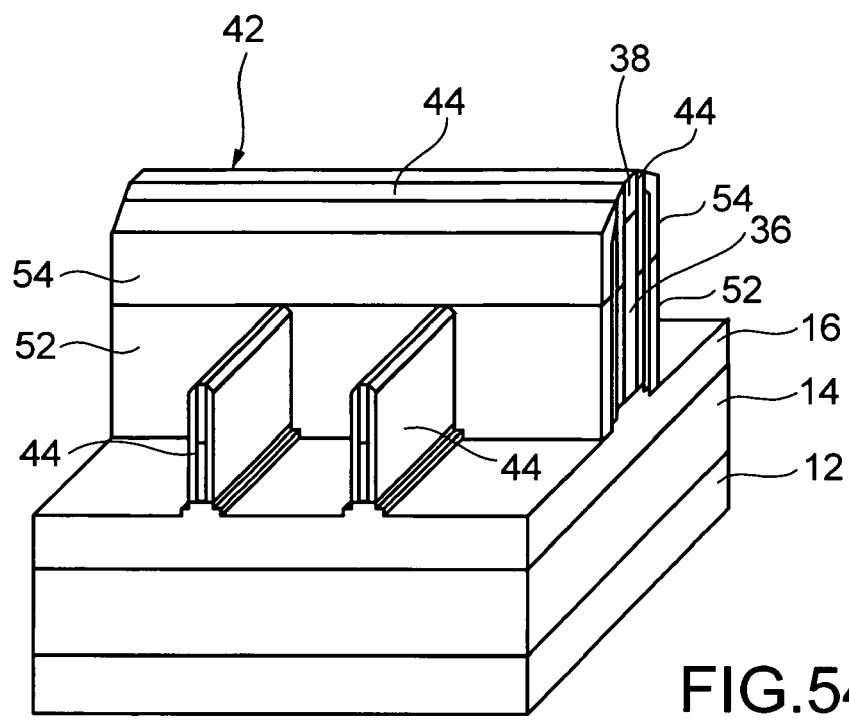
FIG. 54 is a bird's-eye view for explaining the manufacturing process of the semiconductor device according to the second embodiment.
Figure 55:
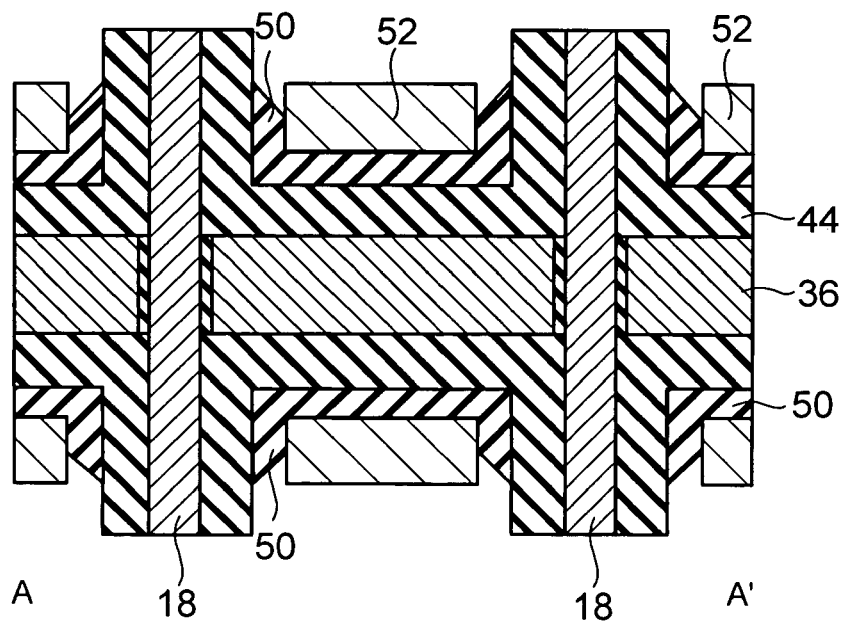
FIG. 55 is a cross sectional view corresponding to the line A–A' in FIG. 6.
Figures 56A, 56B, 56C:
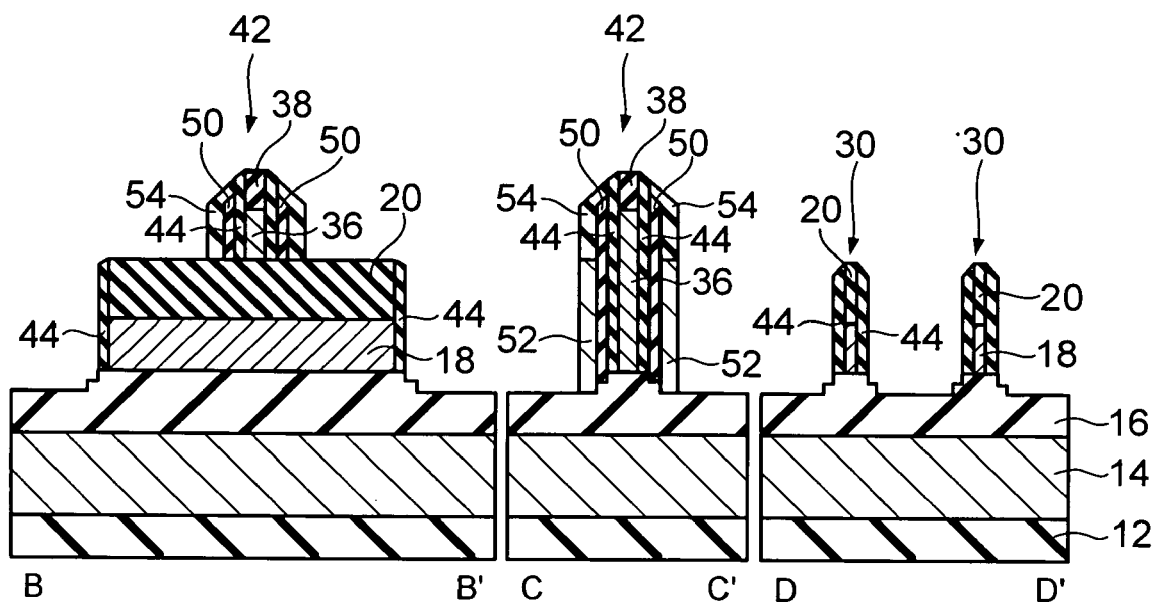
FIG. 56A, FIG. 56B, and FIG. 56C are cross sectional views respectively corresponding to the line B–B', the line C–C', and the line D–D' in FIG. 6.
Figure 57:
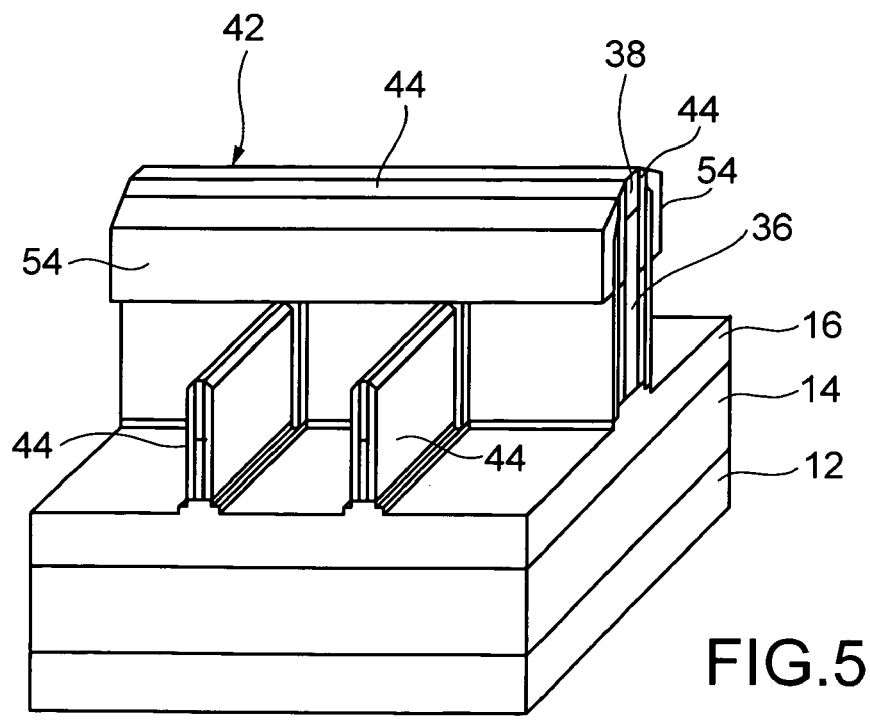
FIG. 57 is a bird's-eye view for explaining the manufacturing process of the semiconductor device according to the second embodiment.
Figure 58:
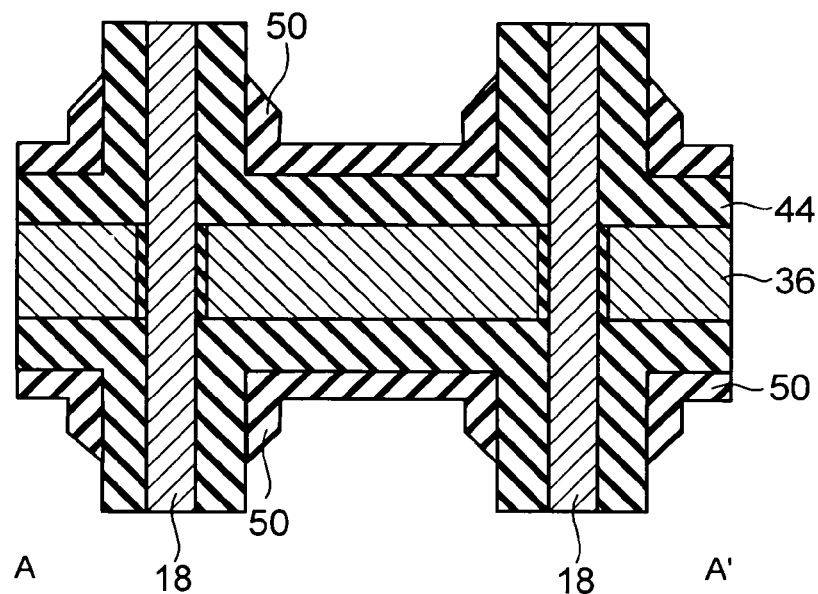
FIG. 58 is a cross sectional view corresponding to the line A–A' in FIG. 6.
Figures 59A, 59B, 59C:
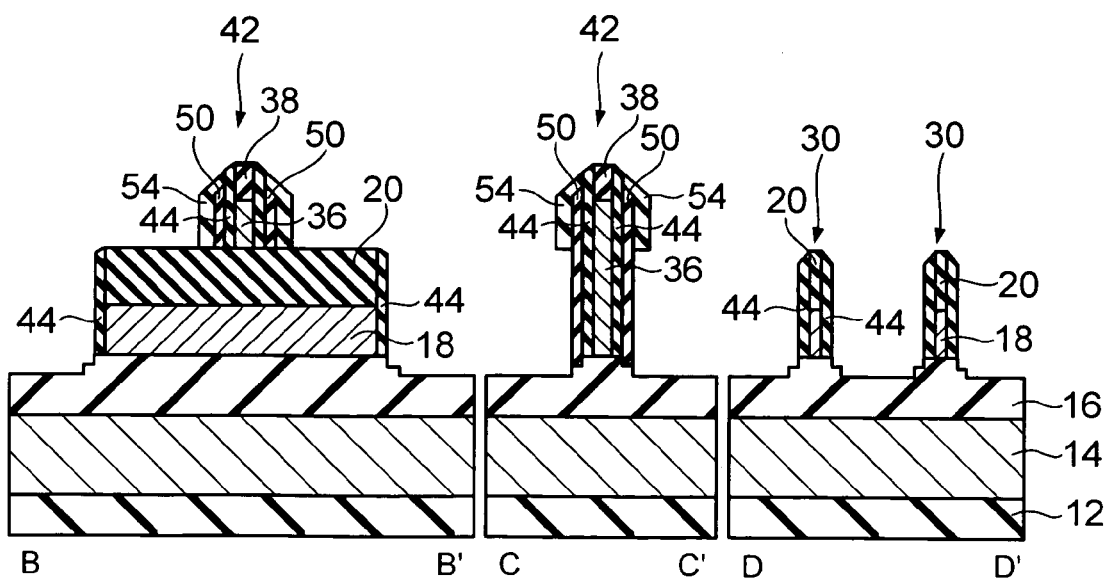
FIG. 59A, FIG. 59B, and FIG. 59C are cross sectional views respectively corresponding to the line B–B', the line C–C', and the line D–D' in FIG. 6.
Figure 60:
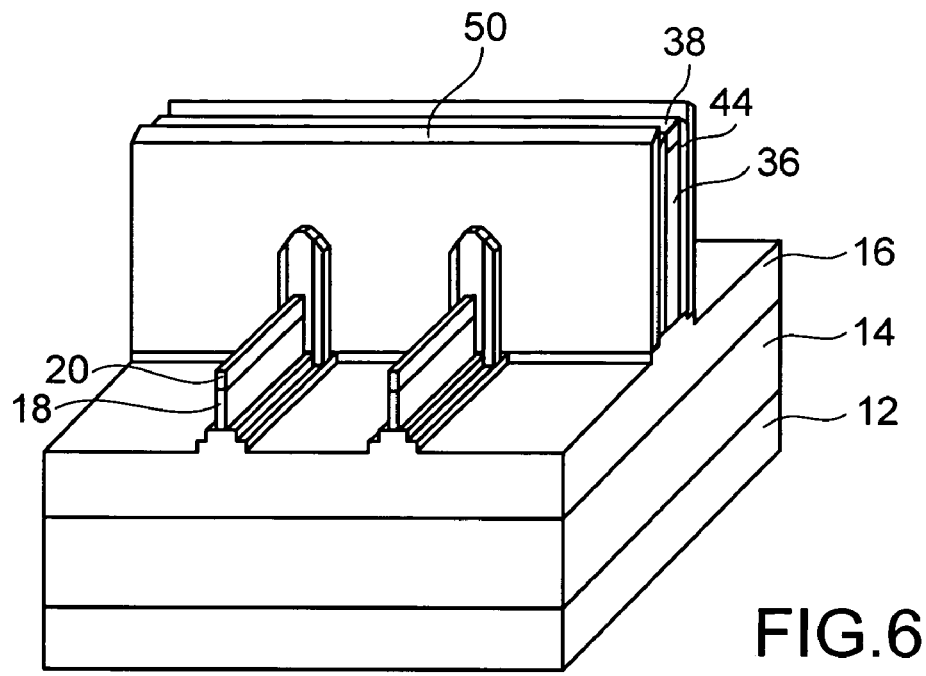
FIG. 60 is a bird's-eye view for explaining the manufacturing process of the semiconductor device according to the second embodiment.
Figure 61:
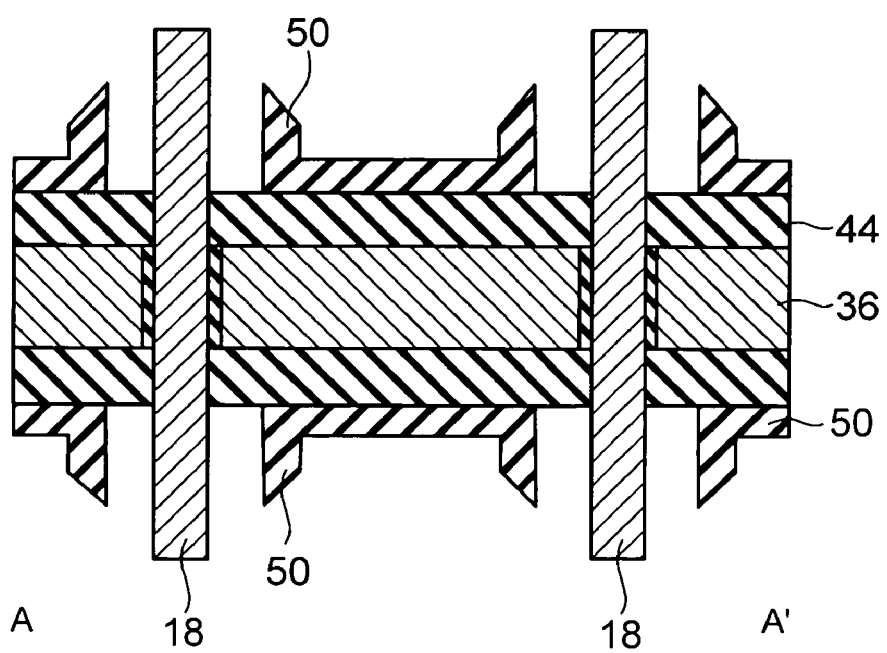
FIG. 61 is a cross sectional view corresponding to the line A–A' in FIG. 6.
Figures 62A, 62B, 62C:
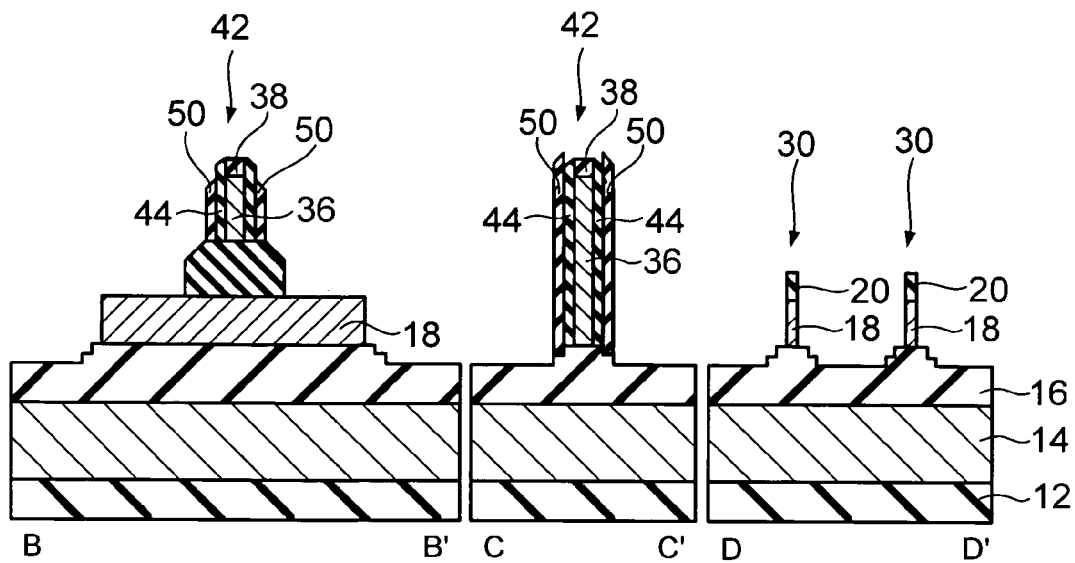
FIG. 62A, FIG. 62B, and FIG. 62C are cross sectional views respectively corresponding to the line B–B', the line C–C', and the line D–D' in FIG. 6.
Figure 63:
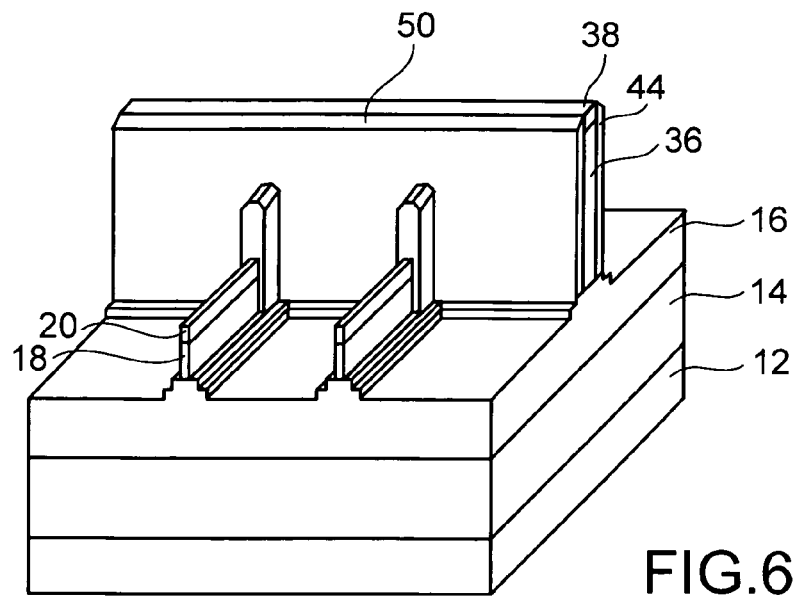
FIG. 63 is a bird's-eye view for explaining the manufacturing process of the semiconductor device according to the second embodiment.
Figure 64:
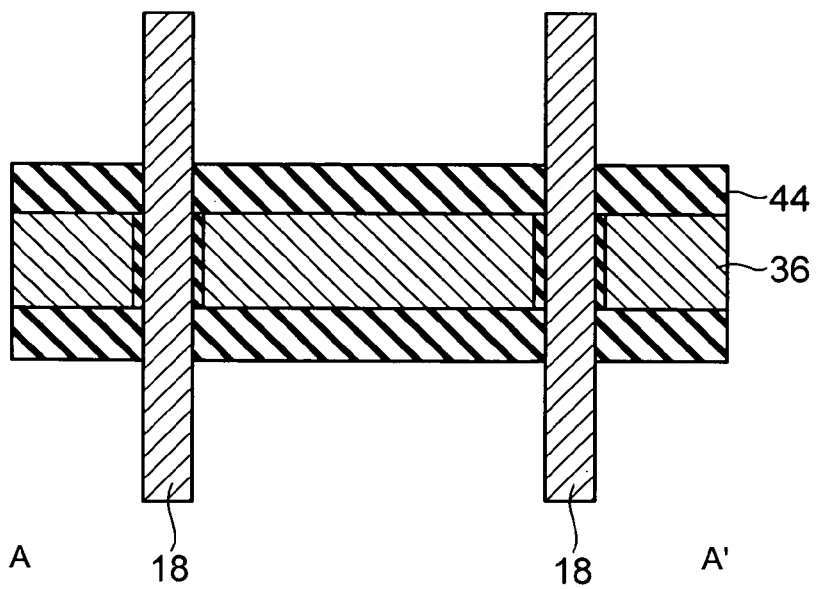
FIG. 64 is a cross sectional view corresponding to the line A–A' in FIG. 6.
Figures 65A, 65B, 65C:
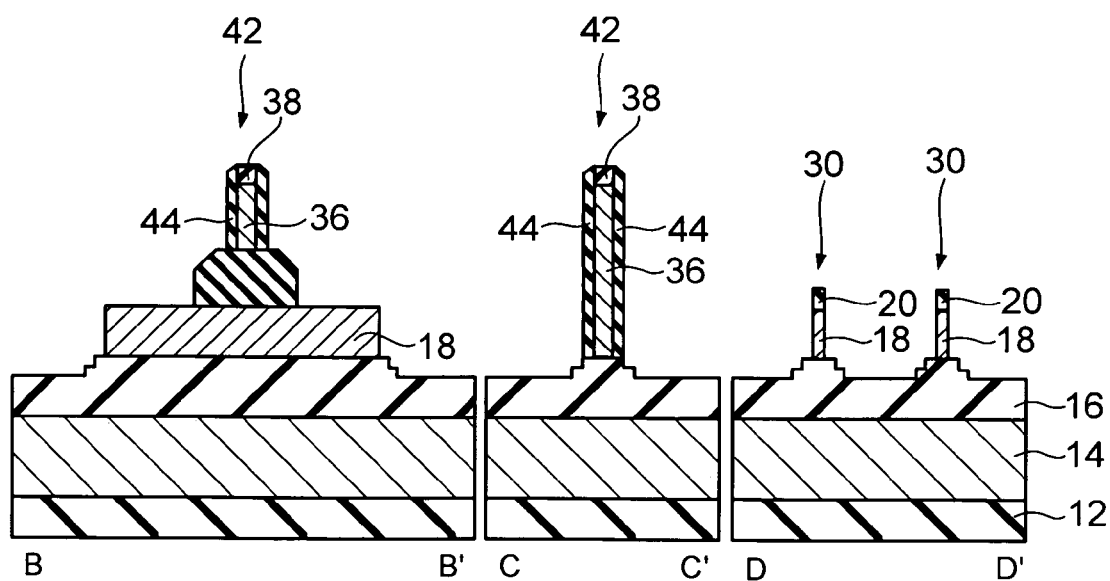
FIG. 65A, FIG. 65B, and FIG. 65C are cross sectional views respectively corresponding to the line B–B', the line C–C', and the line D–D' in FIG. 6.
Figure 66:
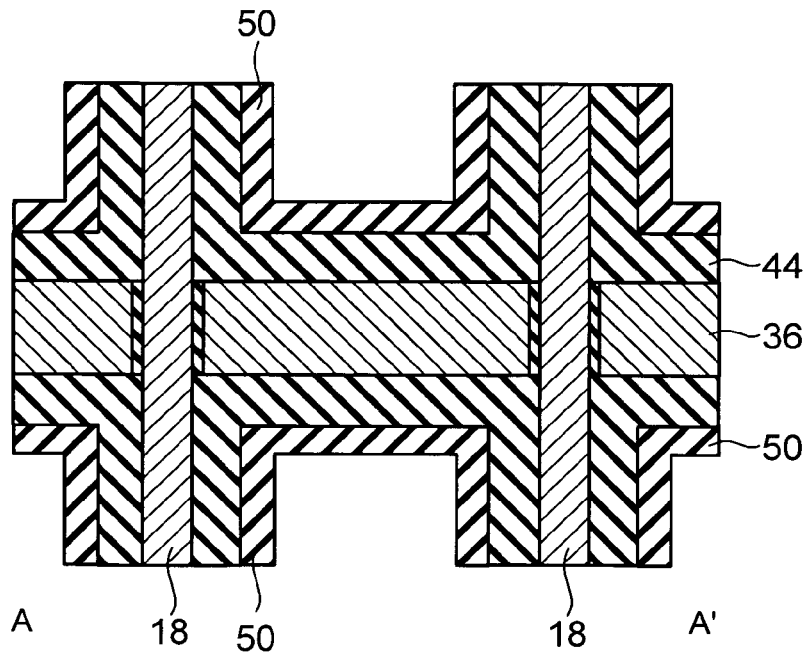
FIG. 66 is a cross sectional view in a third embodiment corresponding to the line A–A' in FIG. 6.
Figures 67A, 67B, 67C:
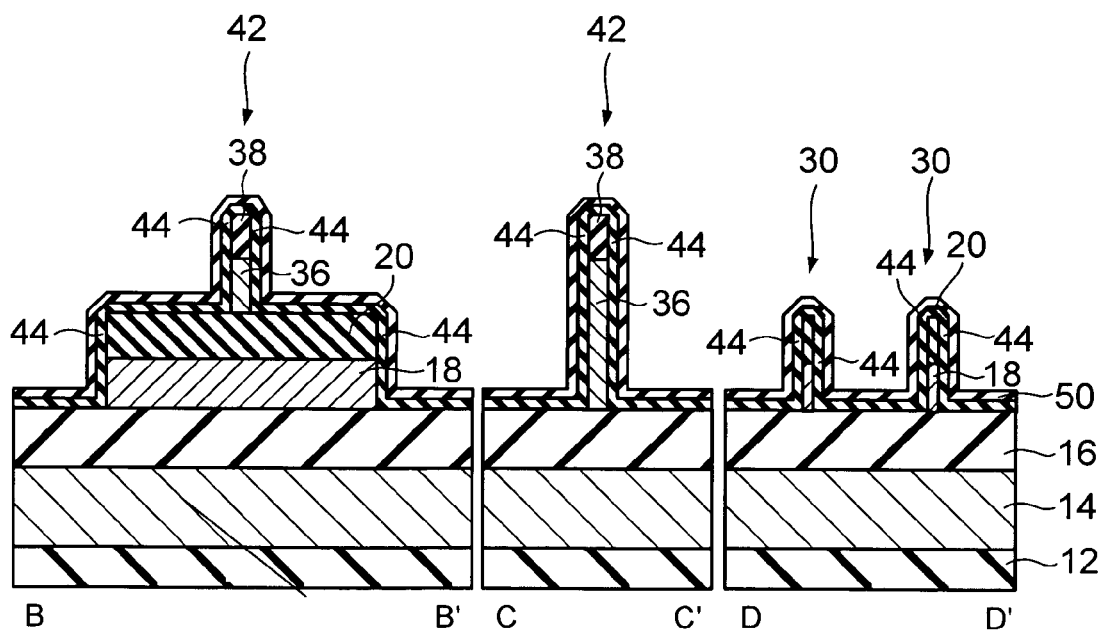
FIG. 67A, FIG. 67B, and FIG. 67C are cross sectional views in the third embodiment respectively corresponding to the line B–B', the line C–C', and the line D–D' in FIG. 6.
Figure 68:
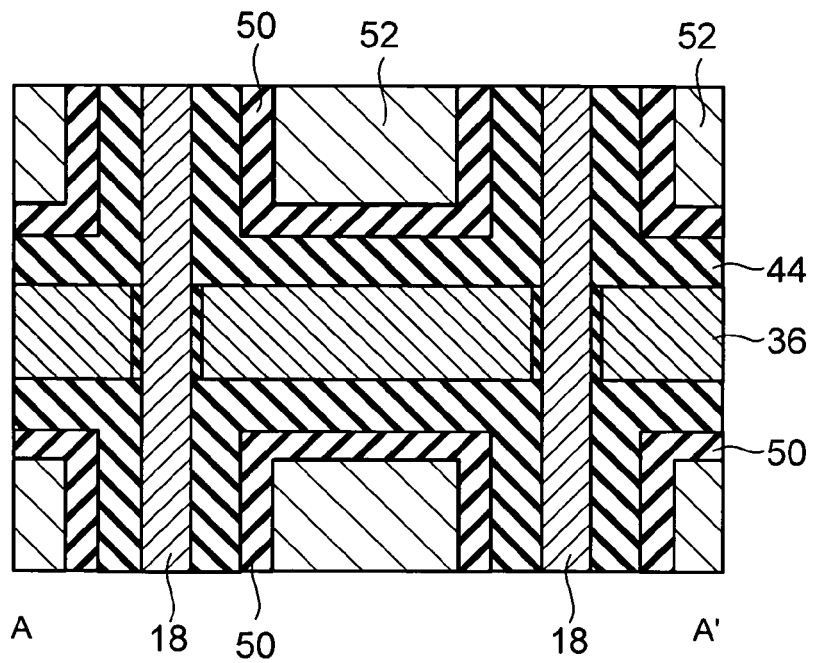
FIG. 68 is a cross sectional view in the third embodiment corresponding to the line A–A' in FIG. 6.
Figures 69A, 69B, 69C:
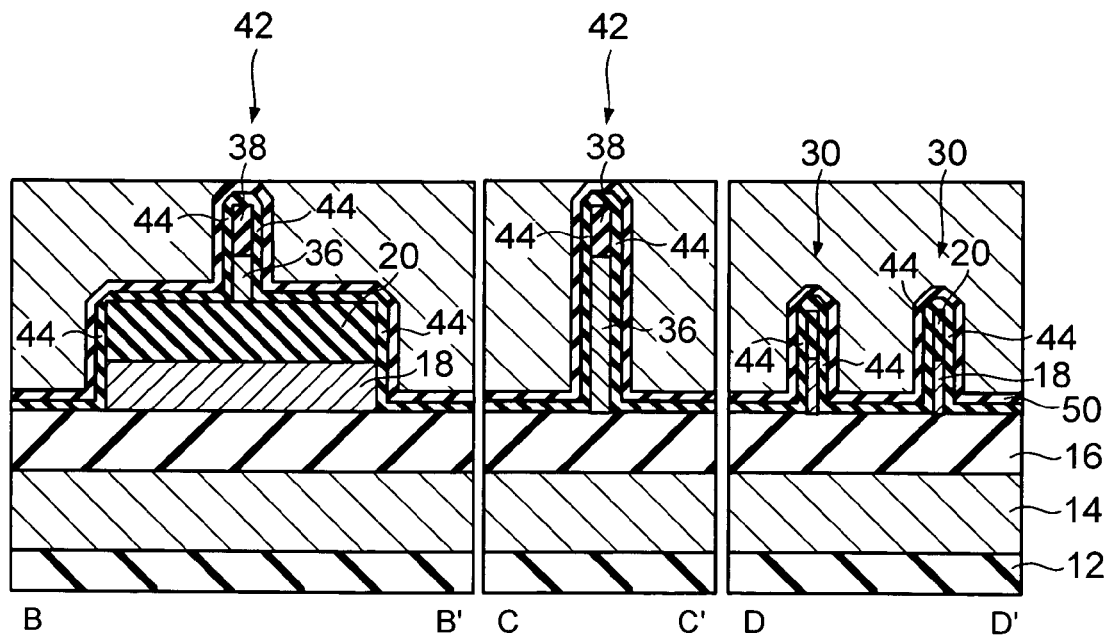
FIG. 69A, FIG. 69B, and FIG. 69C are cross sectional views in the third embodiment respectively corresponding to the line B–B', the line C–C', and the line D–D' in FIG. 6.
Figure 70:
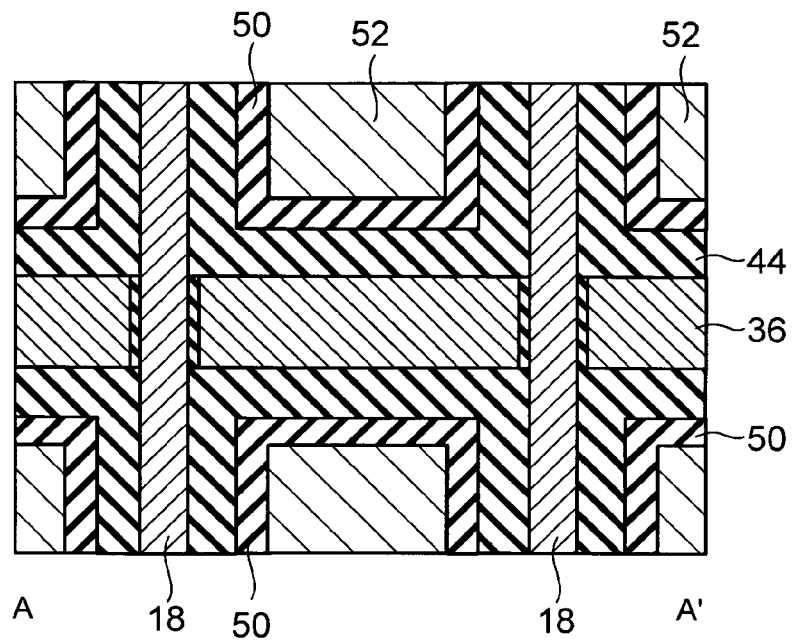
FIG. 70 is a cross sectional view in the third embodiment corresponding to the line A–A' in FIG. 6.
Figures 71A, 71B, 71C:
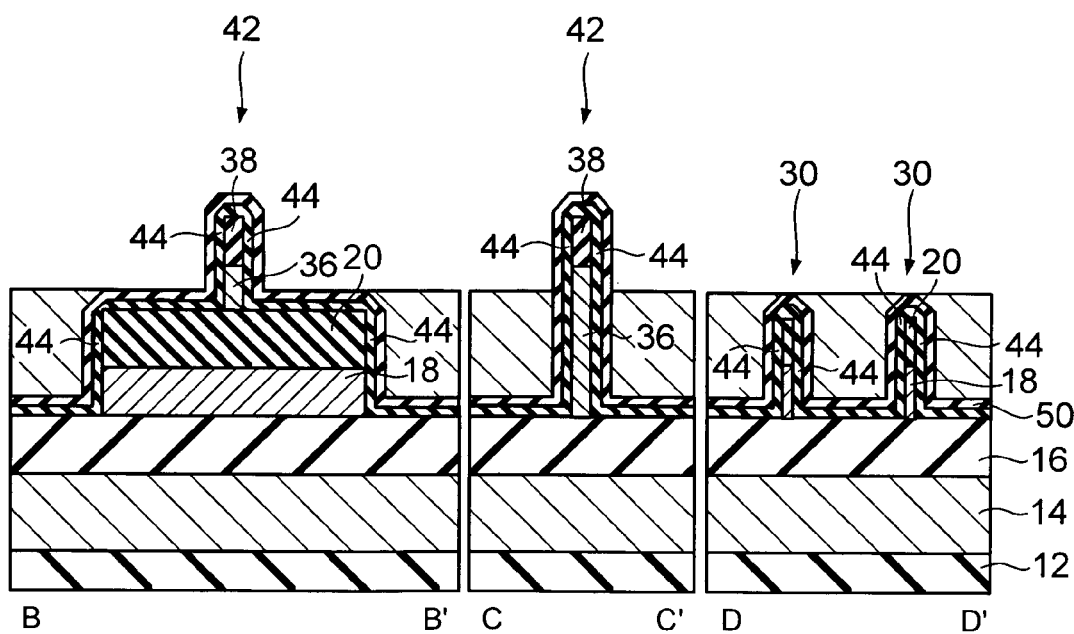
FIG. 71A, FIG. 71B, and FIG. 71C are cross sectional views in the third embodiment respectively corresponding to the line B–B', the line C–C', and the line D–D' in FIG. 6.
Figure 72:
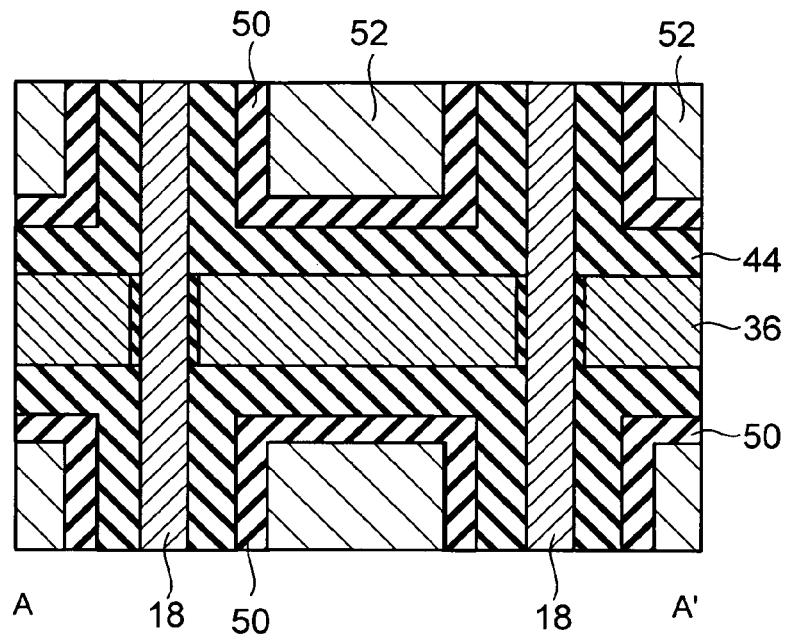
FIG. 72 is a cross sectional view in the third embodiment corresponding to the line A–A' in FIG. 6.
Figures 73A, 73B, 73C:
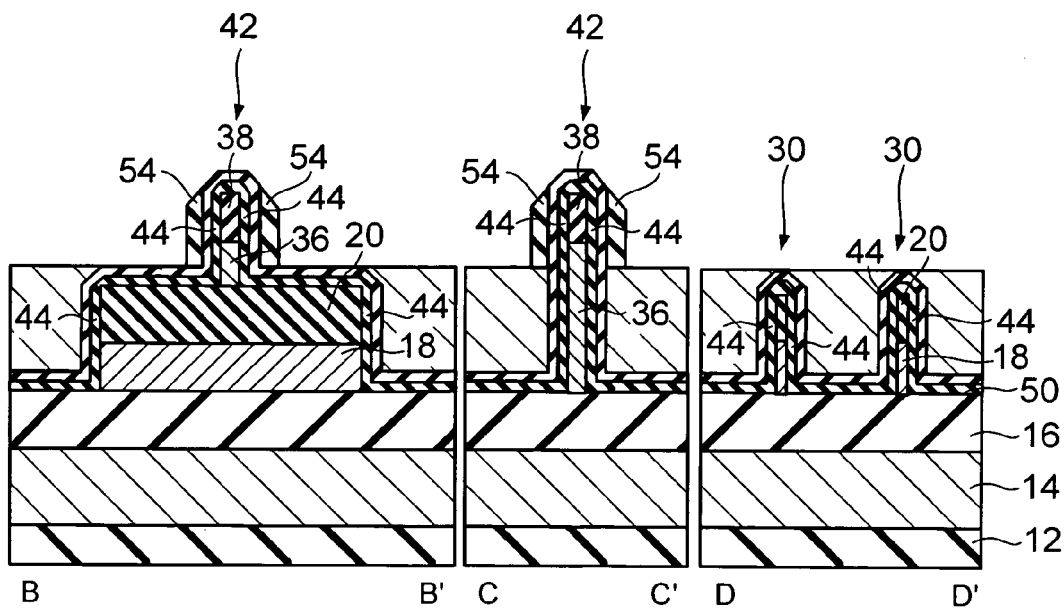
FIG. 73A, FIG. 73B, and FIG. 73C are cross sectional views in the third embodiment respectively corresponding to the line B–B', the line C–C', and the line D–D' in FIG. 6.
Figure 74:
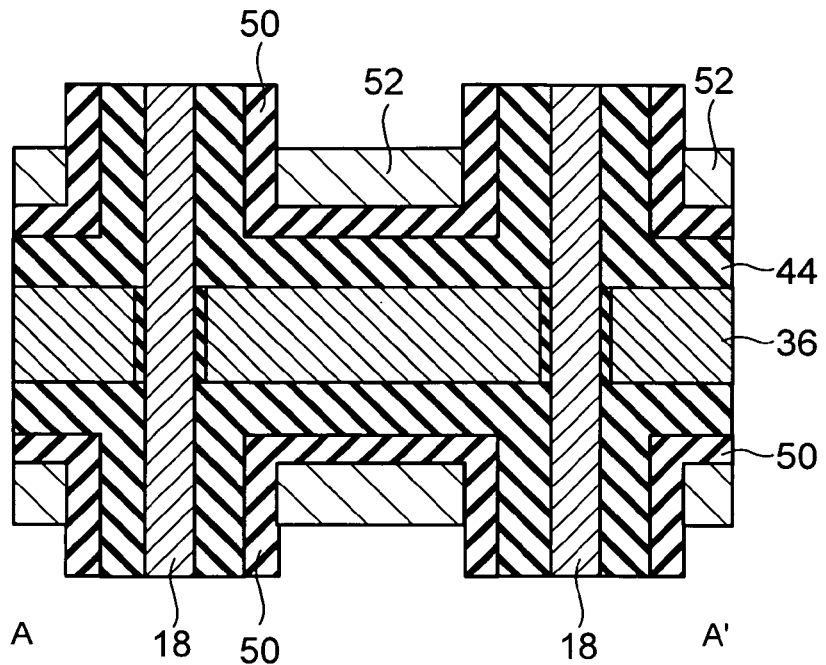
FIG. 74 is a cross sectional view in the third embodiment corresponding to the line A–A' in FIG. 6.
Figures 75A, 75B, 75C:
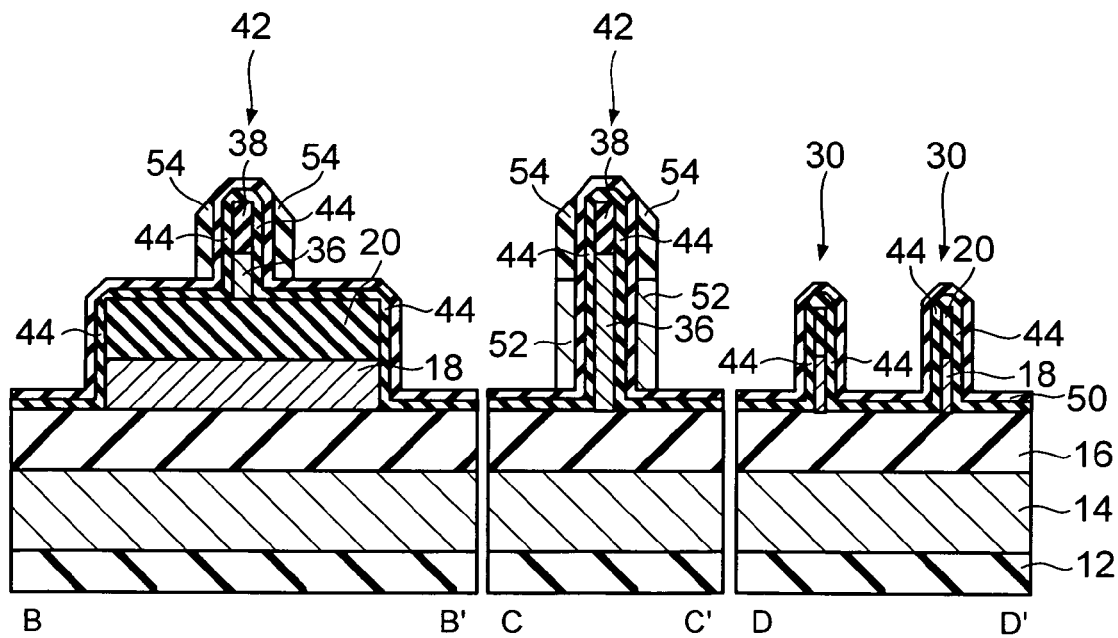
FIG. 75A, FIG. 75B, and FIG. 75C are cross sectional views in the third embodiment respectively corresponding to the line B–B', the line C–C', and the line D–D' in FIG. 6.
Figure 76:
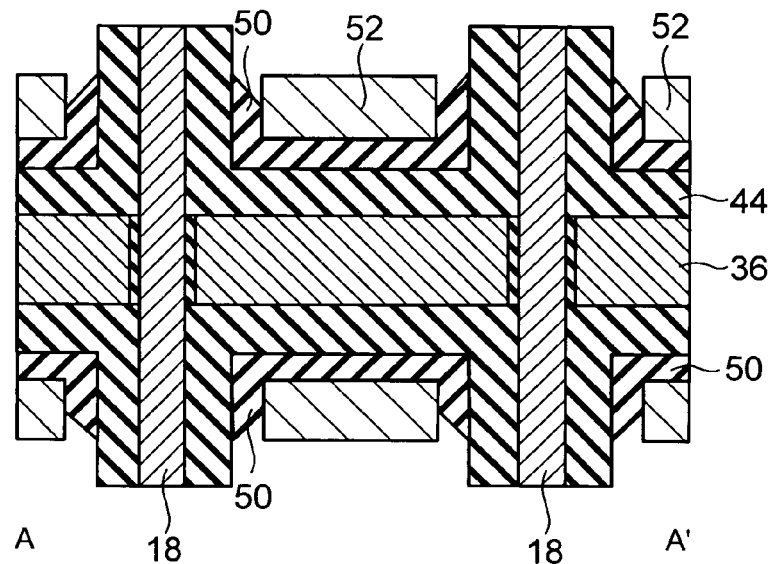
FIG. 76 is a cross sectional view in the third embodiment corresponding to the line A–A' in FIG. 6.
Figures 77A, 77B, 77C:
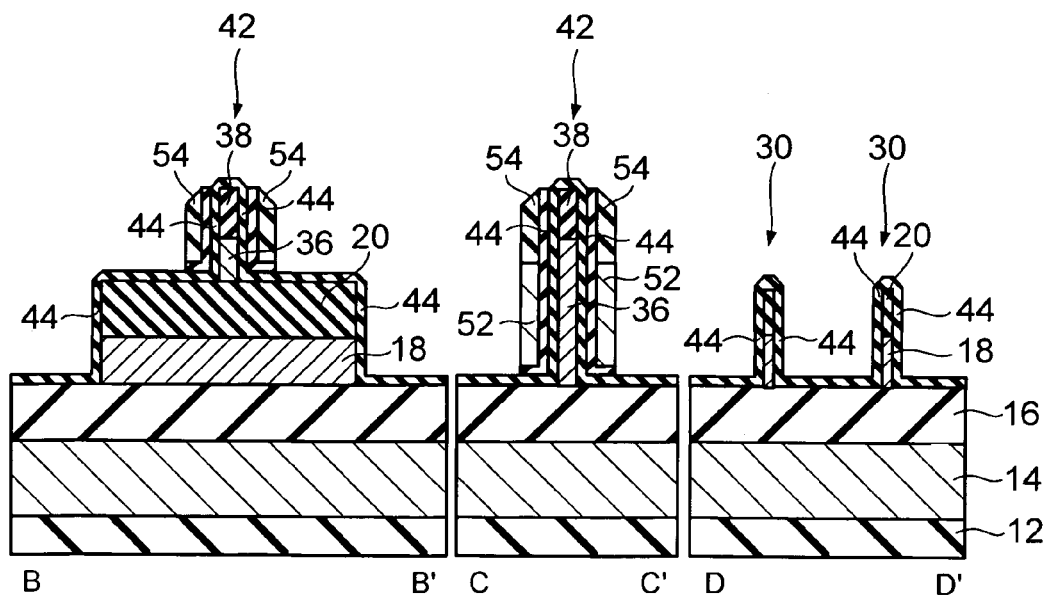
FIG. 77A, FIG. 77B, and FIG. 77C are cross sectional views in the third embodiment respectively corresponding to the line B–B', the line C–C', and the line D–D' in FIG. 6.
Figure 78:
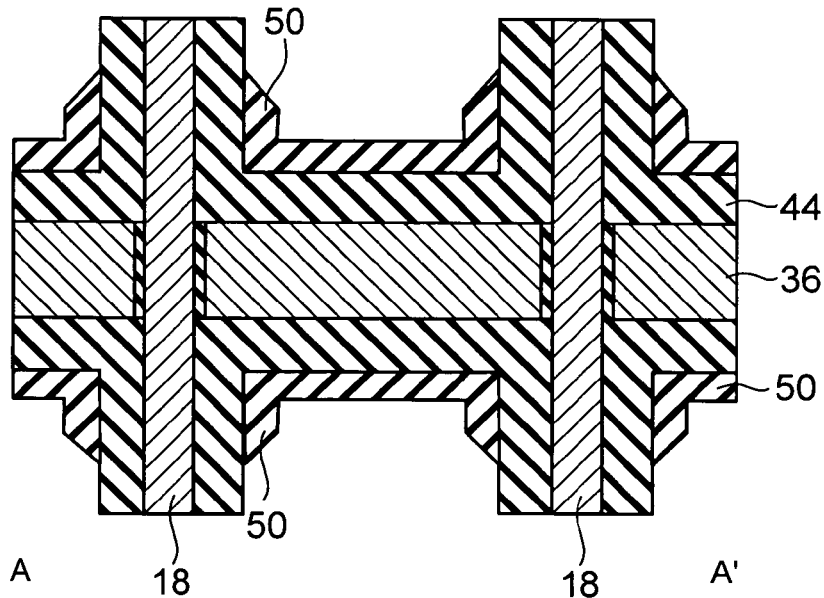
FIG. 78 is a cross sectional view in the third embodiment corresponding to the line A–A' in FIG. 6.
Figures 79A, 79B, 79C:
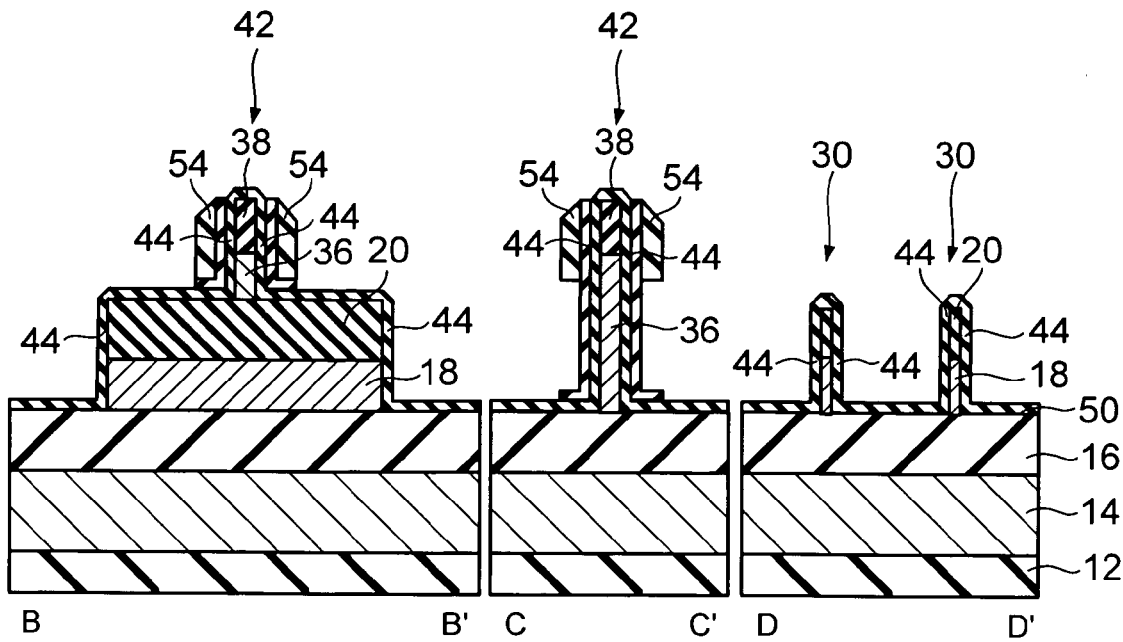
FIG. 79A, FIG. 79B, and FIG. 79C are cross sectional views in the third embodiment respectively corresponding to the line B–B', the line C–C', and the line D–D' in FIG. 6.
Figure 80:
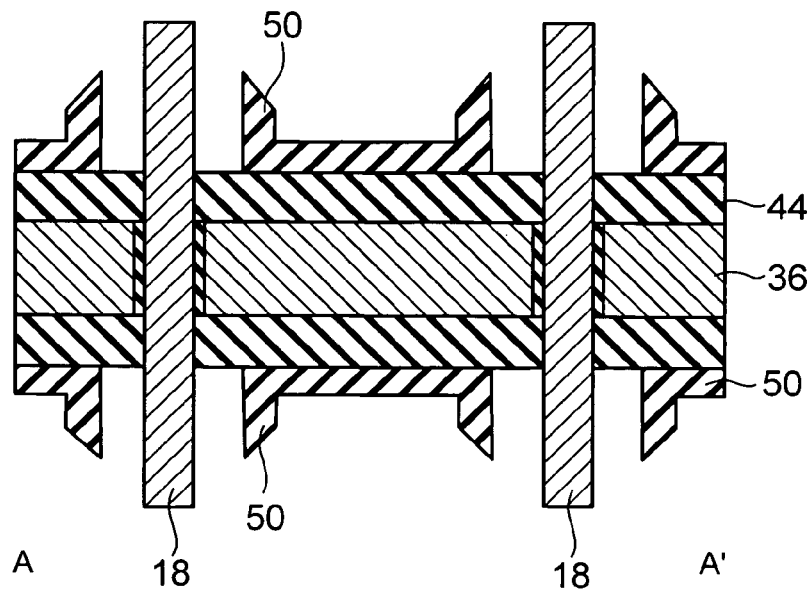
FIG. 80 is a cross sectional view in the third embodiment corresponding to the line A–A' in FIG. 6.
Figures 81A, 81B, 81C:
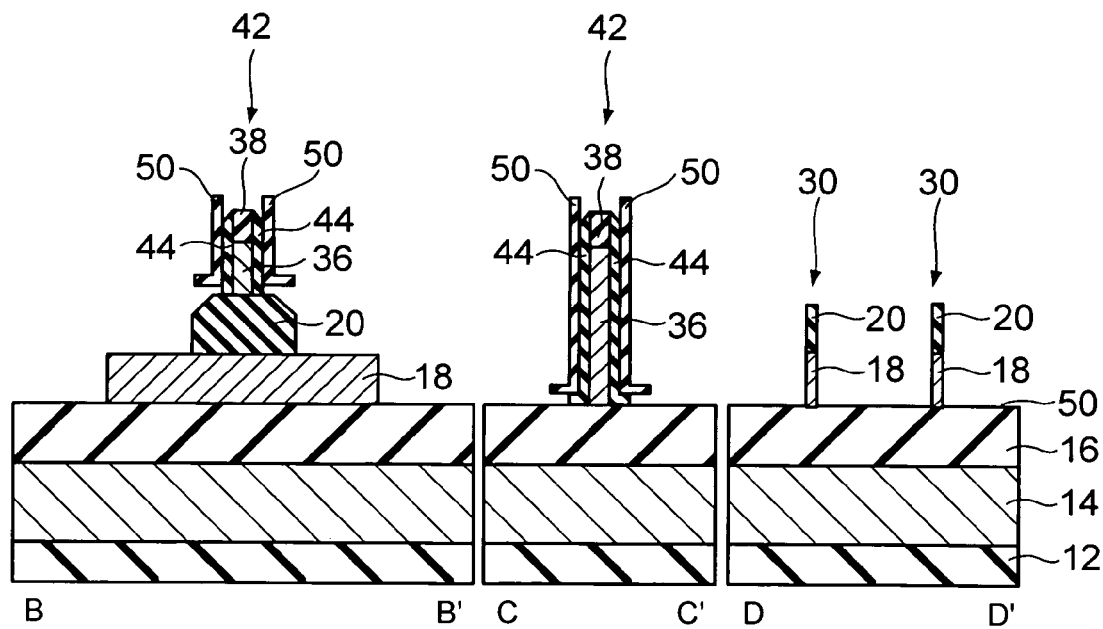
FIG. 81A, FIG. 81B, and FIG. 81C are cross sectional views in the third embodiment respectively corresponding to the line B–B', the line C–C', and the line D–D' in FIG. 6.
Figure 82:
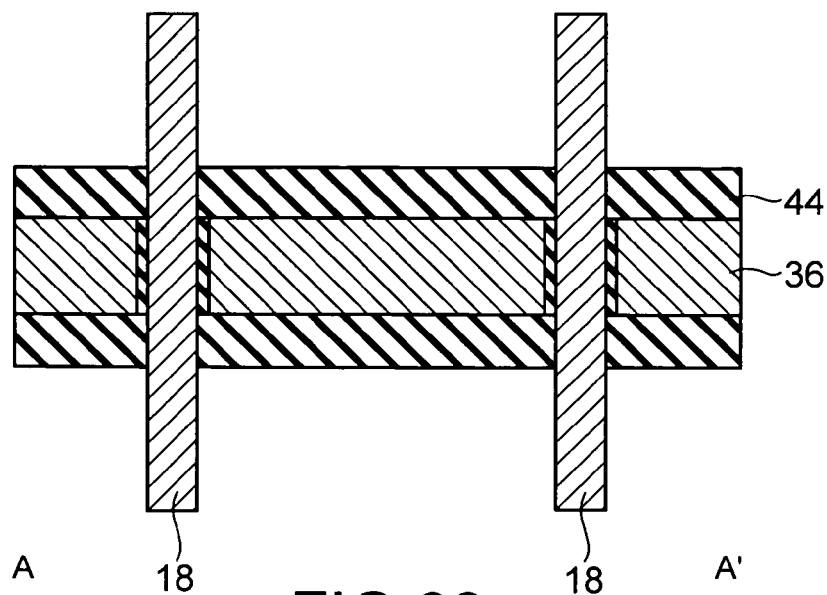
FIG. 82 is a cross sectional view in the third embodiment corresponding to the line A–A' in FIG. 6.
Figures 83A, 83B, 83C:
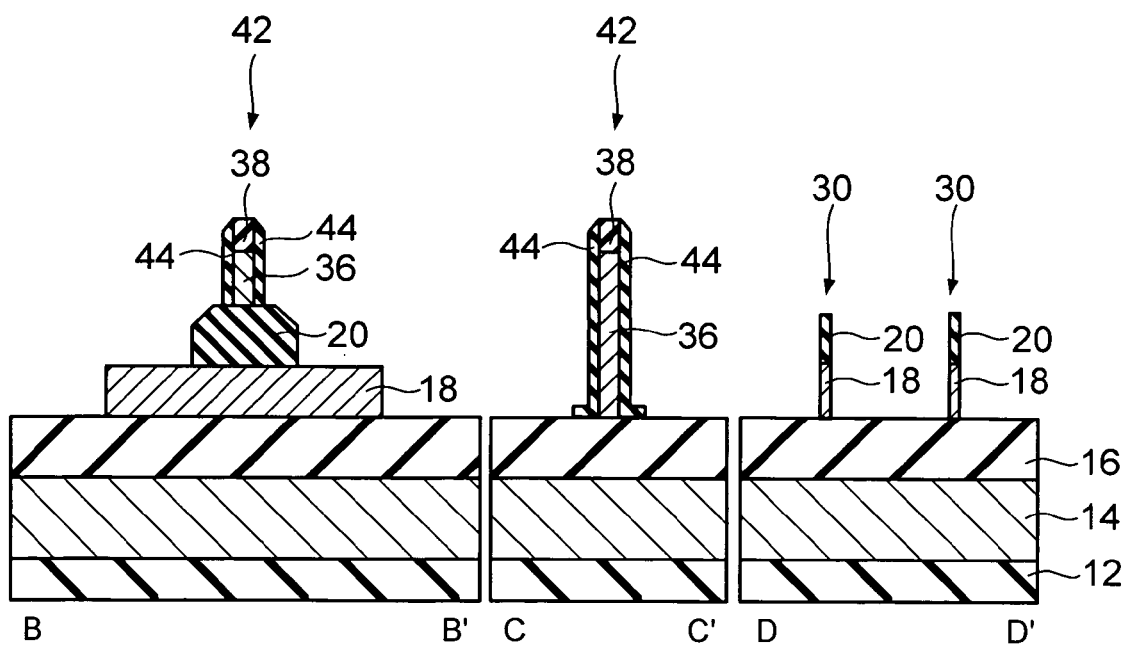
FIG. 83A, FIG. 83B, and FIG. 83C are cross sectional views in the third embodiment respectively corresponding to the line B–B', the line C–C', and the line D–D' in FIG. 6.

Thereafter, a surface of the silicon layer 18 composing the Fin is doped to form the source/drain regions, and silicidation is performed. Thus, a FinFET such as shown in FIG. 39 can be obtained. Namely, a source region S and a drain region D can be formed in the silicon layer 18 on both sides with the second protrusion 42 corresponding to the gate electrode as a center. A method of doping into the silicon layer 18 composing the Fin may be a tilted ion implantation method, plasma doping, or solid phase diffusion. As a silicide material, for example, NiSi can be used.

Then, an interlayer dielectric, is deposited by using TEOS or the like and planarized by CMP. Subsequently, contact holes leading to the source/drain regions are formed, and a wiring layer of Al/TiN/Ti or Cu/TiN/Ti is formed. By further performing a wiring forming process in a second and subsequent layers as needed, the semiconductor device is completed.

As described above, according to a manufacturing method of the semiconductor device of this embodiment, as shown in FIG. 27 to FIG. 29A to FIG. 29C, the sidewall consist of the polysilicon layer 52 and the SiN film 54 can be formed only on the side surface of the gate electrode. By using this sidewall to protect the SiN film 44 on the side surface of the gate electrode, it becomes possible to leave the SiN film 44 on the side surface of the gate electrode and not to leave the SiN film 44 on the side surfaces of the Fin. Therefore, doping and silicide application from the side surface of the silicon layer 18 composing the Fin become possible.

Accordingly, as shown in FIG. 39, it is possible to form the source region S and the drain region D uniformly in a depth direction of the Fin. Namely, an effective channel length L1 between the source region S and the drain region D in an upper portion of the Fin and an effective channel length L2 between the source region S and the drain region D in a lower portion of the Fin become equal. Further, sufficient doping and silicidation are performed from the side surface of the Fin, so that the series resistance can be reduced, which leads to an improvement in FET drive current.

Second Embodiment

Next, a manufacturing process of a semiconductor device according to the second embodiment will be explained based on FIG. 40 to FIG. 65A to FIG. 65C. Among these figures, FIG. 42, FIG. 45, FIG. 48, FIG. 51, FIG. 54, FIG. 57, FIG. 60, and FIG. 63 are bird's-eye views of the semiconductor device for explaining the manufacturing process of the semiconductor device according to this embodiment. FIG. 40, FIG. 43, FIG. 46, FIG. 49, FIG. 52, FIG. 55, FIG. 58, FIG. 61, and FIG. 64 are sectional views corresponding to the line A–A' of the semiconductor device in FIG. 6. FIG. 41A, FIG. 44A, FIG. 47A, FIG. 50A, FIG. 53A, FIG. 56A, FIG. 59A, FIG. 62A, and FIG. 65A are sectional views corresponding to the line B–B' of the semiconductor device in FIG. 6. FIG. 41B, FIG. 44B, FIG. 47B, FIG. 50B, FIG. 53B, FIG. 56B, FIG. 59B, FIG. 62B, and FIG. 65B are sectional views corresponding to the line C–C' of the semiconductor device in FIG. 6. FIG. 41C, FIG. 44C, FIG. 47C, FIG. 50C, FIG. 53C, FIG. 56C, FIG. 59C, FIG. 62C, and FIG. 65C are sectional views corresponding to the line D–D' in FIG. 6.

In the manufacturing process of the semiconductor device according to this embodiment, the process up to FIG. 13 and FIG. 14A to FIG. 14C is the same as that in the aforementioned first embodiment. After these FIG. 13 and FIG. 14A to FIG. 14C, in this embodiment, as shown in FIG. 40 and FIG. 41A to FIG. 41C, by etching the silicon oxide film 50 by RIE, third sidewalls are formed, and the silicon oxide film 16 is etched by RIE. Namely, the silicon oxide film 50 is left on the side surface of the SiN film 44 on the side surface of the gate electrode and the side surface of the SiN film 44 on the side surface of the Fin to form the third sidewalls.

Here, the silicon oxide film 16 is etched in order to avoid the silicon oxide film 50 from being left at corner portions between the silicon oxide film 50 and the silicon oxide film 16 when the silicon oxide film 50 is removed by wet etching. The process margin of the depth to which the silicon oxide film 16 is etched is wider than the case where the silicon oxide film 16 is etched while the SiN film 44 is being etched, but it is preferably about 5 nm.

Then, as shown in FIG. 42, FIG. 43, and FIG. 44A to FIG. 44C, the polysilicon layer 52 is formed, for example, with a thickness of 350 nm. This polysilicon layer 52, similarly to the aforementioned polysilicon layer 32, can be deposited, for example, under the condition of 1 Torr and 620° C. in the mixed gas of $SiH_4$, $N_2$, and $H_2$. Subsequently, the polysilicon layer 52 is planarized by CMP and etched back until the top of the SiN hard mask 38 on the gate electrode is exposed.

Thereafter, as shown in FIG. 45, FIG. 46, and FIG. 47A to FIG. 47C, the polysilicon layer 52 is etched back until just before the top of the SiN hard mask 20 on the Fin is exposed. In this etch back, the polysilicon layer 52 may be left on the SiN hard mask 20 within the thickness of about 30 nm. Or, the polysilicon layer 52 may be etched approximately 20 nm lower than the top of the SiN hard mask 20. This polysilicon layer 52 corresponds to a first film in this embodiment.

Then, as shown in FIG. 48, FIG. 49, and FIG. 50A to FIG. 50C, the SiN film 54 is formed overall, for example, with a thickness of 15 nm. This SiN film 54 is formed, for example, in the same manner as above, at 10 Torr and 750° C. in the atmosphere of dichlorosilane $SiH_2Cl_2$ and ammonia $NH_3$.

Subsequently, by etching back the SiN film 54, the SiN film 54 is left as a mask portion on the side surface of the silicon oxide film 50 on the side surface of the gate electrode.

Thereafter, as shown in FIG. 51, FIG. 52, and FIG. 53A to FIG. 53C, the polysilicon layer 52 is etched by RIE using the SiN film 54 as a mask. The region of the polysilicon layer 52 located under the SiN film 54 is left on the side surface of the silicon oxide film 50 on the side surface of the gate electrode. A second sidewall is formed by the SiN film 54 and the polysilicon layer 52.

Then, as shown in FIG. 54, FIG. 55, and FIG. 56A to FIG. 56C, the silicon oxide film 50 is removed by wet etching (for example, dilute hydrofluoric acid (DHF)). In this wet etching, due to the SiN film 54 and the silicon layer 52 the silicon oxide film 50 on the side surface of the gate electrode is not removed.

Subsequently, as shown in FIG. 57, FIG. 58, and FIG. 59A to FIG. 59C, the polysilicon layer 52 is removed by CDE.

Thereafter, as shown in FIG. 60, FIG. 61, and FIG. 62A to FIG. 62C, the SiN film 44 on the side surface of the Fin is removed by the solution containing $H_3PO_4$. In this embodiment, by forming the SiN film 44 at a lower temperature than the SiN film 20, 38, the rate of etching of the SiN film 44 by the solution containing $H_3PO_4$ is higher than those of the SiN film 20, 38. This can avoid the SiN film 44 from being left at corner of the silicon layer 18 and the SiN film 44, and make the SiN film 44 at the corner relatively flat. Moreover, by forming the depth of the silicon oxide film 50 more deeply in a Fin direction, the SiN film 44 at the corner can be made more effectively flat. This is for the following reason. As shown by the dotted lines in FIG. 34, at an early stage, the SiN film 44 has a shape of trailing from the silicon oxide film 50 side to the silicon layer 18 side, but when the SiN film 44 is etched by the solution containing $H_3PO_4$, the etching agent has more difficulty in getting in as it goes deeper, whereby the SiN film 44 on the silicon oxide film 50 side is etched slower than the SiN film 44 on the silicon layer 18 side. Hence, it is thought theoretically that if the depth of the silicon oxide film 50 becomes deeper, the SiN film 44 etched by the solution containing $H_3PO_4$ becomes gradually flatter.

Then, as shown in FIG. 63, FIG. 64, and FIG. 65A to FIG. 65C, the silicon oxide film 50 is removed by peeling it off with the dilute hydrofluoric acid (DHF). The process thereafter is the same as that in the aforementioned first embodiment.

As described above, according to a manufacturing method of the semiconductor device of this embodiment, the sidewall consist of the polysilicon layer 52 and the SiN film 54 can be formed only on the side surface of the gate electrode. By using this sidewall to protect the SiN film 44 on the side surface of the gate electrode, it becomes possible to leave the SiN film 44 on the side surface of the gate electrode and not to leave the SiN film 44 on the side surfaces of the Fin. Therefore, doping and silicide application from the side surface of the silicon layer 18 composing the Fin become possible.

Further, after the silicon oxide film 50 is etched, the silicon oxide film 16 is dug down, which can avoid the silicon oxide film 50 from being left at the corner portions between the silicon oxide film 50 and the silicon oxide film 16 when the silicon oxide film 50 is removed by etching.

Third Embodiment

Next, a manufacturing process of a semiconductor device according to the third embodiment will be explained based on FIG. 66 to FIG. 83A to FIG. 83C. Among these figures, FIG. 66, FIG. 68, FIG. 70, FIG. 72, FIG. 74, FIG. 76, FIG. 78, FIG. 80, and FIG. 82 are sectional views corresponding to the line A–A' of the semiconductor device in FIG. 6. FIG. 67A, FIG. 69A, FIG. 71A, FIG. 73A, FIG. 75A, FIG. 77A, FIG. 79A, FIG. 81A, and FIG. 83A are sectional views corresponding to the line B–B' of the semiconductor device in FIG. 6. FIG. 67B, FIG. 69B, FIG. 71B, FIG. 73B, FIG. 75B, FIG. 77B, FIG. 79B, FIG. 81B, and FIG. 83B are sectional views corresponding to the line C–C' of the semiconductor device in FIG. 6. FIG. 67C, FIG. 69C, FIG. 71C, FIG. 73C, FIG. 75C, FIG. 77C, FIG. 79C, FIG. 81C, and FIG. 83C are sectional views corresponding to the line D–D' in FIG. 6.

In the manufacturing process of the semiconductor device according to this embodiment, the process up to FIG. 9 and FIG. 10A to FIG. 10C is the same as that in the aforementioned first embodiment. After these FIG. 9 and FIG. 10A to FIG. 10C, in this embodiment, as shown in FIG. 66 and FIG. 67A to FIG. 67C, the silicon oxide film 50, for example, with a thickness of 5 nm is formed on the SiN film 44. Namely, the silicon oxide film 50 as an additional film is formed without etching of the SiN film 44 unlike first and second embodiments. Moreover, in this embodiment, etching of this silicon oxide film 50 is not also performed. Consequently, the number of steps in the manufacturing process is reduced.

Then, as shown in FIG. 68 and FIG. 69A to FIG. 69C, the polysilicon layer 52 is formed, for example, with a thickness of 350 nm on the silicon oxide film 50. This polysilicon layer 52, similarly to the aforementioned polysilicon layer 32, can be deposited under the condition of 1 Torr and 620° C. in the mixed gas of $SiH_4$, $N_2$, and $H_2$. Subsequently, the polysilicon layer 52 is planarized by CMP and etched back until the top of the SiN hard mask 38 on the gate electrode is exposed.

Thereafter, as shown in FIG. 70 and FIG. 71A to FIG. 71C, the polysilicon layer 52 is etched back until just before the top of the SiN hard mask 20 on the Fin is exposed. In this etch back, the polysilicon layer 52 may be left on the SiN hard mask 20 within thickness of about 30 nm. Or, the polysilicon layer 52 may be etched approximately 20 nm lower than the top of the SiN hard mask 20. This polysilicon layer 52 corresponds to a first film in this embodiment.

Then, as shown in FIG. 72 and FIG. 73A to FIG. 73C, the SiN film 54 is formed overall, for example, with a thickness of 15 nm. This SiN film 54 is formed, for example, in the same manner as above, at 10 Torr and 750° C. in the atmosphere of dichlorosilane $SiH_2Cl_2$ and ammonia $NH_3$. Subsequently, by etching back the SiN film 54, the SiN film 54 is left as a mask portion on the side surface of the silicon oxide film 50 on the side surface of the gate electrode.

Thereafter, as shown in FIG. 74 and FIG. 75A to FIG. 75C, the polysilicon layer 52 is etched by RIE using the SiN film 54 as a mask. The region of the polysilicon layer 52 located under the SiN film 54 is left on the side surface of the silicon oxide film 50 on the side surface of the gate electrode. A second sidewall is formed by the SiN film 54 and the polysilicon layer 52.

Then, as shown in FIG. 76 and FIG. 77A to FIG. 77C, the silicon oxide film 50 is removed by wet etching (for example, dilute hydrofluoric acid (DHF)). In this wet etching, due to the SiN film 54 and the silicon layer 52 the silicon oxide film 50 on the side surface of the gate electrode is not removed.

Subsequently, as shown in FIG. 78 and FIG. 79A to FIG. 79C, the polysilicon layer 52 is removed by CDE.

Thereafter, as shown in FIG. 80 and FIG. 81A to FIG. 81C, the SiN film 44 on the side surface of the Fin is removed by the solution containing $H_3PO_4$. In this embodiment, by forming the SiN film 44 at a lower temperature than the SiN film 20, 38, the rate of etching of the SiN film 44 by the solution containing $H_3PO_4$ is higher than those of the SiN film 20, 38. This can avoid the SiN film 44 from being left at corner of the silicon layer 18 and the SiN film 44, and make the SiN film 44 at the corner relatively flat. Moreover, by forming the depth of the silicon oxide film 50 more deeply in a Fin direction, the SiN film 44 at the corner can be made more effectively flat. This is for the following reason. As shown by the dotted lines in FIG. 34, at an early stage, the SiN film 44 has a shape of trailing from the silicon oxide film 50 side to the silicon layer 18 side, but when the SiN film 44 is etched by the solution containing $H_3PO_4$, the etching agent has more difficulty in getting in as it goes deeper, whereby the SiN film 44 on the silicon oxide film 50 side is etched slower than the SiN film 44 on the silicon layer 18 side. Hence, it is thought theoretically that if the depth of the silicon oxide film 50 becomes deeper, the SiN film 44 etched by the solution containing $H_3PO_4$ becomes gradually flatter.

Then, as shown in FIG. 82, and FIG. 83A to FIG. 83C, the silicon oxide film 50 is removed by peeling it off with the dilute hydrofluoric acid (DHF).

Subsequently, the surface side of the silicon layer 18 composing the Fin is doped to form the source/drain regions, and silicidation is performed. Thus, the FinFET such as shown in FIG. 39 can be obtained. A method of doping into the silicon layer 18 composing the Fin may be a tilted ion implantation method, plasma doping, or solid phase diffusion. As a silicide material, for example, NiSi can be used.

Thereafter, an interlayer dielectric is deposited by using TEOS or the like and planarized by CMP. Then, contact holes leading to the source/drain regions are formed, and a wiring layer of Al/TiN/Ti or Cu/TiN/Ti is formed. By further performing a wiring forming process in the second and subsequent layers as needed, the semiconductor device is completed.

As described above, according to a manufacturing method of the semiconductor device of this embodiment, the sidewall consist of the polysilicon layer 52 and the SiN film 54 can be formed only on the side surface of the gate electrode. By using this sidewall to protect the SiN film 44 on the side surface of the gate electrode, it becomes possible to leave the SiN film 44 on the side surface of the gate electrode and not to leave the SiN film 44 on the side surfaces of the Fin. Therefore, doping and silicide application from the side surface of the silicon layer 18 composing the Fin become possible.

Further, in this embodiment, as shown in FIG. 66 and FIG. 67A to FIG. 67C, the polysilicon layer 52 is formed without the SiN film 44 and the silicon oxide film 40 being etched, which enables a reduction in the number of steps in the manufacturing process.

Fourth Embodiment

Figure 84:
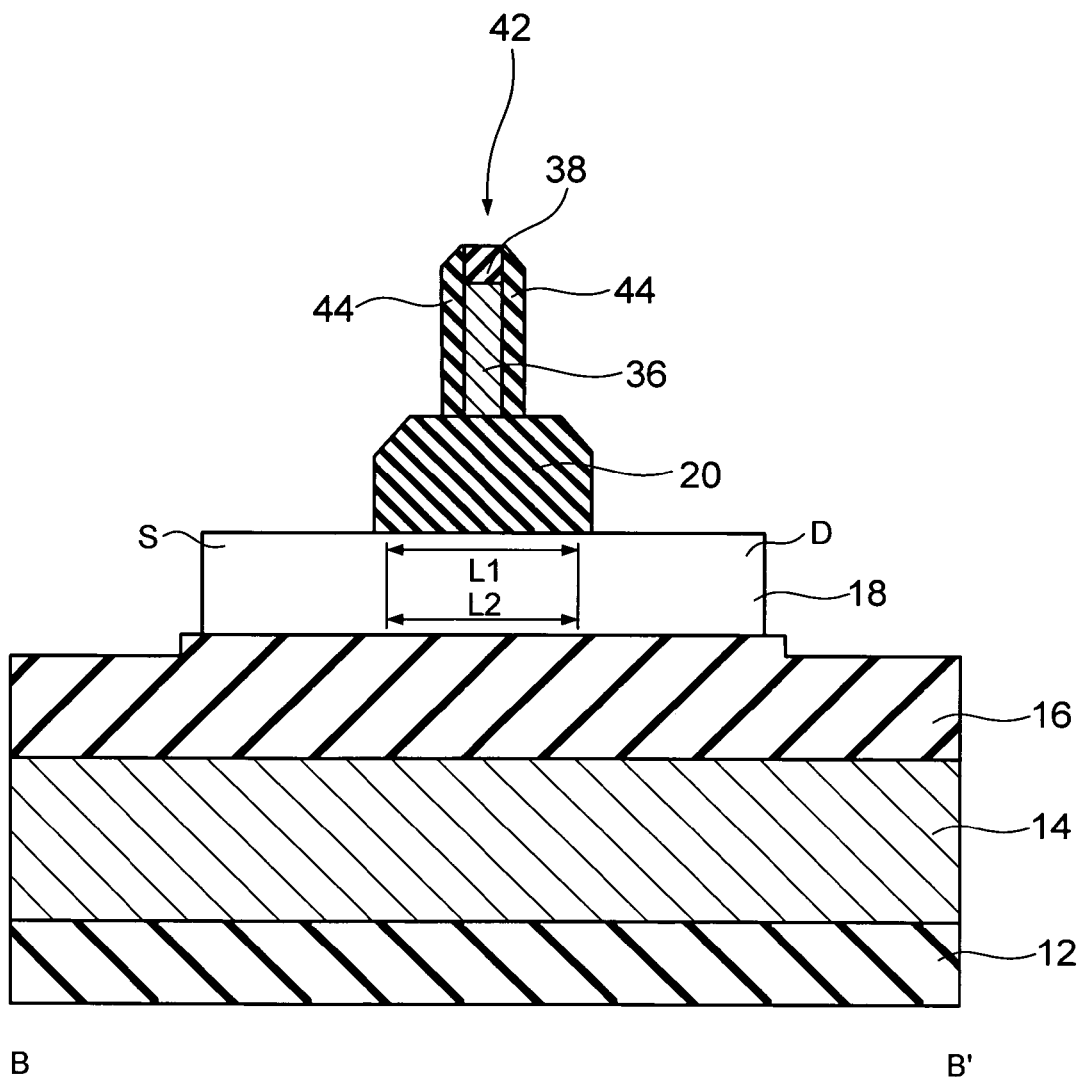
FIG. 84 is a sectional view for explaining a manufacturing process of a semiconductor device according to a fourth embodiment.

FIG. 84 is a sectional view for explaining a manufacturing method of a semiconductor device according to the fourth embodiment, and corresponds to FIG. 39 in the aforementioned first embodiment.

A manufacturing process up to this FIG. 84 may be that of any of the aforementioned first embodiment to third embodiment. In this embodiment, silicidation is only performed to the source region S and the drain region D in the silicon layer 18 without doping and impurity diffusion. Namely, a FinFET with a Schottky junction source/drain structure is formed.

As described above, in this embodiment, no sidewall is formed on the side surface of the silicon layer 18 corresponding to the Fin, so that silicidation can be formed from the side surface of the Fin, and consequently, Schottky source/drain are formed uniformly in the depth direction of the Fin. Namely, the effective channel length L1 between the source region S and the drain region D in the upper portion of the Fin and the effective channel length L2 between the source region S and the drain region D in the lower portion of the Fin become equal. Further, the low-resistance silicide is formed in the lower portion of the Fin, so that the series resistance can be reduced, which leads to an improvement in FET drive current.

Incidentally, it is desirable to use a material with a low Schottky barrier for the source region S and the drain region D in order to reduce a Schottky contact resistance. For example, it is suitable to use ErSi for an n-channel FET, and it is suitable to use PtSi for a p-channel FET.s Fifth Embodiment FIG. 85 is a sectional view for explaining a manufacturing method of a semiconductor device according to the fifth embodiment, and corresponds to FIG. 36 in the aforementioned first embodiment.

Figure 85:
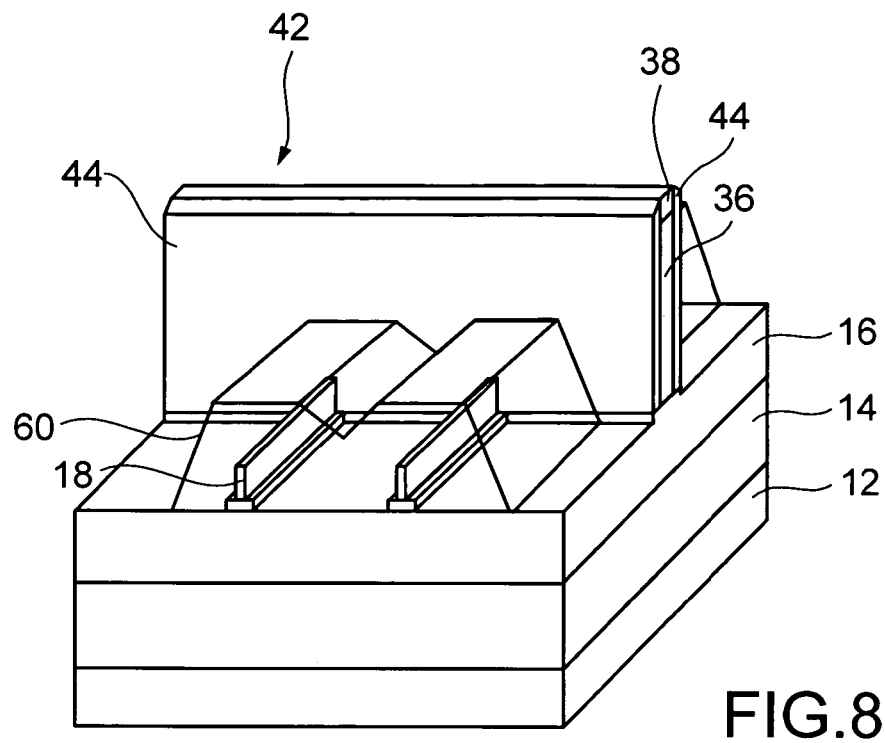
FIG. 85 is a bird's-eye view for explaining a manufacturing process of a semiconductor device according to a fifth embodiment.

A manufacturing process up to this FIG. 85 may be that of any of the aforementioned first embodiment to third embodiment. In this embodiment, the SiN hard mask 20 formed on the silicon layer 18 corresponding to the Fin is removed.

Then, after the source region S and the drain region D are formed in the silicon layer 18 corresponding to the Fin, a silicon layer 60 is formed, for example, by epitaxial growth to elevate source/drain region. In this embodiment, since an upper surface and both side surfaces of the silicon layer 18 corresponding to the Fin are exposed, the silicon layer 60 can be formed on the upper surface and both the side surfaces of the Fin by epitaxial growth. After this silicon layer 60 is formed, impurity ions may be implanted unless Schottky source/drain mentioned in the fourth embodiment is applied.

As just described, according to the manufacturing method of the semiconductor device of this embodiment, no sidewall is formed on the side surface of the silicon layer 18 corresponding to the Fin, so that the upper surface and both the side surfaces of the silicon layer 18 can be exposed. Hence, the silicon layer 60 can be formed on the upper surface and both the side surfaces of the silicon layer 18 by epitaxial growth, whereby the series resistance of the source region S and the drain region D can be reduced, which leads to an improvement in drive current.

Sixth Embodiment

Figure 36:
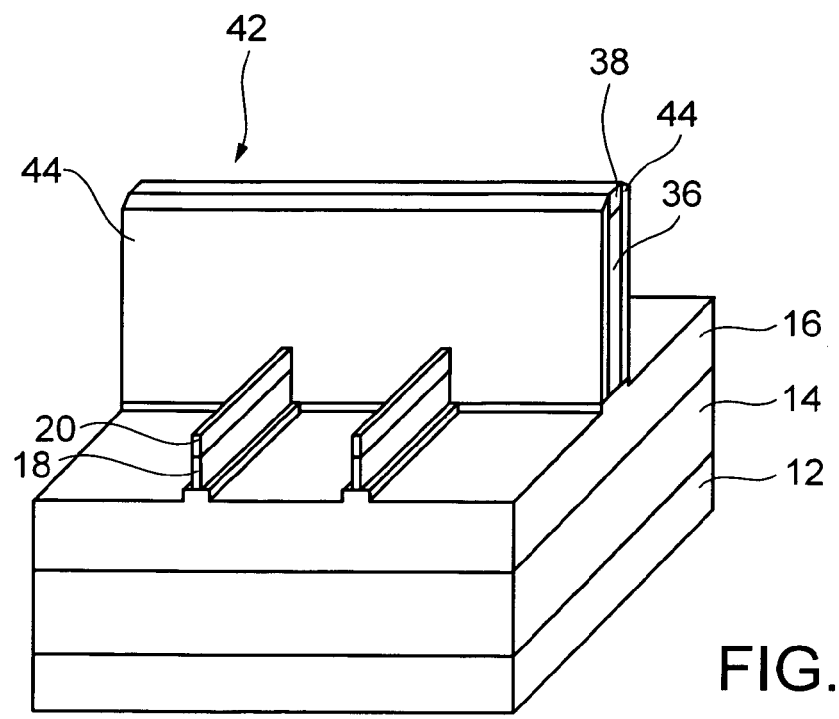
FIG. 36 is a bird's-eye view for explaining the manufacturing process of the semiconductor device according to the first embodiment.
Figure 37:
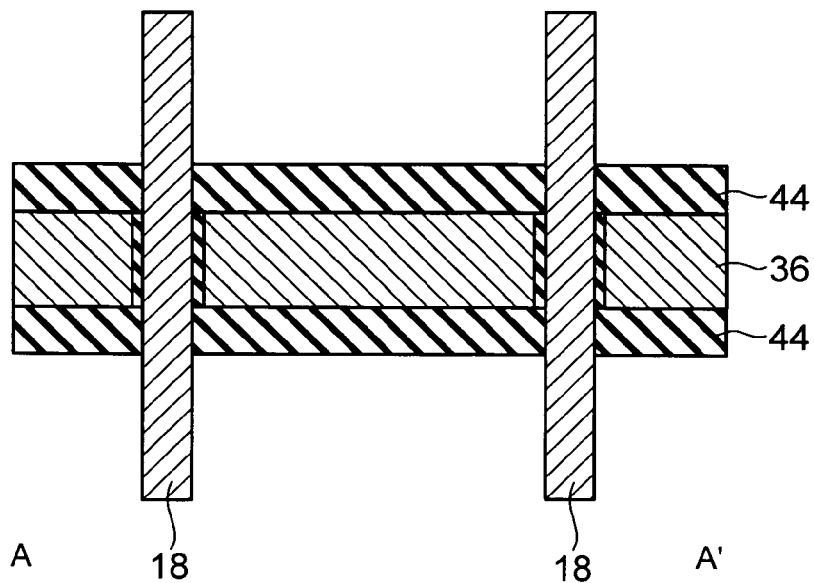
FIG. 37 is a cross sectional view corresponding to the line A–A' in FIG. 6.
Figures 38A, 38B, 38C:
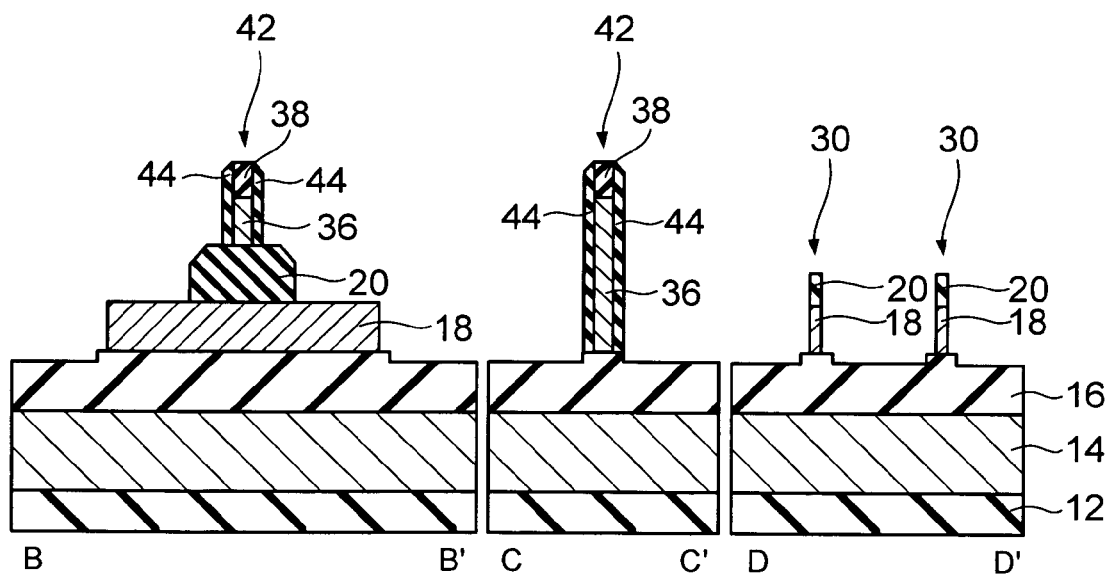
FIG. 38A, FIG. 38B, and FIG. 38C are cross sectional views respectively corresponding to the line B–B', the line C–C', and the line D–D' in FIG. 6.
Figure 86:
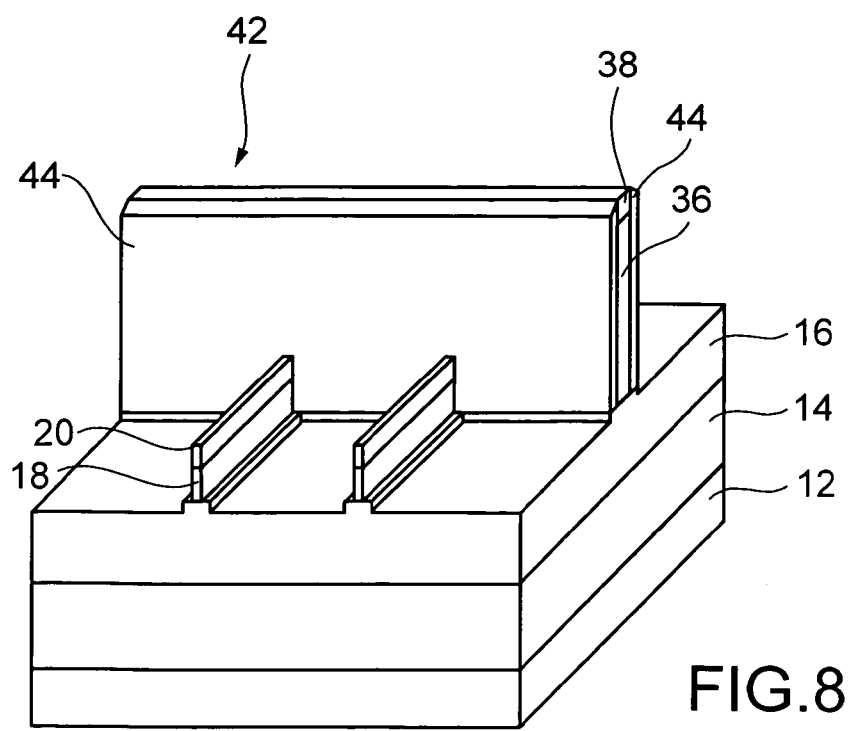
FIG. 86 is a bird's-eye view for explaining a manufacturing process of a semiconductor device according to a sixth embodiment.
Figure 87:
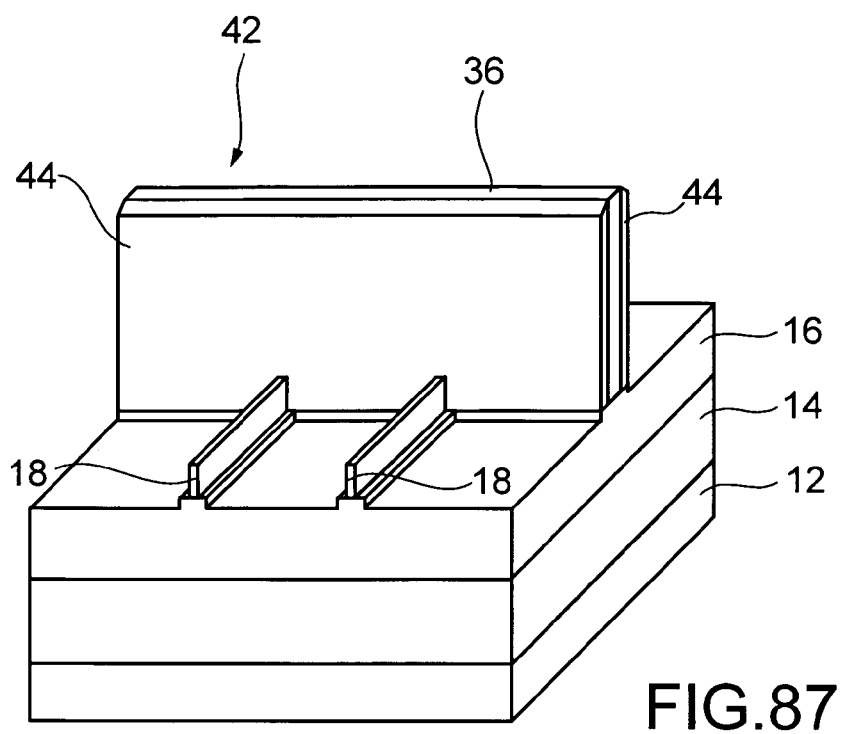
FIG. 87 is a bird's-eye view for explaining the manufacturing process of the semiconductor device according to the sixth embodiment.

FIG. 86 and FIG. 87 are sectional views for explaining a manufacturing method of a semiconductor device according to the sixth embodiment, and correspond to FIG. 36 in the aforementioned first embodiment.

A manufacturing process up to this FIG. 86 may be that of any of the aforementioned first embodiment to third embodiment. In this embodiment, the SiN hard mask 20 formed on the silicon layer 18 composing the Fin and the SiN hard mask 38 formed on the polysilicon layer 36 corresponding to the gate electrode are removed by etching by RIE.

Then, as shown in FIG. 87, an impurity diffusion layer is formed on the silicon layer 18 composing the Fin by doping to form the source/drain regions.

Figure 88:
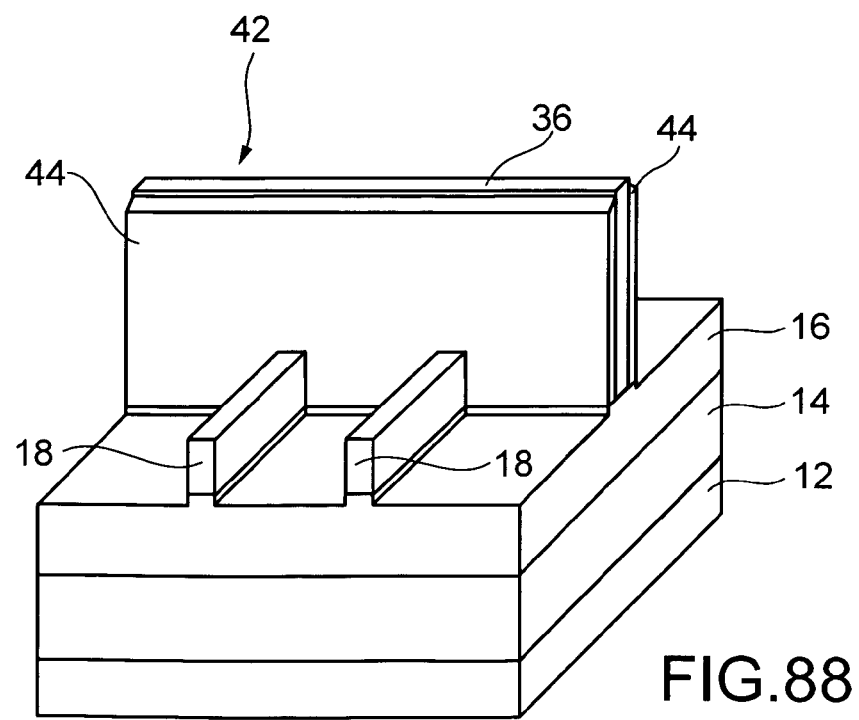
FIG. 88 is a bird's-eye view for explaining the manufacturing process of the semiconductor device according to the sixth embodiment.

Thereafter, as shown in FIG. 88, NiSi is formed, and the silicon layer 18 and the polysilicon layer 36 are all silicided to form a metal gate and metal source/drain.

As just described, according to the manufacturing method of the semiconductor device of this embodiment, no sidewall is formed on the side surface of the silicon layer 18 composing the Fin, whereby silicide can be formed on the upper surface and both the side surfaces of the silicon layer 18. Therefore, the series resistance of the source region S and the drain region D is reduced, which improves drive current.

Moreover, the threshold voltage of a FET with a narrow Fin is lower due to fully depleted region. The fully silicided gate compensates the lowering of the threshold voltage and realize the low off-current FET.

It should be mentioned that the present invention is not limited to the aforementioned embodiments, and various changes may be made therein. For example, when the silicon oxide film 50 is formed in FIG. 13 and FIG. 14A to FIG. 14C, the silicon oxide film 50 may be formed by a CVD method using an organic, halogen-based, or hydrogen compound-based material other than TEOS as a material for silicon. Examples of the organic material are BTBAS ($SiH_2[N\{C(CH_3)_3\}_2]$) and TDMAS ($Si[N(CH_3)_2]_2$), examples of the halogen-based material are $SiH_2Cl_2$, $SiCl_4$, $Si_2Cl_6$, and $SiF_4$, and an example of the hydrogen compound-based material is $SiH_4$. Moreover, as the atmosphere, a simple substance gas or a mixed gas selected from $O_2$, $H_2O$, $N_2O$, and so on can be used appropriately according to the material, the deposition temperature, and so on.

Alternatively, in FIG. 13 and FIG. 14A to FIG. 14C, the silicon oxide film 50 may be formed by an ALD method using TEOS and $H_2O$. As the material for silicon, as described above, the organic, halogen-based, or hydrogen compound-based material other than TEOS can be used. As an oxidizing agent, in place of $H_2O$, $O_2$, $O_3$, $H_2O_2$, $N_2O$, or the like may be used. By forming the silicon oxide film 50 by this method, the silicon oxide film 50 can be deposited more uniformly on the side surface of the Fin and the side surface of the gate electrode than by the usual CVD method.

Further, in FIG. 15 to FIG. 17A to FIG. 17C, using amorphous silicon in place of polysilicon, the amorphous silicon layer 52 may be formed. This amorphous silicon layer 52 can be obtained by being deposited at 1 Torr and 550° C. in the atmosphere of $SiH_4$, $H_2$, and $N_2$. Furthermore, in FIG. 24 to FIG. 26A to FIG. 26C, in situ doping of P or As can raise an etching ratio of the silicon layer 52 to the SiN film 54 and the silicon oxide film 50 when the amorphous silicon layer 52 is etched by RIE or the other methods.

Additionally, in the aforementioned embodiments, the present invention is explained with the FinFET as an example of the semiconductor device, but the present invention is also applicable to other semiconductor devices including a first protrusion and a second protrusion higher than the first protrusion.

What is claimed is:

1. A manufacturing method of a semiconductor device, comprising:
   forming a first protrusion;
   forming a second protrusion which is higher than the first protrusion;
   forming a first sidewall on a side surface of the second protrusion;

forming a first film so that a surface of the first film is located lower than the second protrusion;

forming a mask on a side surface of the first sidewall on a side surface of the second protrusion which protrudes from the surface of the first film; and etching the first film with the mask so as to form a second sidewall on the side surface of the first sidewall on the side surface of the second protrusion but not to form the second sidewall on a side surface of the first protrusion, the second sidewall being formed of the mask and the first film, wherein the forming the mask comprises:

forming a second film on the first film and the second protrusion which protrudes from the surface of the first film; and etching back the second film so as to leave the second film on the side surface of the first sidewall on the side surface of the second protrusion, and the left second film as the mask.

2. The manufacturing method of the semiconductor device according to claim 1, wherein the second protrusion is a gate electrode, and the first protrusion is a projected semiconductor.

3. The manufacturing method of the semiconductor device according to claim 1, wherein in the forming the first sidewall on the side surface of the second protrusion, the first sidewall is formed also on the side surface of the first protrusion.

4. The manufacturing method of the semiconductor device according to claim 3, further comprising removing the first sidewall formed on the side surface of the first protrusion by etching.

5. The manufacturing method of the semiconductor device according to claim 4, wherein in an etching process performed later, the second sidewall protects the first sidewall, so that the first sidewall formed on the side surface of the second protrusion is not etched.

6. The manufacturing method of the semiconductor device according to claim 5, further comprising forming a source region and a drain region on both sides of the second protrusion which is a gate electrode by doping from the side surface of the first protrusion which is a projected semiconductor.

7. The manufacturing method of the semiconductor device according to claim 6, further comprising performing a process for the projected semiconductor from the side surface of the first protrusion which is the projected semiconductor.

8. The manufacturing method of the semiconductor device according to claim 6, wherein the projected semiconductor is a silicon layer, the manufacturing method of the semiconductor device, further comprising forming the silicon layer which elevates the source region and the drain region by epitaxial growth on an upper surface and both side surfaces of the projected semiconductor.

9. The manufacturing method of the semiconductor device according to claim 5, further comprising performing a silicide process for the projected semiconductor from the side surface of the first protrusion which is the projected semiconductor.

10. The manufacturing method of the semiconductor device according to claim 5, further comprising performing a suicide process for the first protrusion which is a projected semiconductor and the second protrusion which is a gate electrode.

11. The manufacturing method of the semiconductor device according to claim 3, wherein the forming the first sidewall comprises:

forming overall a first sidewall film; and forming the first sidewalls by leaving the first sidewall film on the side surface of the first protrusion and the side surface of the second protrusion by etching back the first sidewall film.

12. The manufacturing method of the semiconductor device according to claim 11, wherein in the forming the first sidewalls by etching back the first sidewall film, a base layer under the first sidewall film is dug down by etching.

13. The manufacturing method of the semiconductor device according to claim 12, further comprising removing the first sidewall formed on the side surface of the first protrusion by wet etching.

14. The manufacturing method of the semiconductor device according to claim 12, further comprising:

forming an additional film all over the base layer;

etching back the additional film overall so as to form a third sidewall by leaving the additional film and dig down the base layer; and; and removing the third sidewall by wet etching.

15. The manufacturing method of the semiconductor device according to claim 3, wherein the forming the first sidewall comprises:

forming a first sidewall film overall, using the first side wall film as the first sidewall without being etched back.

16. The manufacturing method of the semiconductor device according to claim 15, wherein an additional film is formed on the first sidewall film, and the first film is formed on the additional film without the additional film being etched back.

* * * * *